(12) United States Patent
Inoue et al.

(10) Patent No.: US 9,548,327 B2
(45) Date of Patent: Jan. 17, 2017

(54) IMAGING DEVICE HAVING A SELENIUM CONTAINING PHOTOELECTRIC CONVERSION LAYER

(71) Applicant: Semiconductor Energy Laboratory Co., Ltd., Atsugi-shi, Kanagawa-ken (JP)

(72) Inventors: Hiroki Inoue, Kanagawa (JP); Yoshiyuki Kurokawa, Kanagawa (JP); Takayuki Ikeda, Kanagawa (JP); Yuki Okamoto, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/928,987

(22) Filed: Oct. 30, 2015

(65) Prior Publication Data

US 2016/0133660 A1    May 12, 2016

(30) Foreign Application Priority Data

Nov. 10, 2014  (JP) ................................ 2014-227703

(51) Int. Cl.
*H01L 27/14*    (2006.01)
*H01L 27/146*   (2006.01)
(Continued)

(52) U.S. Cl.
CPC ... *H01L 27/14612* (2013.01); *H01L 27/14643* (2013.01); *H01L 27/14665* (2013.01);
(Continued)

(58) Field of Classification Search
CPC .................................................. H01L 27/14612
See application file for complete search history.

(56) References Cited

U.S. PATENT DOCUMENTS

| 5,731,856 A | 3/1998 | Kim et al. |
| 5,744,864 A | 4/1998 | Cillessen et al. |

(Continued)

FOREIGN PATENT DOCUMENTS

| EP | 1737044 A | 12/2006 |
| EP | 2226847 A | 9/2010 |

(Continued)

OTHER PUBLICATIONS

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

(Continued)

*Primary Examiner* — Ida M Soward
(74) *Attorney, Agent, or Firm* — Fish & Richardson P.C.

(57) ABSTRACT

To provide an imaging device capable of obtaining high-quality imaging data. The imaging device includes a first circuit and a second circuit. The first circuit includes a photoelectric conversion element, a first transistor, a second transistor, a third transistor, a fourth transistor, a fifth transistor, a sixth transistor, a first capacitor, a second capacitor, and a third capacitor. The second circuit includes a seventh transistor. The imaging device can compensate variation in electrical characteristics of an amplifier transistor included in the first circuit.

8 Claims, 47 Drawing Sheets

(51) Int. Cl.
*H04N 5/3745* (2011.01)
*H04N 5/378* (2011.01)

(52) U.S. Cl.
CPC ....... *H01L 27/14692* (2013.01); *H04N 5/378* (2013.01); *H04N 5/37455* (2013.01)

(56) References Cited

U.S. PATENT DOCUMENTS

| | | | |
|---|---|---|---|
| 5,892,540 A * | 4/1999 | Kozlowski | H04N 5/3658 |
| | | | 250/208.1 |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,476,027 B2 * | 1/2009 | Takenaka | G01N 23/04 |
| | | | 378/116 |
| 7,501,293 B2 | 3/2009 | Ito et al. | |
| 7,512,214 B2 * | 3/2009 | Takenaka | G01N 23/04 |
| | | | 250/370.09 |
| 7,541,617 B2 * | 6/2009 | Mochizuki | H04N 5/32 |
| | | | 257/291 |
| 7,564,038 B2 * | 7/2009 | Endo | H04N 5/32 |
| | | | 250/370.11 |
| 7,573,037 B1 * | 8/2009 | Kameshima | A61B 6/00 |
| | | | 250/370.09 |
| 7,674,650 B2 | 3/2010 | Akimoto et al. | |
| 7,732,819 B2 | 6/2010 | Akimoto et al. | |
| 8,378,391 B2 | 2/2013 | Koyama et al. | |
| 8,916,869 B2 | 12/2014 | Koyama et al. | |
| 8,988,569 B2 * | 3/2015 | Minami | H04N 5/378 |
| | | | 348/294 |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2013/0070133 A1 * | 3/2013 | Takazawa | H04N 5/335 |
| | | | 348/294 |
| 2015/0048366 A1 | 2/2015 | Koyama et al. | |
| 2016/0064444 A1 | 3/2016 | Inoue et al. | |
| 2016/0134789 A1 | 5/2016 | Inoue et al. | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2011-119711 A | 6/2011 |
| WO | WO-2004/114391 | 12/2004 |
| WO | 2011/055626 A1 | 5/2011 |

(56) References Cited

OTHER PUBLICATIONS

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.
Kimizuka.N et al., "Spinel,YBFe2O4, and YB2Fe3O7 Types of Structures for Compounds in The In2O3 and SC2O3—A2O3—BO Systems [A; Fe, Ga, or Al; B: Mg, Mn, Fe, Ni, Cu,or Zn] At Temperatures Over 1000° C", Journal of Solid State Chemistry, 1985, vol. 60, pp. 382-384.
Nakamura.M et al., "The phase relations in the In2O3-Ga2ZnO4—ZnO system at 1350° C", Journal of Solid State Chemistry, Aug. 1, 1991, vol. 93, No. 2, pp. 298-315.
Kitzerow.H et al., "Observation of Blue Phases in Chiral Networks", Liquid Crystals, 1993, vol. 14, No. 3, pp. 911-916.
Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System", Journal of Solid State Chemistry, Apr. 1, 1995, vol. 116, No. 1, pp. 170-178.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Prins.M et al., "A Ferroelectric Transparent Thin-Film Transistor", Appl. Phys. Lett. (Applied Physics Letters), Jun. 17, 1996, vol. 68, No. 25, pp. 3650-3652.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Kikuchi.H et al., "Polymer-Stabilized Liquid Crystal Blue Phases", Nature Materials, Sep. 2, 2002, vol. 1, pp. 64-68.
Tsuda.K et al., "Ultra Low Power Consumption Technologies for Mobile TFT-LCDs ", IDW '02 : Proceedings of the 9th International Display Workshops, Dec. 4, 2002, pp. 295-298.
Nomura.K et al., "Thin-Film Transistor Fabricated in Single-Crystalline Transparent Oxide Semiconductor", Science, May 23, 2003, vol. 300, No. 5623, pp. 1269-1272.
Ikeda.T et al., "Full-Functional System Liquid Crystal Display Using Cg-Silicon Technology", SID Digest '04 : SID International Symposium Digest of Technical Papers, 2004, vol. 35, pp. 860-863.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.
Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.
Lee.H et al., "Current Status of, Challenges to, and Perspective View of AM-OLED ", IDW '06 : Proceedings of the 13th International Display Workshops, Dec. 7, 2006, pp. 663-666.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.
Park.S et al., "Challenge to Future Displays: Transparent AM-OLED Driven by PEALD Grown ZnO TFT", IMID '07 Digest, 2007, pp. 1249-1252.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Miyasaka.M, "SUFTLA Flexible Microelectronics on Their Way to Business", SID Digest '07 : SID International Symposium Digest of Technical Papers, 2007, vol. 38, pp. 1673-1676.
Kurokawa.Y et al., "UHF RFCPUS on Flexible and Glass Substrates for Secure RFID Systems", Journal of Solid-State Circuits, 2008, vol. 43, No. 1, pp. 292-299.
Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.
Lee.J et al., "World'S Largest (15-Inch) XGA AMLCD Panel Using IGZO Oxide TFT", SID Digest '08 : SID International Symposium Digest of Technical Papers, May 20, 2008, vol. 39, pp. 625-628.
Park.J et al., "Amorphous Indium—Gallium—Zinc Oxide TFTS and Their Application for Large Size AMOLED", AM-FPD '08 Digest of Technical Papers, Jul. 2, 2008, pp. 275-278.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.
Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.
Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.
Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.
Kikuchi.H et al., "39.1:Invited Paper:Optically Isotropic Nano-Structured Liquid Crystal Composites For Display Applications", SID Digest '09 : SID International Symposium Digest of Technical Papers, May 31, 2009, pp. 578-581.
Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.
Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.
Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.
Osada.T et al., "Development of Driver-Integrated Panel Using Amorphous In—Ga—Zn—Oxide TFT", AM-FPD '09 Digest of Technical Papers, Jul. 1, 2009, pp. 33-36.
Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.
Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

(56) References Cited

OTHER PUBLICATIONS

Park.J et al., "High performance amorphous oxide thin film transistors with self-aligned top-gate structure", IEDM 09: Technical Digest of International Electron Devices Meeting, Dec. 7, 2009, pp. 191-194.

Nakamura.M, "Synthesis of Homologous Compound with New Long-Period Structure", Nirim Newsletter, Mar. 1, 1995, vol. 150, pp. 1-4.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Orita.M et al., "Amorphous transparent conductive oxide InGaO3(ZnO)m (m<4):a Zn4s conductor", Philosophical Magazine, 2001, vol. 81, No. 5, pp. 501-515.

Janotti.A et al., "Oxygen Vacancies in ZnO", Appl. Phys. Lett. (Applied Physics Letters), 2005, vol. 87, pp. 122102-1-122102-3.

Clark.S et al., "First Principles Methods Using Castep", Zeitschrift fur Kristallographie, 2005, vol. 220, pp. 567-570.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Improvements in the Device Characteristics of Amorphous Indium Gallium Zinc Oxide Thin-Film Transistors by Ar Plasma Treatment", Appl. Phys Lett. (Applied Physica Letters), Jun. 26, 2007, vol. 90, No. 26, pp. 262106-1-262106-3.

Park.J et al., "Electronic Transport Properties of Amorphous Indium—Gallium—Zinc Oxide Semiconductor Upon Exposure to Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Oba.F et al., "Defect energetics in ZnO: A hybrid Hartree-Fock density functional study", Phys. Rev. B (Physical Review. B), 2008, vol. 77, pp. 245202-1-245202-6.

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 6th International Display Workshops, Dec. 3, 2008, pp. 581-584.

Asakuma.N et al., "Crystallization and Reduction of Sol-Gel-Derived Zinc Oxide Films by Irradiation with Ultraviolet Lamp", Joural of Sol-Gel Science and Technology, 2003, vol. 26, pp. 181-184.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

\* cited by examiner

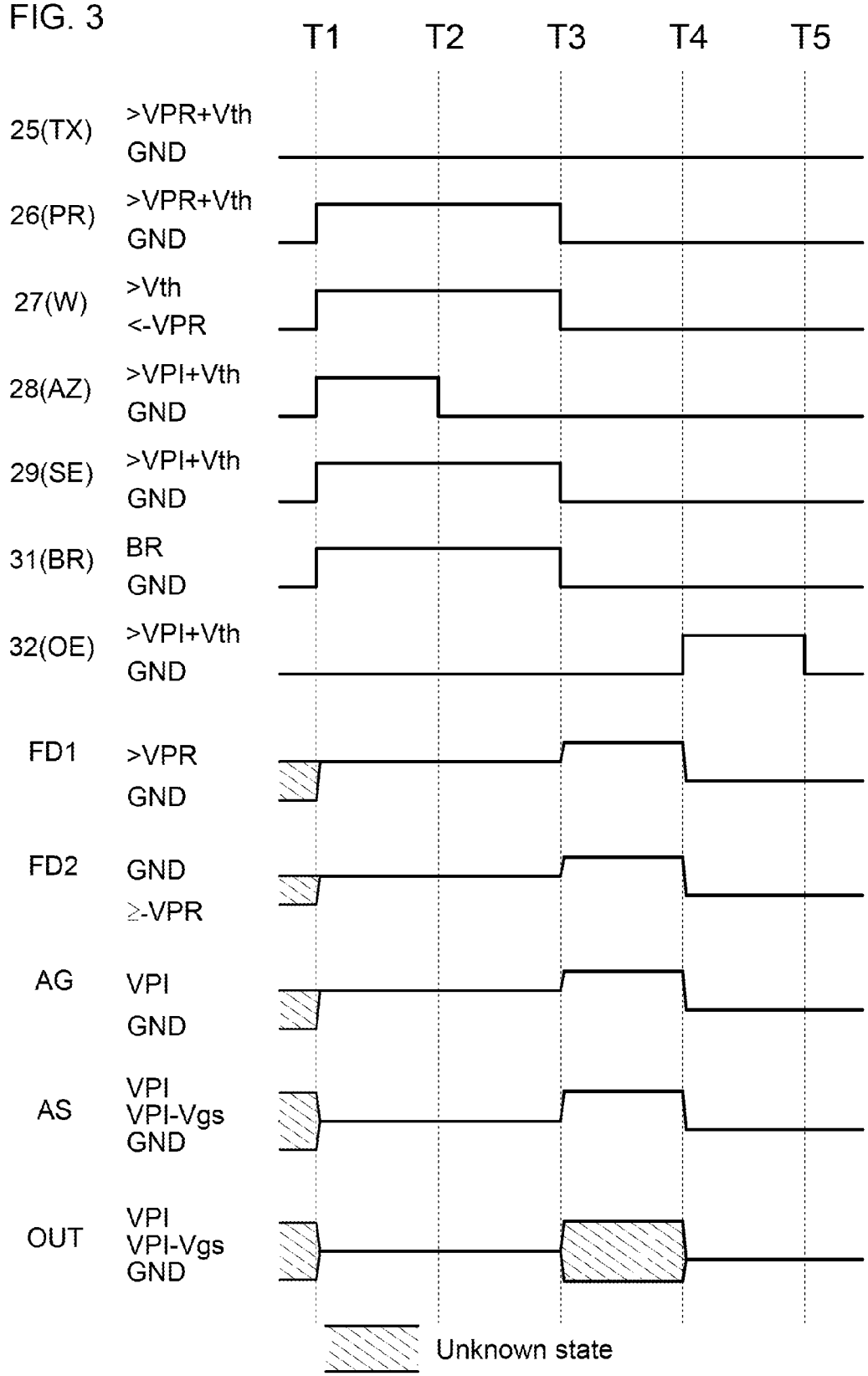

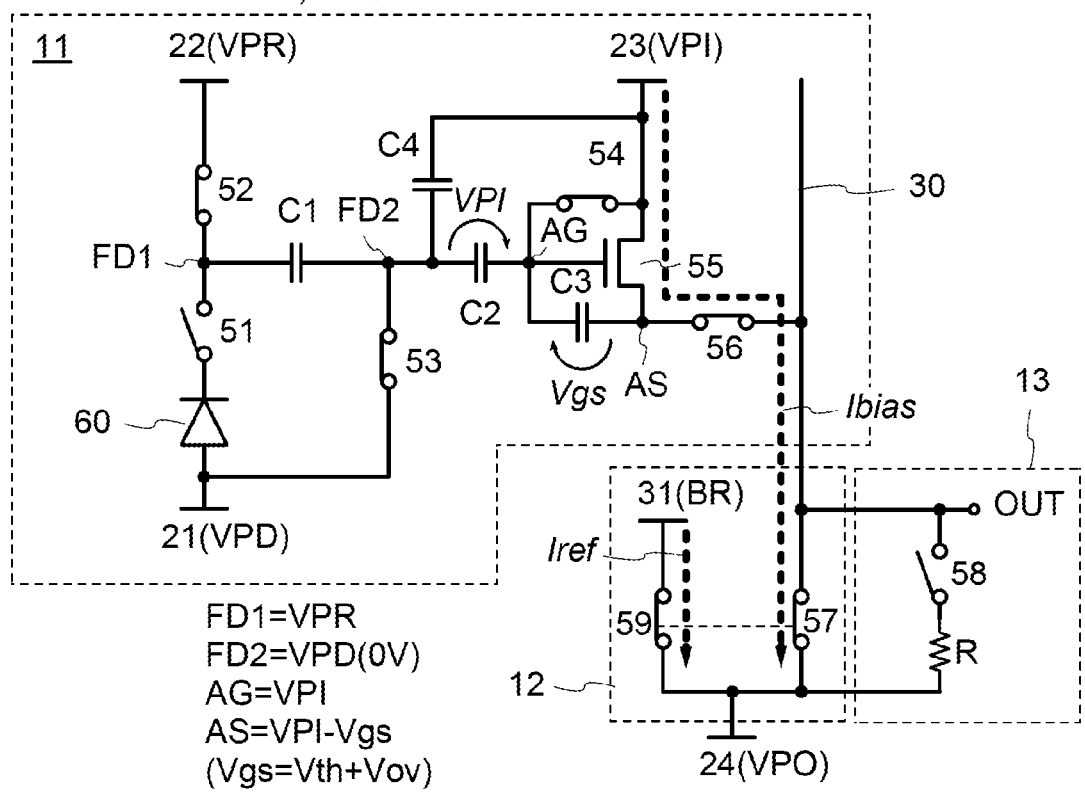

FIG. 16A1
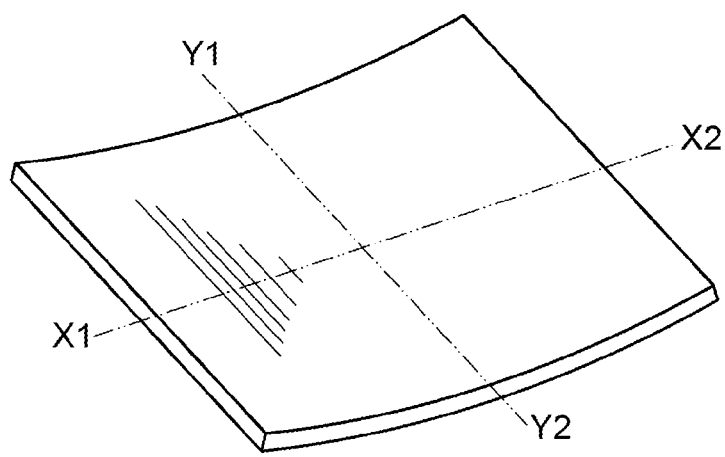
FIG. 16A2
FIG. 16A3
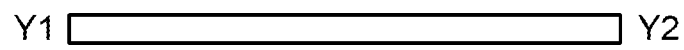
FIG. 16B1
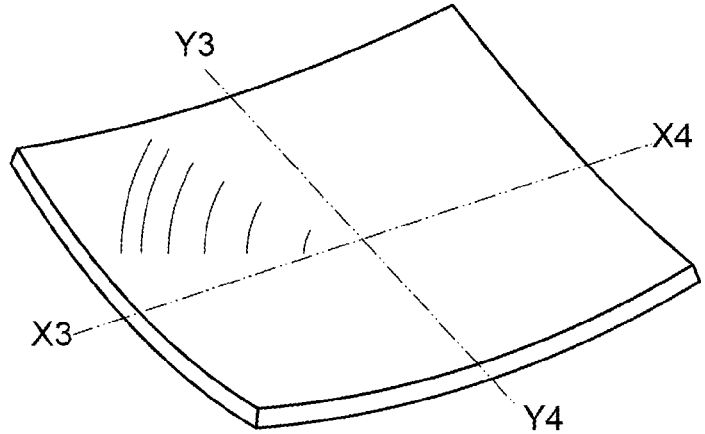
FIG. 16B2
FIG. 16B3
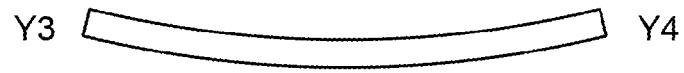

IMAGING DEVICE HAVING A SELENIUM CONTAINING PHOTOELECTRIC CONVERSION LAYER

BACKGROUND OF THE INVENTION

1. Field of the Invention

One embodiment of the present invention relates to an imaging device.

Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a lighting device, a power storage device, a storage device, an imaging device, a method for driving any of them, and a method for manufacturing any of them.

In this specification and the like, a semiconductor device generally means a device that can function by utilizing semiconductor characteristics. A transistor and a semiconductor circuit are embodiments of semiconductor devices. In some cases, a storage device, a display device, an imaging device, or an electronic device includes a semiconductor device.

2. Description of the Related Art

As a semiconductor device in which pixels each provided with a photosensor are arranged in a matrix, a complementary metal oxide semiconductor (CMOS) image sensor is known. CMOS image sensors are provided in many portable devices such as digital cameras or cellular phones as imaging elements.

Silicon is widely known as a semiconductor material applicable to a transistor generally included in a CMOS image sensor or the like. As another material, an oxide semiconductor has attracted attention.

For example, Patent Document 1 discloses that a transistor including an oxide semiconductor and having extremely low off-state current is used in part of a pixel circuit and a transistor including a silicon semiconductor with which a CMOS circuit can be formed is used in a peripheral circuit, so that an imaging device with high speed operation and low power consumption can be manufactured.

REFERENCE

[Patent Document 1] Japanese Published Patent Application No. 2011-119711

SUMMARY OF THE INVENTION

A CMOS image sensor includes an amplifier transistor for outputting data in each pixel. In order to obtain high-quality imaging data, electrical characteristics of the transistors in all the pixels are preferably uniform. However, as miniaturization progresses, the degree of difficulty of a transistor manufacturing process increases, and it is difficult to reduce variation in electrical characteristics.

Output data can be compensated by retaining data for compensating variation in electrical characteristics in a capacitor or the like. However, total imaging time becomes long if data is written to a capacitor by each imaging. In addition, the increase in power consumption becomes a problem.

Thus, an object of one embodiment of the present invention is to provide an imaging device capable of obtaining high-quality imaging data. Another object of one embodiment of the present invention is to provide an imaging device capable of compensating variation in electrical characteristics of an amplifier transistor included in a pixel circuit. Another object of one embodiment of the present invention is to provide a low-power imaging device. Another object of one embodiment of the present invention is to provide an imaging device that is suitable for high-speed operation. Another object of one embodiment of the present invention is to provide an imaging device with high sensitivity. Another object of one embodiment of the present invention is to provide an imaging device with a wide dynamic range. Another object of one embodiment of the present invention is to provide an imaging device with high resolution. Another object of one embodiment of the present invention is to provide an imaging device formed at low cost. Another object of one embodiment of the present invention is to provide an imaging device with high reliability. Another object of one embodiment of the present invention is to provide a novel imaging device or the like. Another object of one embodiment of the present invention is to provide a novel semiconductor device or the like.

The description of these objects does not disturb the existence of other objects. In one embodiment of the present invention, there is no need to achieve all the objects. Other objects will be apparent from and can be derived from the description of the specification, the drawings, the claims, and the like. Other objects will be apparent from and can be derived from the description of the specification, the drawings, the claims, and the like.

One embodiment of the present invention relates to an imaging device capable of compensating variation in electrical characteristics of an amplifier transistor included in a pixel circuit.

One embodiment of the present invention is an imaging device that includes a first circuit and a second circuit. The first circuit includes a photoelectric conversion element, a first transistor, a second transistor, a third transistor, a fourth transistor, a fifth transistor, a sixth transistor, a first capacitor, a second capacitor, and a third capacitor. The second circuit includes a seventh transistor. One terminal of the photoelectric conversion element is electrically connected to one of a source and a drain of the first transistor. The other of the source and the drain of the first transistor is electrically connected to one of a source and a drain of the second transistor. The other of the source and the drain of the first transistor is electrically connected to one terminal of the first capacitor. One of a source and a drain of the third transistor is electrically connected to the other terminal of the first capacitor. The other terminal of the first capacitor is electrically connected to one terminal of the second capacitor. One of a source and a drain of the fourth transistor is electrically connected to the other terminal of the second capacitor. The other of the source and the drain of the fourth transistor is electrically connected to one of a source and a drain of the fifth transistor. One terminal of the third capacitor is electrically connected to the other terminal of the second capacitor. The other terminal of the third capacitor is electrically connected to the other of the source and the drain of the fifth transistor. A gate of the fifth transistor is electrically connected to the one terminal of the third capacitor. One of a source and a drain of the sixth transistor is electrically connected to the other of the source and the drain of the fifth transistor. The other of the source and the drain of the sixth transistor is electrically connected to one of a source and a drain of the seventh transistor. The photoelectric conversion element contains selenium in a photoelectric conversion layer.

The above imaging device may include a third circuit. The third circuit may include an eighth transistor and a resistor. One of a source and a drain of the eighth transistor may be electrically connected to the other of the source and the drain of the sixth transistor. The other of the source and the drain of the eighth transistor may be electrically connected to one terminal of the resistor.

The second circuit may further include a ninth transistor. One of a source and a drain of the ninth transistor may be electrically connected to the other of the source and the drain of the seventh transistor. A gate of the ninth transistor may be electrically connected to a gate of the seventh transistor. The gate of the ninth transistor may be electrically connected to the other of the source and the drain of the ninth transistor.

The other of the source and the drain of the third transistor may be electrically connected to the other terminal of the photoelectric conversion element.

The pixel circuit may further include a fourth capacitor. One terminal of the fourth capacitor may be electrically connected to one of the source and the drain of the third transistor. The other terminal of the fourth capacitor may be electrically connected to the other of the source and the drain of the fourth transistor.

One or all of the first to ninth transistors preferably include oxide semiconductors in active layers, and the oxide semiconductor preferably includes In, Zn, and M (M is Al, Ti, Ga, Sn, Y, Zr, La, Ce, Nd, or Hf).

According to one embodiment of the present invention, an imaging device capable of obtaining high-quality imaging data can be provided. An imaging device capable of compensating variation in electrical characteristics of an amplifier transistor included in a pixel circuit can be provided. A low-power imaging device can be provided. An imaging device that is suitable for high-speed operation can be provided. An imaging device with high sensitivity can be provided. An imaging device with a wide dynamic range can be provided. An imaging device with high resolution can be provided. An imaging device formed at low cost can be provided. An imaging device with high reliability can be provided. A novel imaging device or the like can be provided. A novel semiconductor device or the like can be provided.

The description of these effects does not disturb the existence of other effects. In one embodiment of the present invention, there is no need to obtain all the effects. Other effects will be apparent from and can be derived from the description of the specification, the drawings, the claims, and the like.

BRIEF DESCRIPTION OF THE DRAWINGS

In the accompanying drawings:

FIG. 3 is a timing chart illustrating compensation operation;
FIG. 4 illustrates compensation operation;
FIGS. 16A1, 16A2, 16A3, 16B1, 16B2, and 16B3 illustrate a bent imaging device.

DETAILED DESCRIPTION OF THE INVENTION

Figure 1:
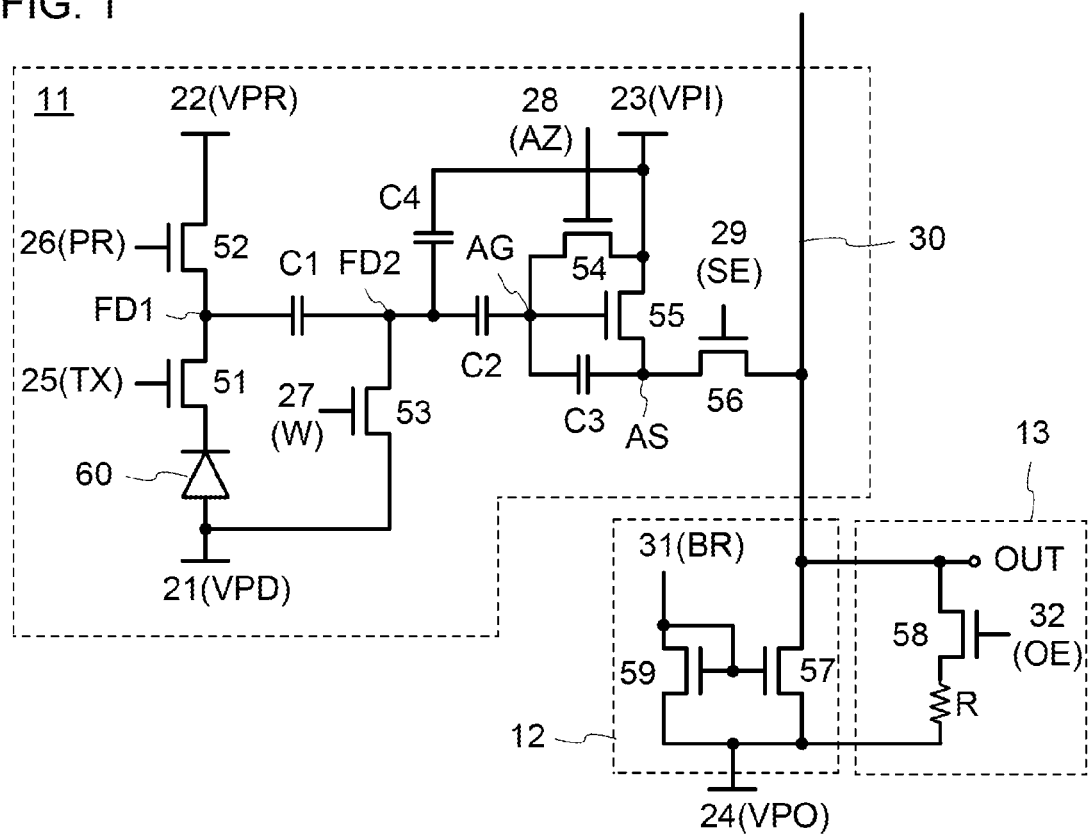
FIG. 1 illustrates circuits of an imaging device.

Embodiments will be described in detail with reference to the drawings. Note that the present invention is not limited to the following description. It will be readily appreciated by those skilled in the art that modes and details of the present invention can be modified in various ways without departing from the spirit and scope of the present invention. The present invention therefore should not be construed as being limited to the following description of the embodiments. In structures of the invention described below, the same portions or portions having similar functions are denoted by the same reference numerals in different drawings, and the description thereof is not repeated in some cases. The same components are denoted by different hatching patterns in different drawings, or the hatching patterns are omitted in some cases.

For example, in this specification and the like, an explicit description "X and Y are connected" means that X and Y are electrically connected, X and Y are functionally connected, and X and Y are directly connected. Accordingly, without being limited to a predetermined connection relationship, for example, a connection relationship shown in drawings or texts, another connection relationship is included in the drawings or the texts.

Here, each of X and Y denotes an object (e.g., a device, an element, a circuit, a wiring, an electrode, a terminal, a conductive film, or a layer).

Examples of the case where X and Y are directly connected include the case where an element that enables electrical connection between X and Y (e.g., a switch, a transistor, a capacitor, an inductor, a resistor, a diode, a display element, a light-emitting element, or a load) is not connected between X and Y, and the case where X and Y are connected without the element that enables electrical connection between X and Y provided therebetween.

For example, in the case where X and Y are electrically connected, one or more elements that enable electrical connection between X and Y (e.g., a switch, a transistor, a capacitor, an inductor, a resistor, a diode, a display element, a light-emitting element, or a load) can be connected between X and Y. Note that the switch is controlled to be turned on or off. That is, the switch is conducting or not conducting (is turned on or off) to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that enable functional connection between X and Y (e.g., a logic circuit such as an inverter, a NAND circuit, or a NOR circuit; a signal converter circuit such as a D/A converter circuit, an A/D converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a storage circuit; or a control circuit) can be connected between X and Y. Note that for example, in the case where a signal output from X is transmitted to Y even when another circuit is provided between X and Y, X and Y are functionally connected. The case where X and Y are functionally connected includes the case where X and Y are directly connected and X and Y are electrically connected.

Note that in this specification and the like, an explicit description "X and Y are electrically connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, in this specification and the like, the explicit description "X and Y are electrically connected" is the same as the explicit description "X and Y are connected."

For example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to part of Z1 and another part of Z1 is directly connected to X while a drain (or a second terminal or the like) of the transistor is directly connected to part of Z2 and another part of Z2 is directly connected to Y, can be expressed by using any of the following expressions.

The expressions include, for example, "X, Y, a source (or a first terminal or the like) of a transistor, and a drain (or a second terminal or the like) of the transistor are electrically connected to each other, and X the source (or the first terminal or the like) of the transistor, the drain (or the second terminal or the like) of the transistor, and Y are electrically connected to each other in that order," "a source (or a first terminal or the like) of a transistor is electrically connected to X a drain (or a second terminal or the like) of the transistor is electrically connected to Y, and X the source (or the first terminal or the like) of the transistor, the drain (or the second terminal or the like) of the transistor, and Y are electrically connected to each other in that order," and "X is electrically connected to Y through a source (or a first terminal or the like) and a drain (or a second terminal or the like) of a transistor, and X the source (or the first terminal or the like) of the transistor, the drain (or the second terminal or the like) of the transistor, and Y are connected in that order." When the connection order in a circuit structure is defined by an expression similar to the above examples, a source (or a first terminal or the like) and a drain (or a second terminal or the like) of a transistor can be distinguished from each other to specify the technical scope.

Other examples of the expressions include "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path." It is also possible to use the expression "a source (or a first terminal or the like) of a transistor is electrically connected to X through at least Z1 on a first connection path, the first connection path does not include a second connection path, the second connection path includes a connection path through the transistor, a drain (or a second terminal or the like) of the transistor is electrically connected to Y through at least Z2 on a third connection path, and the third connection path does not include the second connection path." Still another example of the expressions is "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor." When the connection path in a circuit structure is defined by an expression similar to the above examples, a source (or a first terminal or the like) and a drain (or a second terminal or the like) of a transistor can be distinguished from each other to specify the technical scope.

Note that these expressions are examples and there is no limitation on the expressions. Here, X, Y, Z1, and Z2 each denote an object (e.g., a device, an element, a circuit, a wiring, an electrode, a terminal, a conductive film, or a layer).

Even when independent components are electrically connected to each other in a circuit diagram, one component has functions of a plurality of components in some cases. For example, when part of a wiring also functions as an electrode, one conductive film functions as the wiring and the electrode. Thus, the term "electrical connection" in this specification also means such a case where one conductive film has functions of a plurality of components.

Note that the terms "film" and "layer" can be interchanged with each other depending on circumstances or conditions. For example, the term "conductive layer" can be changed into the term "conductive film" in some cases. In addition, the term "insulating film" can be changed into the term "insulating layer" in some cases.

Embodiment 1

In this embodiment, an imaging device that is one embodiment of the present invention is described with reference to drawings.

An imaging device in one embodiment of the present invention includes a pixel circuit that can compensate variation in electrical characteristics of a source follower amplifier transistor in a pixel of an imaging device that outputs signal charge (data) by a source follower. The pixel circuit can compensate not only variations in the threshold voltage and the mobility of the transistor but also variation in the current due to variation in the size (L, W) of the channel formation region of the transistor or in the thickness (capacitance) of the gate insulating film thereof.

Figure 47:
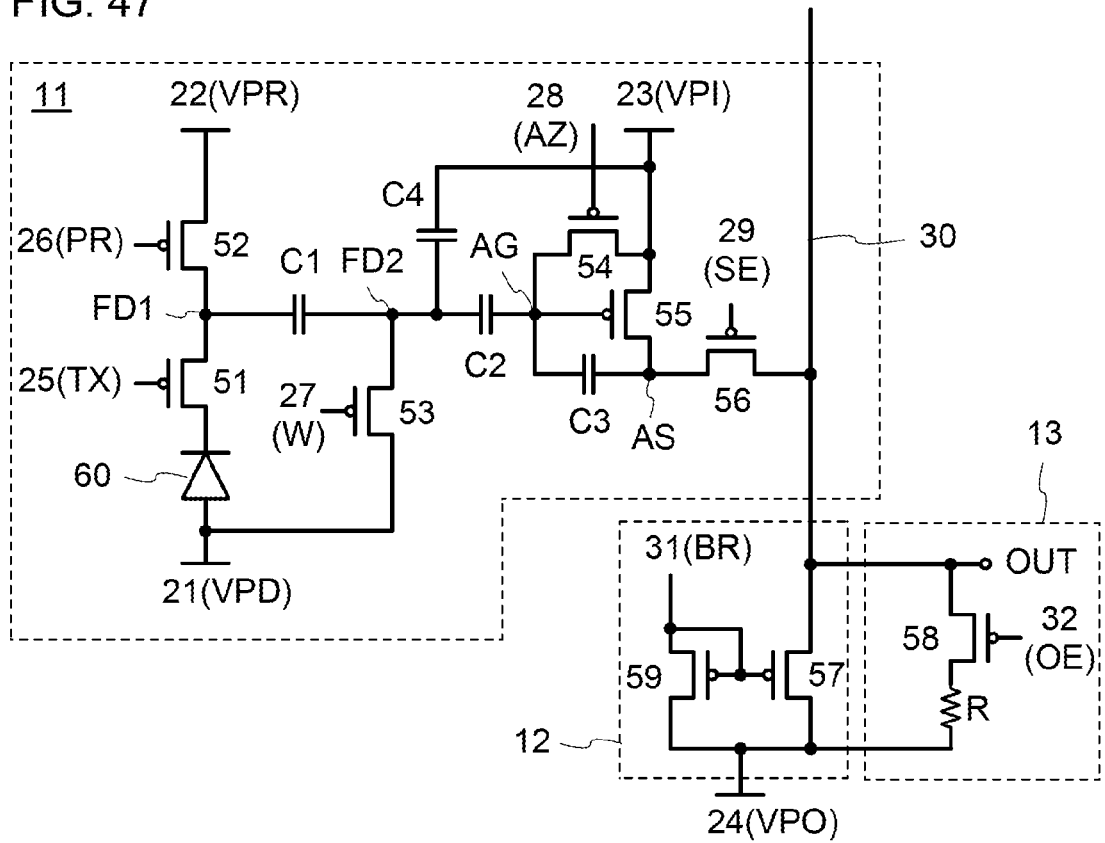
FIG. 47 illustrates a circuit of an imaging device.

FIG. 1 is a circuit diagram of a circuit 11 that can function as a pixel circuit, a circuit 12 that can function as a reference current source circuit, and a circuit 13 that can function as an output circuit, included in an imaging device in one embodiment of the present invention. In FIG. 1 and the like, transistors are n-ch transistors; however, one embodiment of the present invention is not limited thereto. The transistors may be p-ch transistors by reversing the magnitude relationship of a potential as illustrated in FIG. 47. Alternatively, some of the n-ch transistors may be replaced with p-ch transistors.

The circuit 11 is broadly divided into a photoelectric conversion portion and a signal generation portion. The photoelectric conversion portion includes a photodiode 60, a transistor 51, and a transistor 52. The signal generation portion includes a transistor 53, a transistor 54, a transistor 55, a transistor 56, a capacitor C1, a capacitor C2, a capacitor C3, and a capacitor C4. Note that the capacitor C4 can be omitted.

The circuit 12 includes a transistor 57 and a transistor 59.

The circuit 13 includes a transistor 58, a resistor R, and an output terminal (OUT).

Figure 2A:
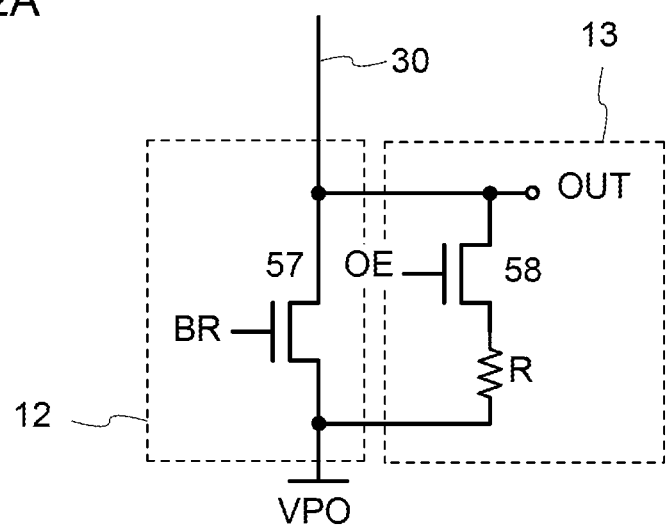
FIGS. 2A to 2C each illustrate a circuit of an imaging device.
Figure 2B:
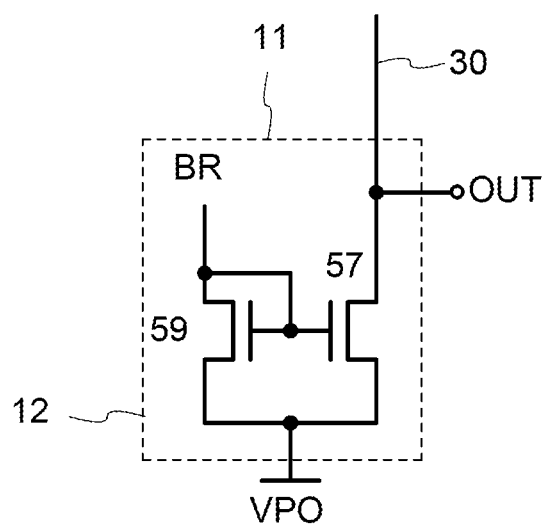
Figure 2C:
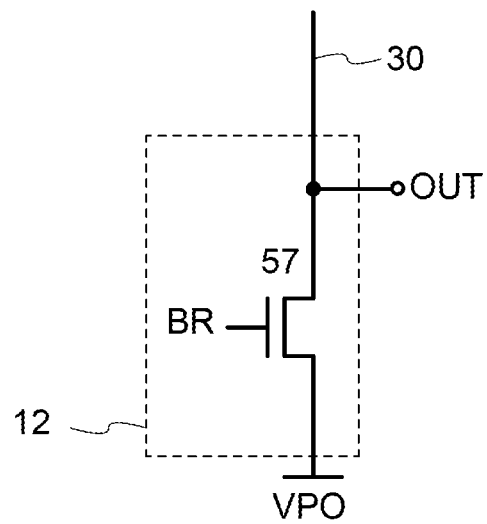

The circuit 12 and the circuit 13 that are connected to a wiring 30 can have structures illustrated in FIGS. 2A to 2C. FIG. 2A illustrates a structure in which the transistor 59 is omitted from the circuit 12. FIG. 2B illustrates a structure in which the circuit 13 is omitted and the wiring 30 is provided with an output terminal (OUT). FIG. 2C illustrates a structure in which the circuit 13, and the transistor 59 of the circuit 12 are omitted and the wiring 30 is provided with the output terminal (OUT).

In the circuit 11 in FIG. 1, one terminal of the photodiode 60 is electrically connected to one of a source and a drain of the transistor 51. The other of the source and the drain of the transistor 51 is electrically connected to one of a source and a drain of the transistor 52. The other of the source and the drain of the transistor 51 is electrically connected to one terminal of the capacitor C1. One of a source and a drain of the transistor 53 is electrically connected to the other terminal of the capacitor C1. The other terminal of the capacitor C1 is electrically connected to one terminal of the capacitor C2. One of a source and a drain of the transistor 54 is electrically connected to the other terminal of the capacitor C2. The other of the source and the drain of the transistor 54 is electrically connected to one of a source and a drain of the transistor 55. One terminal of the capacitor C3 is electrically connected to the other terminal of the capacitor C2. The other terminal of the capacitor C3 is electrically connected to the other of the source and the drain of the transistor 53. A gate of the transistor 55 is electrically connected to one terminal of the capacitor C3. One terminal of the capacitor C4 is electrically connected to one terminal of the capacitor C2. The other terminal of the capacitor C4 is electrically connected to one of the source and the drain of the transistor 55. The other of the source and the drain of the transistor 55 is electrically connected to one of a source and a drain of the transistor 56.

The other terminal of the photodiode 60 is electrically connected to a wiring 21 (VPD). The other of the source and the drain of the transistor 52 is electrically connected to a wiring 22 (VPR). One of the source and the drain of the transistor 55 is electrically connected to a wiring 23 (VPI). A gate of the transistor 51 is electrically connected to a wiring 25 (TX). A gate of the transistor 52 is electrically connected to a wiring 26 (PR). A gate of the transistor 53 is electrically connected to a wiring 27 (W). A gate of the transistor 54 is electrically connected to a wiring 28 (AZ). A gate of the transistor 56 is electrically connected to a wiring 29 (SE). The other of the source and the drain of the transistor 56 is electrically connected to the wiring 30.

In the circuit 12, one of a source and a drain of the transistor 57 is electrically connected to the wiring 30, and the other of the source and the drain of the transistor 57 is electrically connected to a wiring 24 (VPO). One of a source and a drain of the transistor 59 is electrically connected to a wiring 31 (BR). One of the source and the drain of the transistor 59 is electrically connected to a gate of the transistor 59 and to a gate of the transistor 57. The other of the source and the drain of the transistor 59 is electrically connected to the wiring 24 (VPO).

In the circuit 13, one of a source and a drain of the transistor 58 is electrically connected to the wiring 30. One of the source and the drain of the transistor 58 is provided with the output terminal (OUT). The other of the source and the drain of the transistor 58 is electrically connected to one terminal of the resistor R. A gate of the transistor 58 is electrically connected to the wiring 32 (OE). The other terminal of the resistor R is electrically connected to the wiring 24 (VPO).

Here, the wiring 21 (VPD), the wiring 22 (VPR), the wiring 23 (VPI), and the wiring 24 (VPO) can function as power supply lines. The wiring 25 (TX), the wiring 26 (PR), the wiring 27 (W), the wiring 28 (AZ), the wiring 29 (SE), the wiring 30, the wiring 31 (BR), and the wiring 32 (OE) can function as signal lines.

In FIG. 1, the other of the source and the drain of the transistor 53 is connected to the wiring 21 (VPD); however, the other of the source and the drain of the transistor 53 may be connected to another wiring or the like capable of supplying a fixed potential.

In addition, in FIG. 1, the other terminal of the capacitor C4 is connected to the wiring 23 (VPI); however, the other terminal of the capacitor C4 may be connected to another wiring or the like capable of supplying a fixed potential.

In the above structure, a node to which the other of the source and the drain of the transistor 51, one of the source and the drain of the transistor 52, and one terminal of the capacitor C1 are connected is denoted by FD1.

A node to which one of the source and the drain of the transistor 53, the other terminal of the capacitor C1, one terminal of the capacitor C2, and one terminal of the capacitor C4 are connected is denoted by FD2.

A node to which one of the source and the drain of the transistor 54, the other terminal of the capacitor C2, one terminal of the capacitor C3, and the gate of the transistor 55 are connected is denoted by AG.

A node to which the other of the source and the drain of the transistor 55, the other terminal of the capacitor C3, and one of the source and the drain of the transistor 56 are connected is denoted by AS.

A diode element formed using a silicon substrate with a pn junction or a pin junction can be used as the photodiode 60. Alternatively, a pin diode element formed using an amorphous silicon film, a microcrystalline silicon film, or the like may be used. Note that although the circuit 11 includes the photodiode, the circuit 11 may include another photoelectric conversion element. For example, a diode-connected transistor may be used. Alternatively, a variable resistor or the like utilizing a photoelectric effect may be formed using silicon, germanium, selenium, or the like.

Alternatively, a photoelectric conversion element that includes selenium utilizing a phenomenon called avalanche multiplication may be used. In the photoelectric conversion element, a highly sensitive sensor in which the amount of amplification of electrons with respect to the amount of incident light is large can be obtained.

Amorphous selenium or crystalline selenium can be used as a selenium-based material. Crystalline selenium can be obtained by, for example, depositing amorphous selenium and then performing heat treatment. When the crystal grain size of crystalline selenium is smaller than a pixel pitch, variation in characteristics between pixels can be reduced.

In the circuit 11, the photodiode 60 is a light-receiving element and can have a function of generating current based on the amount of light incident on the circuit 11. The transistor 51 can have a function of controlling charge accumulation in the node FD1 performed by the photodiode 60. The transistor 52 can have a function of executing operation of resetting the potential of the node FD1. The transistor 53 can have a function of executing operation of resetting the potential of the node FD2. The transistor 54 can have a function of supplying current to the transistor 55. The transistor 55 can have a function of executing operation of outputting a signal based on the potential of the node AG. The transistor 56 can have a function of executing operation of controlling selection of the circuit 11 (pixel circuit) at the time of reading.

In the circuit 12, the transistors 57 and 59 form a current mirror circuit and have a function of supplying current that is equal to the current flowing to the transistor 59 to the transistor 57.

The circuit 13 can have a function of outputting a voltage signal based on current supplied to the transistor 58 and the resistor R from the output terminal (OUT).

In the imaging device in one embodiment of the present invention with the above structure, an output signal can be compensated when the circuit 11 stores $V_{gs}$ determining reference output in a saturation region ($V_{ds} > V_{gs} - V_{th}$, $V_{ds}$: drain-source voltage, $V_{gs}$: gate-source voltage, $V_{th}$: threshold voltage) of the transistor 55 included in the circuit 11.

Details of the compensation operation and output operation after compensation are described with reference to a timing chart in FIG. 3. The timing chart in FIG. 3 shows the potentials of the wiring 25 (TX), the wiring 26 (PR), the wiring 27 (W), the wiring 28 (AZ), the wiring 29 (SE), the wiring 31(BR), the wiring 32 (OE), the node FD1, the node FD2, the node AG, the node AS, and the output terminal (OUT). Note that each transistor is turned on or off in accordance with a potential supplied to a wiring connected to the gate of each transistor.

In the circuit diagram used for the description, transistors other than the transistor 55 are described as switches in order to clarify conduction state of the transistors. In addition, some reference numerals are omitted. The switching of the transistor 59 is performed in conjunction with the switching of the transistor 57. Here, the wiring 21 (VPD) has a low potential ("GND"), the wiring 22 (VPR) has a high potential ("VPR"), the wiring 23 (VPI) has a high potential ("VPI"), and the wiring 24 (VPO) has a low potential ("GND").

At time T1, the transistors 52, 53, 54, 56, 57, and 59 are turned on and the transistors 51 and 58 are turned off. When a reference signal current is supplied to the wiring 31 (BR), a reference current ($I_{ref}$) flows to the transistor 59, and a bias current ($I_{bias}$) flows between the wiring 23 (VPI) and the wiring 24 (VPO) through the transistor 57 (see a current path indicated by a broken line in FIG. 4). Note that the reference signal voltage may be supplied to the wiring 31 (BR).

At this time, the potential of the node FD1 is set to the potential ("VPR") of the wiring 22 (VPR). The potential of the node FD2 is set to the potential ("GND," for example, 0 V) of the wiring 21 (VPD). The potential of the node AG is set to the potential ("VPI") of the wiring 23 (VPI). Here, when a potential difference between the gate and the source of the transistor 55 is denoted by "$V_{gs}$," the potential of the node AS is set to "VPI-$V_{gs}$" because the potential of the gate (the potential of the node AG) is "VPI." The potential of the node AG is "VPI" and the potential of the node AS is "VPI-$V_{gs}$;" thus, "$V_{gs}$" is applied to both ends of the capacitor C3. Note that "$V_{gs}$" equals "$V_{th}$ (the threshold voltage of the transistor 55)" plus "$V_{ov}$ (an overdrive voltage)." Accordingly, "$V_{gs}$" for supplying the bias current ($I_{bias}$) is set.

Figure 5:
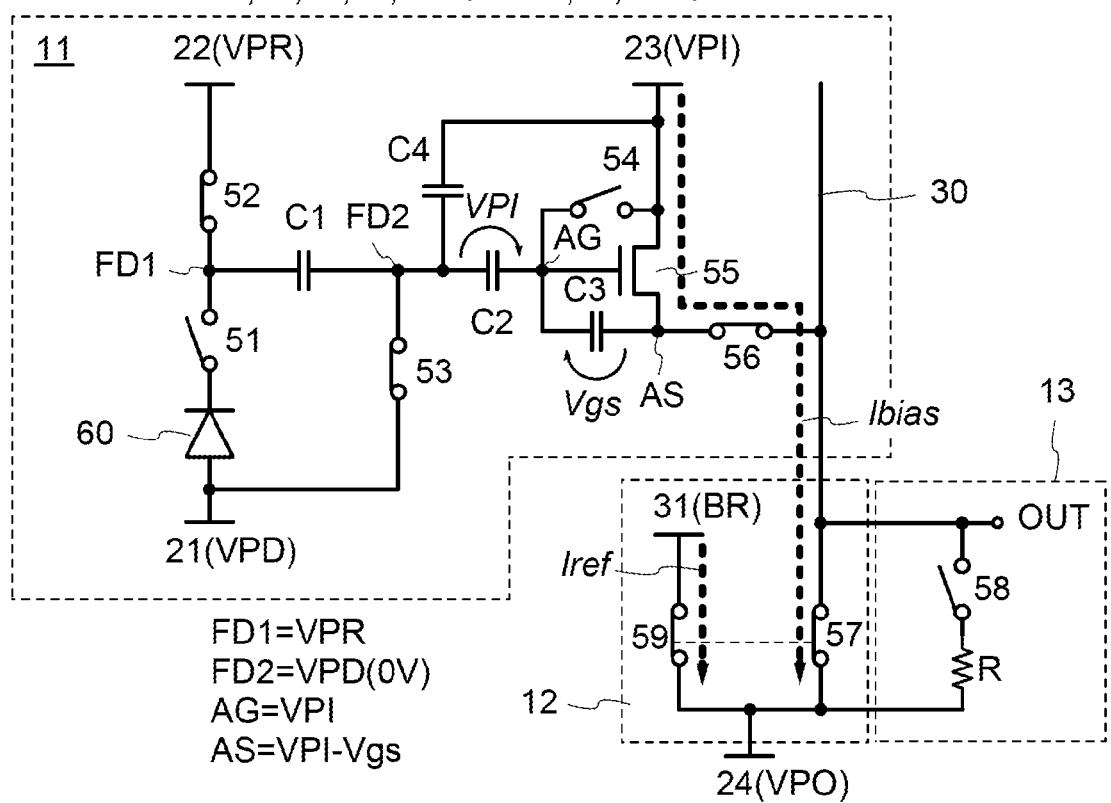
FIG. 5 illustrates compensation operation.

Next, at time T2, the transistor 54 is turned off, which makes the node AG floating, so that "$V_{gs}$" is held in the capacitor C3 (see FIG. 5).

Figure 6:
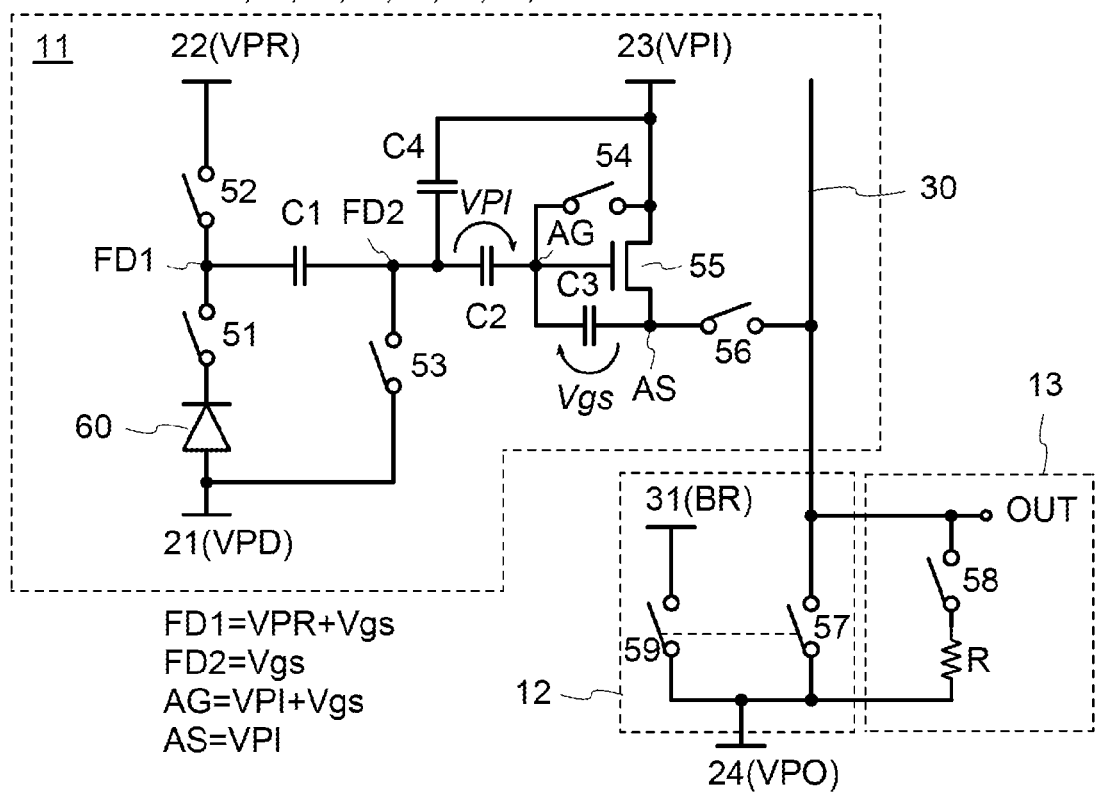
FIG. 6 illustrates compensation operation.

Next, at time T3, all transistors are turned off, which makes the bias current ($I_{bias}$) shut off, so that the potential of the node AS increases from "VPI-$V_{gs}$" to "VPI." In addition, the potential of the node AG increases from "VPI" to "VPI+$V_{gs}$." The potential of the node FD2 increases from "GND" to "$V_{gs}$" (see FIG. 6) when "GND" is equal to 0 V. Accordingly, holding of "$V_{gs}$" for supplying the bias current ($I_{bias}$) is completed. That is, storing, in the circuit 11, of "$V_{gs}$" determining the reference output of the transistor 55 is completed.

Figure 7:
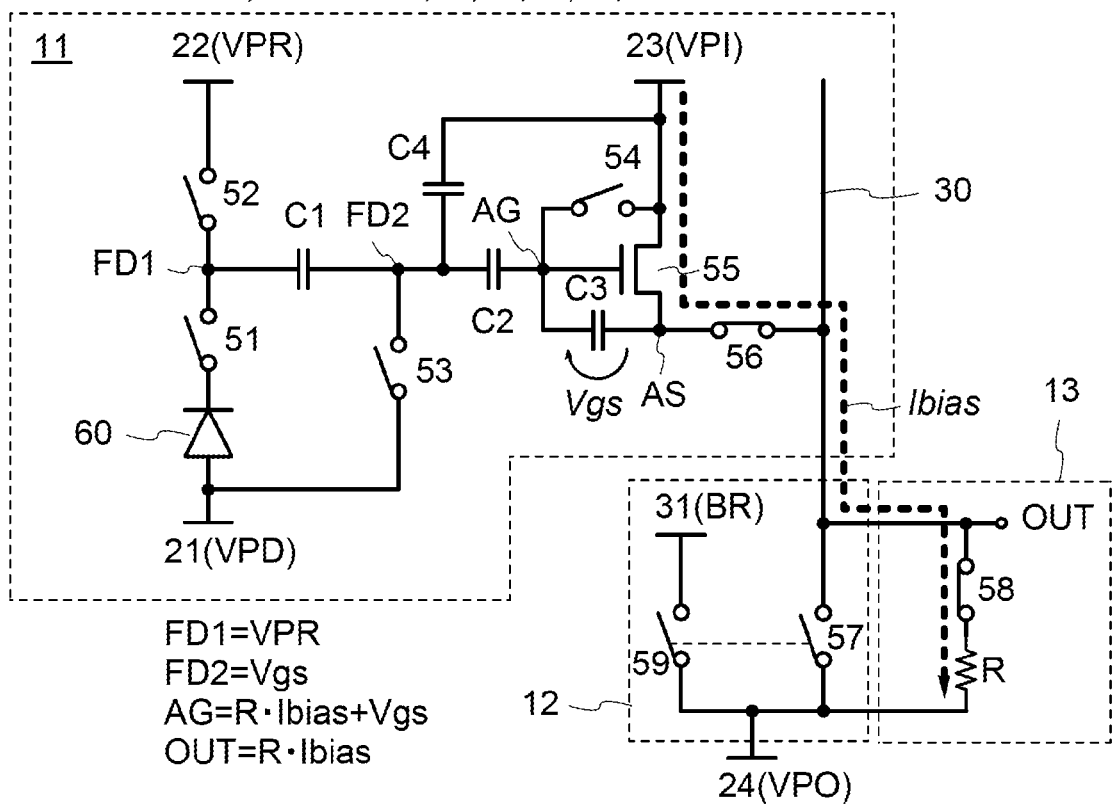
FIG. 7 illustrates compensation operation.

Next, output operation after the compensation is described. At time T4, the transistors 56 and 58 are turned on and the transistors 51, 52, 53, 54, 57, and 59 are turned off. At this time, in the capacitor C3, "$V_{gs}$" for supplying the bias current ($I_{bias}$) is held, so that the bias current ($I_{bias}$) flows between the wiring 23 (VPI) and the wiring 24 (VPO) through the circuit 13 (the transistor 58 and the resistor R). Therefore, "$R \cdot I_{bias}$" that is a reference output voltage is output from the output terminal of the circuit 13 (see FIG. 7). The potential of the other terminal of the capacitor C3 is "$R \cdot I_{bias}$" at this time; therefore, the potential of the node AG is "$R \cdot I_{bias} + V_{gs}$."

Next, on the assumption of actual imaging operation, operation when the potential of the node FD2 is changed by $-V_\alpha$ is described. First, in order to change the potential of the node FD2 by $-V_\alpha$, the transistor 52 is turned off, the transistor 51 is turned on while the potential "VPR" of the wiring 22 (VPR) is held in the node FD1, and charge corresponding to $-V_\alpha$ is discharged to the wiring 21 (VPD) through the photodiode 60 irradiated with light. Then, the transistor 51 is turned off to hold the potential of the node FD1. Through the above operation, the potential of the node FD1 can be changed from "VPR" to "VPR-$V_\alpha$."

Figure 8:
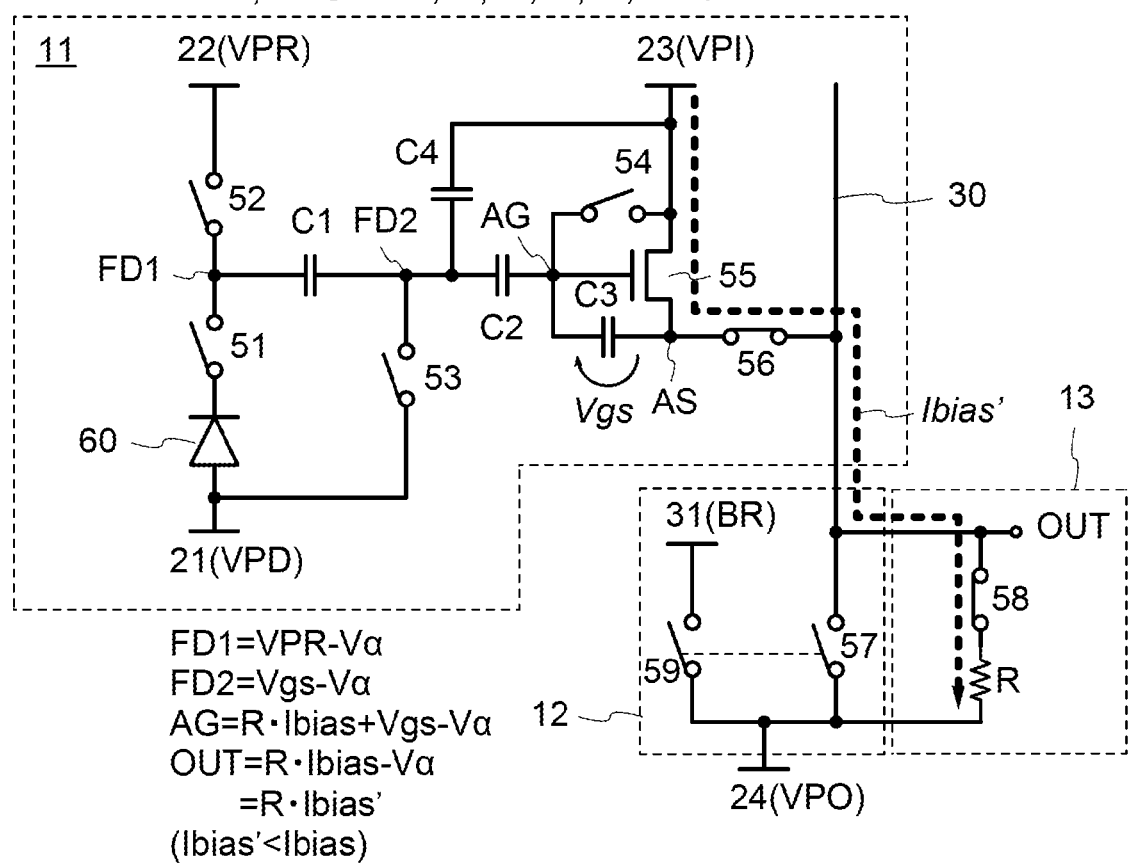
FIG. 8 illustrates compensation operation.

When the potential of the node FD1 is changed from "VPR" to "VPR-$V_\alpha$," the potential of the node FD2 is changed from "$V_{gs}$" to "$V_{gs}-V_\alpha$." In addition, the potential of the node AG is changed from "$R \cdot I_{bias}+V_{gs}$" to "$R \cdot I_{bias}+V_{gs}-V_\alpha$." Accordingly, a bias current ($I_{bias}'$) based on the potential of the node AG "$R \cdot I_{bias}+V_{gs}-V_\alpha$" is supplied between the wiring 23 (VPI) and the wiring 24 (VPO). At this time, "$R \cdot I_{bias}-V_\alpha$," that is, "$R \cdot I_{bias}'$" ($I_{bias}' < I_{bias}$) is output from the output terminal of the circuit 13 (see FIG. 8).

In this manner, the lower output signal than the reference output voltage by the voltage corresponding to $-V_\alpha$ can be obtained. That is, in the circuit structure of FIG. 1, as the intensity of light delivered to the photodiode 60 becomes higher, a signal output from the output terminal (OUT) becomes smaller.

It is not necessary to perform the compensation operation by each imaging and imaging can be successively performed only by one compensation operation. Needless to say, the compensation operation may be performed before imaging, after imaging, at the time of power-on, at the time of power-off, or at given timing using a timer or the like.

Figure 9A:
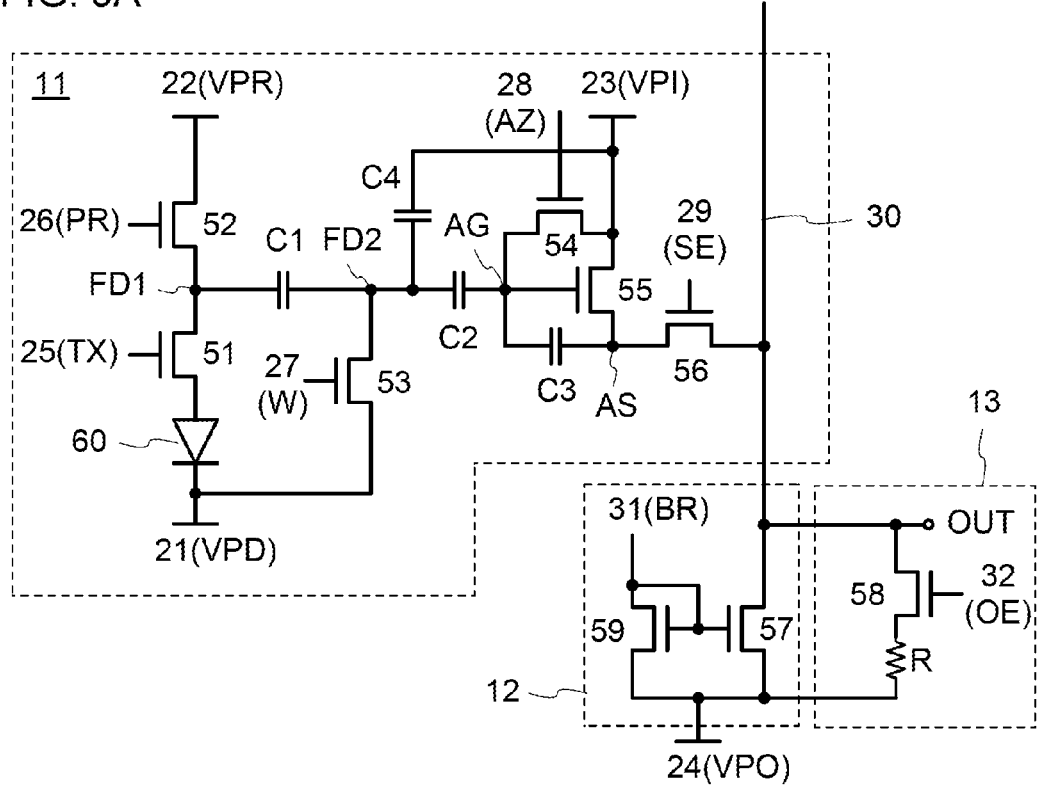
FIGS. 9A and 9B illustrate circuits of an imaging device.
Figure 9B:
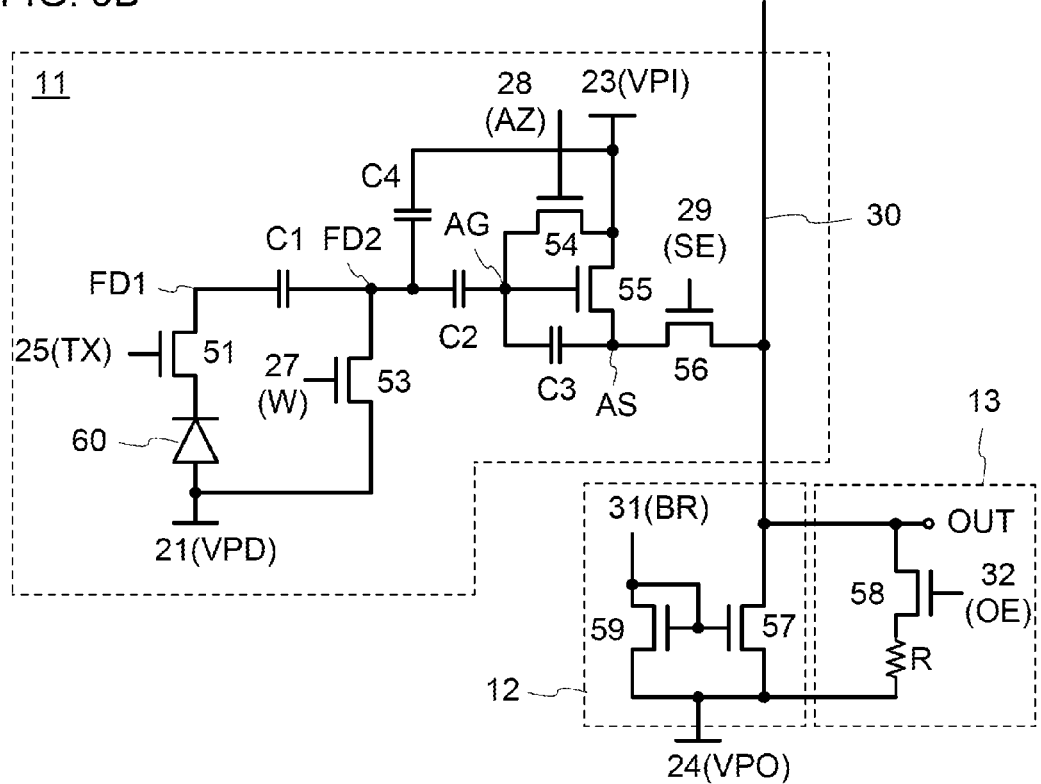

An imaging device in one embodiment of the present invention may have a structure in FIG. 9A or 9B. The connection direction of the photodiode 60 of the photoelectric conversion portion in the circuit 11 in FIG. 9A is opposite to that in FIG. 1. In that case, the wiring 21 (VPD) has a high potential and the wiring 22 (VPR) has a low potential. The circuit description in FIG. 1 can be referred to for compensation operation and output operation. In that case, as the intensity of light delivered to the photodiode 60 becomes higher, the potential of the node FD1 becomes higher. Thus, in the circuit structure of FIG. 9A, as the intensity of light delivered to the photodiode 60 becomes higher, a signal output from the output terminal (OUT) becomes larger.

In FIG. 9B, the transistor 52 is omitted from the circuit 11 in FIG. 1. In that case, the wiring 21 (VPD) can be changed to either a low potential or a high potential. FD1 reset operation can be performed when the wiring 21 (VPD) has a high potential. In a predetermined period, when the wiring 21 (VPD) has a high potential, forward bias is applied to the photodiode 60. Thus, the potential of the node FD1 can be set to the potential of the wiring 21 (VPD).

In the case where light detection operation (accumulation operation) is performed, the potential of the wiring 21 (VPD) is set to a low potential. When the wiring 21 (VPD) has a low potential, reverse bias is applied to the photodiode 60; thus, charge can be released from the node FD1 to the wiring 21 (VPD) in accordance with light intensity. In that case, as the intensity of light delivered to the photodiode 60 becomes higher, the potential of the node FD1 becomes lower. Thus, in the circuit structure of FIG. 9B, as the intensity of light delivered to the photodiode 60 becomes higher, a signal output from the output terminal (OUT) becomes smaller.

In the imaging device in one embodiment of the present invention, a transistor including an oxide semiconductor is preferably used. The use of the transistor including an oxide semiconductor in the circuit 11 can broaden the dynamic range of imaging. In the circuit structure in FIG. 1, when the intensity of light entering the photodiode 60 is high, the potential of the node AG becomes lower. Since the transistor including an oxide semiconductor has extremely low off-state current, current based on the potential of the node AG (the gate potential of the transistor 55) can be accurately output even when the gate potential is extremely low. Thus, it is possible to broaden the detectable range of illuminance, i.e., the dynamic range.

A period during which charge can be held in the node FD1, the node FD2, the node AG, and the node AS can be extremely long owing to the low off-state current of the transistor including an oxide semiconductor. Thus, a global shutter system, in which charge accumulation operation is performed in all the pixels substantially at the same time, can be used without a complicated circuit structure and operation method. Therefore, an image with little distortion can be easily obtained even in the case of a moving object. Furthermore, exposure time (a period of performing charge accumulation operation) can be long; thus, the imaging device is suitable for imaging even in a low illuminance environment.

A transistor connected to any of the node FD1, the node FD2, the node AG, and the node AS needs to be a transistor with low noise. The channel of a transistor including two or three oxide semiconductor layers to be described later is a buried channel, which has significantly high resistance to noise. Thus, the use of the transistor leads to an image with little noise.

In the one embodiment of the present invention, an output signal that does not depend on variations in parameters (the threshold voltage, mobility, size of the channel formation region (L, W), thickness (capacitance) of the gate insulating film, and the like) of the amplifier transistor (the transistor 55) included in the pixel circuit can be obtained.

Figure 10A:
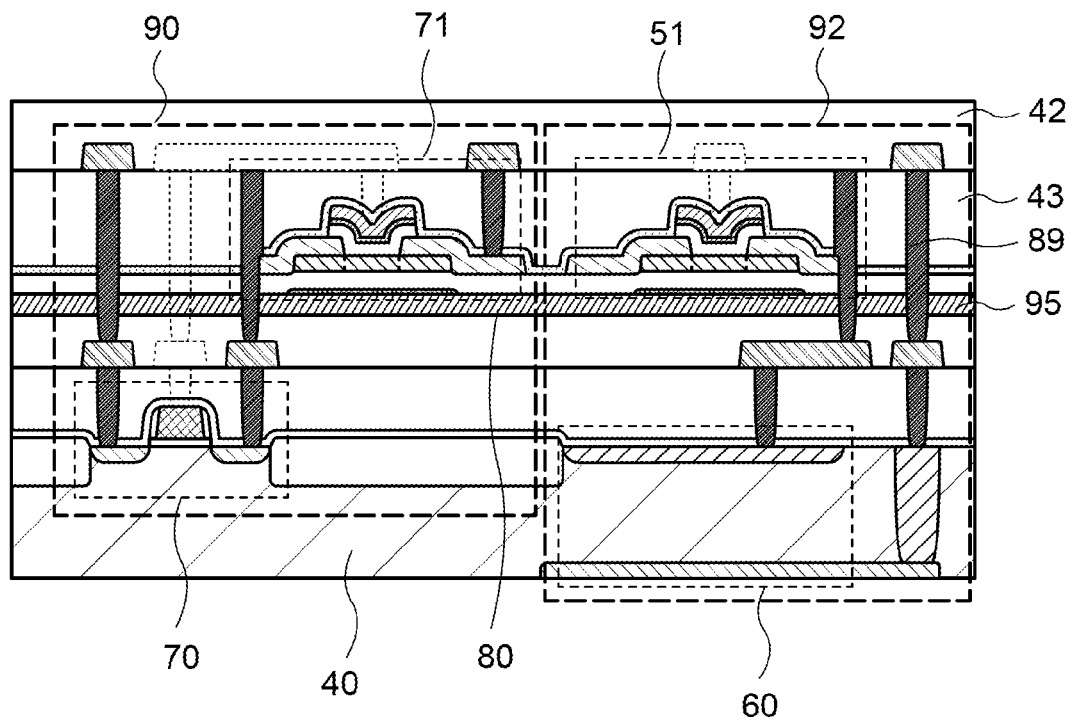
FIGS. 10A and 10B are cross-sectional views of imaging devices including circuit portions.

FIG. 10A is an example of a cross-sectional view of an imaging device including a circuit portion. A circuit portion 90 is a combination of a transistor 70 that includes an active region in a silicon substrate and a transistor 71 that includes an oxide semiconductor as an active layer, and can form, for example, an inverter circuit or a memory circuit. In addition, a circuit portion 92 is a combination of the photodiode 60 formed using a silicon substrate 40 and the transistor 51 that includes an oxide semiconductor as an active layer, and corresponds to part of the photoelectric conversion portion of the circuit 11 in FIG. 1. Note that wirings and contact plugs indicated by broken lines show that placement is different from that of other wirings and contact plugs in a depth direction.

Although wirings, electrodes, and conductors 89 are illustrated as independent components in the drawings in this embodiment, in the case where such components are electrically connected to each other, they may be provided as one component. Moreover, the structure in which the gate electrodes, the source electrodes, or the drain electrodes of the transistors are connected to wirings through the conductors 89 is only an example, and there is a case in which the gate electrodes, the source electrodes, and the drain electrodes of the transistors function as wirings. Furthermore, there are a case in which one or more of the wirings illustrated in the drawings are not provided and a case in which another wiring or transistor is included in any of the layers.

Insulating layers each functioning as a protective film, an interlayer insulating film, or a planarization film are provided over the components. Insulating layers 41 to 43 and the like (the insulating layer 41 is not illustrated in FIGS. 10A and 10B), for example, can each be formed using an inorganic insulating film such as a silicon oxide film or a silicon oxynitride film, an organic insulating film such as an acrylic resin film or a polyimide resin film, or the like. Top surfaces of the insulating layers 41 to 43 and the like are preferably subjected to planarization treatment as necessary by chemical mechanical polishing (CMP) or the like.

In FIG. 10A, the photodiode 60 and the transistor 51 can be formed to overlap with each other; thus, the integration degree of pixels can be increased. In other words, the resolution of the imaging device can be increased. Furthermore, since the silicon substrate 40 is not provided with a transistor formed in the occupation area of the circuit portion 92, the area of the photodiode can be large. Thus, an image with low noise can be obtained even in a low illuminance environment.

Figure 10B:
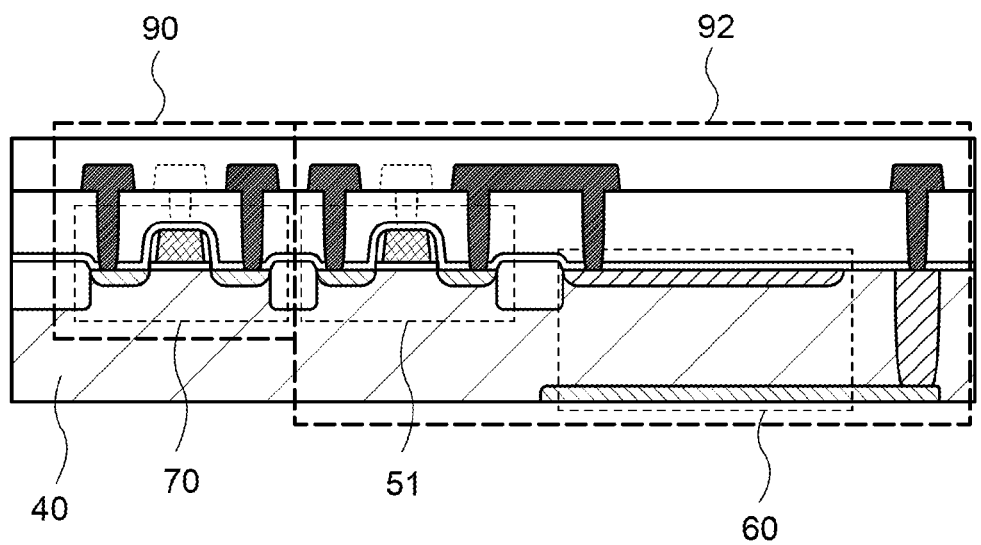

Although FIGS. 10A and 10B illustrate a structure in which the photodiode 60 and the transistor 70 are formed using the silicon substrate 40, one embodiment of the present invention is not limited thereto. For example, the transistor 70 may be formed using the silicon substrate 40 and a photodiode formed using another substrate may be attached. Alternatively, the transistor 70 may be formed without the use of the silicon substrate 40, and a transistor that includes an oxide semiconductor as an active layer may be provided as in the transistors 71 and 51. Alternatively, as illustrated in FIG. 10B, the transistors 70 and 51 may be provided using the silicon substrate 40. An element other than the transistor 70 may be formed using the silicon substrate 40. For example, a capacitor, a diode, or a resistor may be formed using the silicon substrate 40.

In the structure in FIG. 10A, an insulating layer 95 is provided between a region including the transistor 70 and the photodiode 60 and a region including the transistors 71 and 51.

Dangling bonds of silicon are terminated with hydrogen in insulating layers provided in the vicinity of the active region of the transistor 70. Therefore, hydrogen has an effect of improving the reliability of the transistor 70. Meanwhile, hydrogen in insulating layers provided in the vicinities of oxide semiconductor layers that are the active layers of the transistors 51 and 71 and the like causes generation of carriers in the oxide semiconductors. Therefore, hydrogen might reduce the reliability of the transistors 51 and 71 and the like. Consequently, in the case where one layer that includes a transistor including a silicon-based semiconductor material and the other layer that includes the transistor including an oxide semiconductor are stacked, it is preferable that the insulating layer 95 having a function of preventing diffusion of hydrogen be provided between these layers. Hydrogen is confined in the one layer by the insulating layer 95, so that the reliability of the transistor 51 can be improved. Furthermore, diffusion of hydrogen from the one layer to the other layer is inhibited, so that the reliability of the transistors 51 and 71 and the like can be improved.

The insulating layer 95 can be formed using aluminum oxide, aluminum oxynitride, gallium oxide, gallium oxynitride, yttrium oxide, yttrium oxynitride, hafnium oxide, hafnium oxynitride, or yttria-stabilized zirconia (YSZ), for example.

The silicon substrate 40 is not limited to a bulk silicon substrate and may be an SOI substrate. Furthermore, the silicon substrate 40 can be replaced with a substrate made of germanium, silicon germanium, silicon carbide, gallium arsenide, aluminum gallium arsenide, indium phosphide, gallium nitride, or an organic semiconductor, or a substrate over which a thin film of the material is formed.

The transistor 70 can be a transistor of various types without being limited to a planar type transistor. For example, the transistor 70 can be a fin-type transistor or a tri-gate transistor.

The transistor 51 can include various types of semiconductors as well as an oxide semiconductor depending on conditions. For example, the transistor 51 can include silicon, germanium, silicon germanium, silicon carbide, gallium arsenide, aluminum gallium arsenide, indium phosphide, gallium nitride, or an organic semiconductor.

Figure 11A:
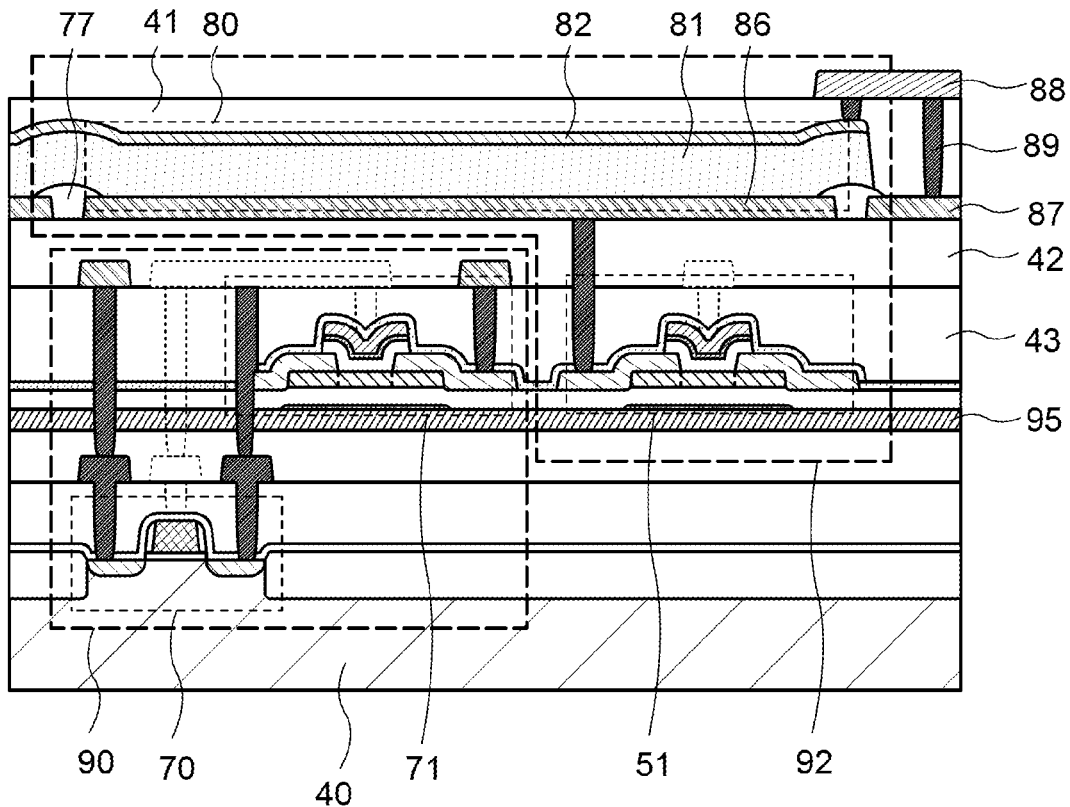
FIGS. 11A to 11C are cross-sectional views of imaging devices including circuit portions.

The imaging device of one embodiment of the present invention may have a structure in FIG. 11A.

A variety of elements can be used as a photoelectric conversion element 80 which is a modification example of the photodiode 60 illustrated in FIGS. 10A and 10B. FIG. 11A illustrates the photoelectric conversion element 80 including a selenium-based material for a photoelectric conversion layer 81. The photoelectric conversion element 80 including a selenium-based material has high external quantum efficiency with respect to visible light. In the photoelectric conversion element, a highly sensitive sensor in which the amount of amplification of electrons with respect to the amount of incident light by avalanche multiplication is large can be obtained. Moreover, the selenium-based material has a high light absorption coefficient, which leads to an advantage that the photoelectric conversion layer 81 is easily formed to be thin.

Amorphous selenium or crystalline selenium can be used as a selenium-based material. Crystalline selenium can be obtained by, for example, depositing amorphous selenium and then performing heat treatment. When the crystal grain size of crystalline selenium is smaller than a pixel pitch, variation in characteristics between pixels can be reduced. Moreover, crystalline selenium has higher spectral sensitivity and light-absorption coefficient than those of amorphous selenium.

Although the photoelectric conversion layer 81 is a single layer, a structure can be employed in which gallium oxide, cerium oxide, or the like is used on a light-receiving surface side of a selenium-based material for a layer for preventing hole injection and nickel oxide, antimony sulfide, or the like is used for a layer for preventing electron injection on an electrode 86 side.

Furthermore, the photoelectric conversion layer 81 may be a layer including a compound of copper, indium, and selenium (CIS). Alternatively, a layer including a compound of copper, indium, gallium, and selenium (CIGS) may be used. With the CIS layer or the CIGS layer, a photoelectric conversion element that can utilize avalanche multiplication in a manner similar to that of a single layer of selenium can be formed.

In the photoelectric conversion element 80 including a selenium-based material, for example, the photoelectric conversion layer 81 can be provided between a light-transmitting conductive layer 82 and the electrode 86 formed using a metal material or the like. CIS and CIGS are p-type semiconductors and may be formed in contact with an n-type semiconductor such as cadmium sulfide or zinc sulfide to form a junction.

Comparatively high voltage (e.g., 10 V or higher) is preferably applied to the photoelectric conversion element to cause the avalanche phenomenon. Since the OS transistor has higher drain breakdown voltage than the Si transistor, comparatively high voltage can be easily applied to the photoelectric conversion element. Therefore, by combination of the OS transistor with high drain breakdown voltage and the photoelectric conversion element in which the selenium-based material is used for the photoelectric conversion layer, a highly sensitive and highly reliable imaging device can be obtained.

Figure 12A:
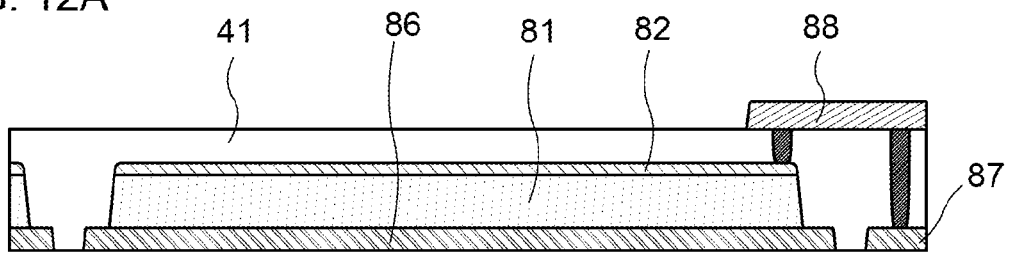
FIGS. 12A to 12D are cross-sectional views each illustrating a connection configuration of a photoelectric conversion element.
Figure 12B:
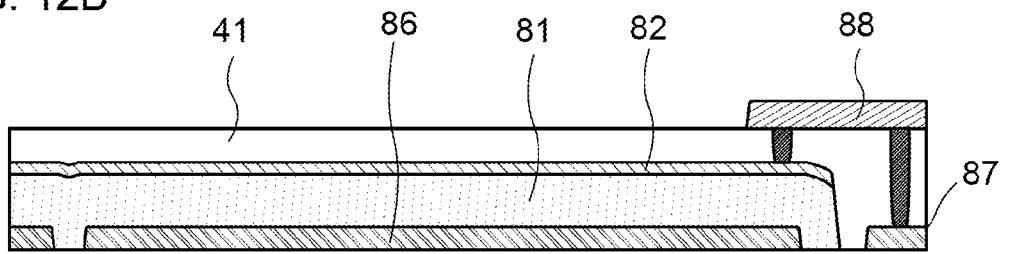
Figure 12C:
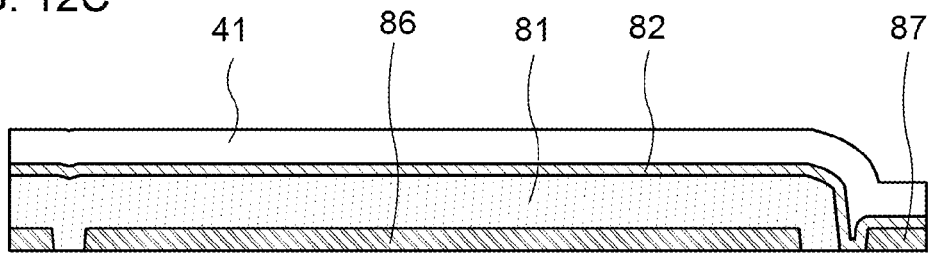
Figure 12D:
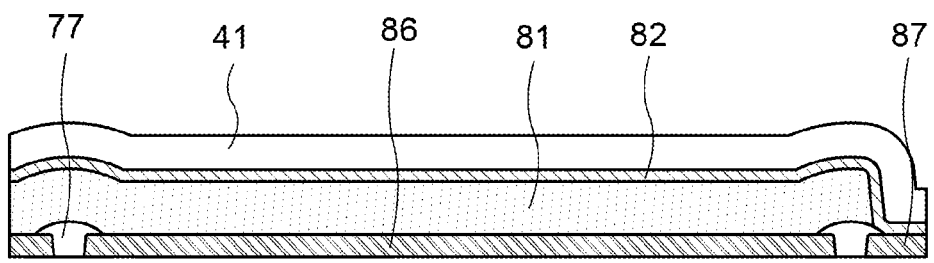

Although the photoelectric conversion layer 81 and the light-transmitting conductive layer 82 are not divided between pixel circuits in FIG. 11A, the photoelectric conversion layer 81 and the light-transmitting conductive layer 82 may be divided between circuits as illustrated in FIG. 12A. Furthermore, a partition wall 77 formed using an insulator is preferably provided in a region between pixels where the electrode 86 is not provided so as not to generate a crack in the photoelectric conversion layer 81 and the light-transmitting conductive layer 82; however, the partition wall 77 is not necessarily provided as illustrated in FIG. 12B. Although the light-transmitting conductive layer 82 and a wiring 87 are connected through a wiring 88 and the conductor 89 in FIG. 11A, the light-transmitting conductive layer 82 and the wiring 87 may be in direct contact with each other as in FIGS. 12C and 12D.

Figure 13A:
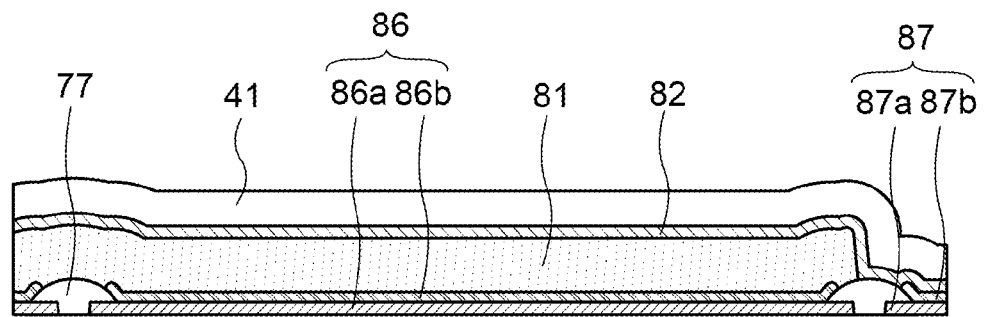
FIGS. 13A and 13B are cross-sectional views each illustrating a connection configuration of a photoelectric conversion element.

The electrode 86, the wiring 87, and the like may each be a multilayer. For example, as illustrated in FIG. 13A, the electrode 86 can include two conductive layers 86a and 86b and the wiring 87 can include two conductive layers 87a and 87b. In the structure of FIG. 13A, for example, the conductive layers 86a and 87a may be made of a low-resistance metal or the like, and the conductive layers 86b and 87b may be made of a metal or the like that exhibits an excellent contact property with the photoelectric conversion layer 81. Such a structure improves the electrical properties of the photoelectric conversion element. Furthermore, even when the conductive layer 87a contains a metal that causes electrolytic corrosion, which occurs when some kinds of metal are in contact with the light-transmitting conductive layer 82, electrolytic corrosion can be prevented because the conductive layer 87b is placed between the conductive layer 87a and the light-transmitting conductive layer 82.

The conductive layers 86b and 87b can be formed using, for example, molybdenum, tungsten, or the like. The conductive layers 86a and 87a can be formed using, for example, aluminum, titanium, or a stack of titanium, aluminum, and titanium that are layered in that order.

Figure 13B:
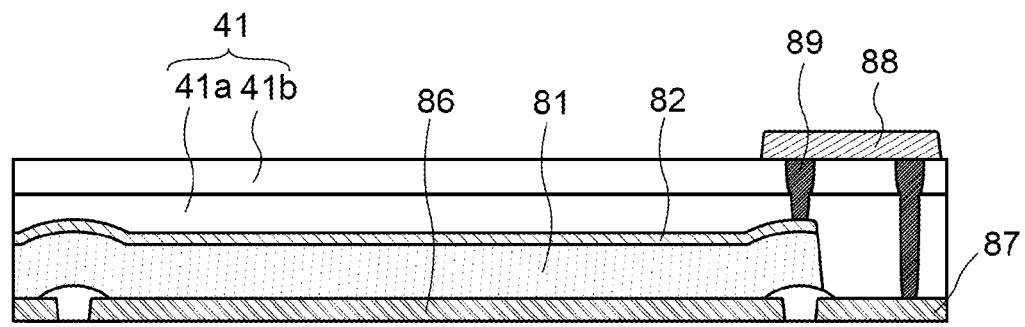

The insulating layer 41 and the like may each be a multilayer. For example, as illustrated in FIG. 13B, the conductor 89 has a difference in level in the case where the insulating layer 41 includes insulating layers 41a and 41b that have different etching rates. In the case where another insulating layer used as an interlayer insulating film or a planarization film is a multilayer, the conductor 89 also has a difference in level. Although the insulating layer 41 is formed using two layers here, the insulating layer 41 and another insulating layer may each be formed using three or more layers.

Note that the partition wall 77 can be formed using an inorganic insulator, an insulating organic resin, or the like. The partition wall 77 may be colored black or the like in order to shield the transistors and the like from light and/or to determine the area of a light-receiving portion in each pixel.

Figure 11B:
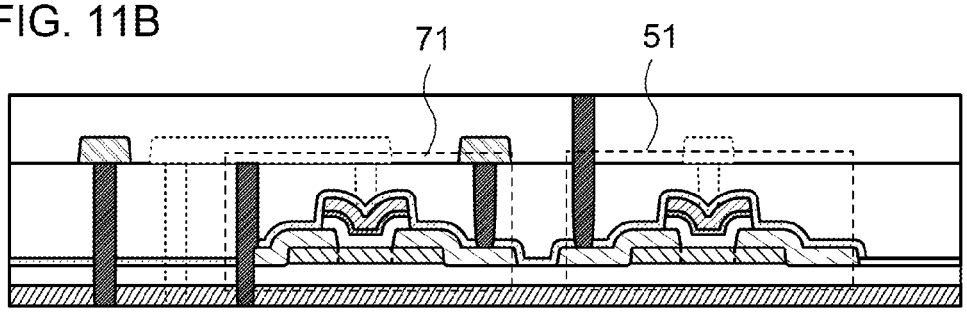
Figure 11C:
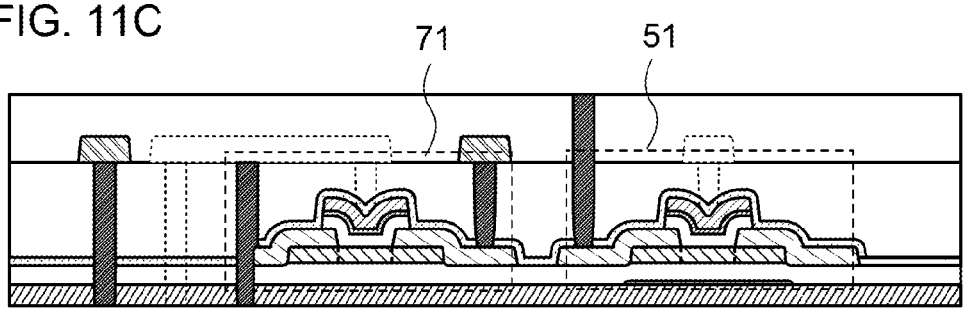

Note that although each of the transistors 51 and 71 includes a back gate in FIG. 11A, as illustrated in FIG. 11B, each of the transistors 51 and 71 does not necessarily include a back gate. Alternatively, as illustrated in FIG. 11C, one or more transistors, for example, only the transistor 51 may include a back gate. The back gate might be electrically connected to a front gate of an opposite transistor. Alternatively, different fixed potentials might be supplied to the back gate and the front gate. Note that the presence or absence of the back gate can also be applied to another imaging device described in this embodiment.

Alternatively, a PIN diode element or the like formed using an amorphous silicon film, a microcrystalline silicon film, or the like may be used as the photoelectric conversion element 80.

Figure 14:
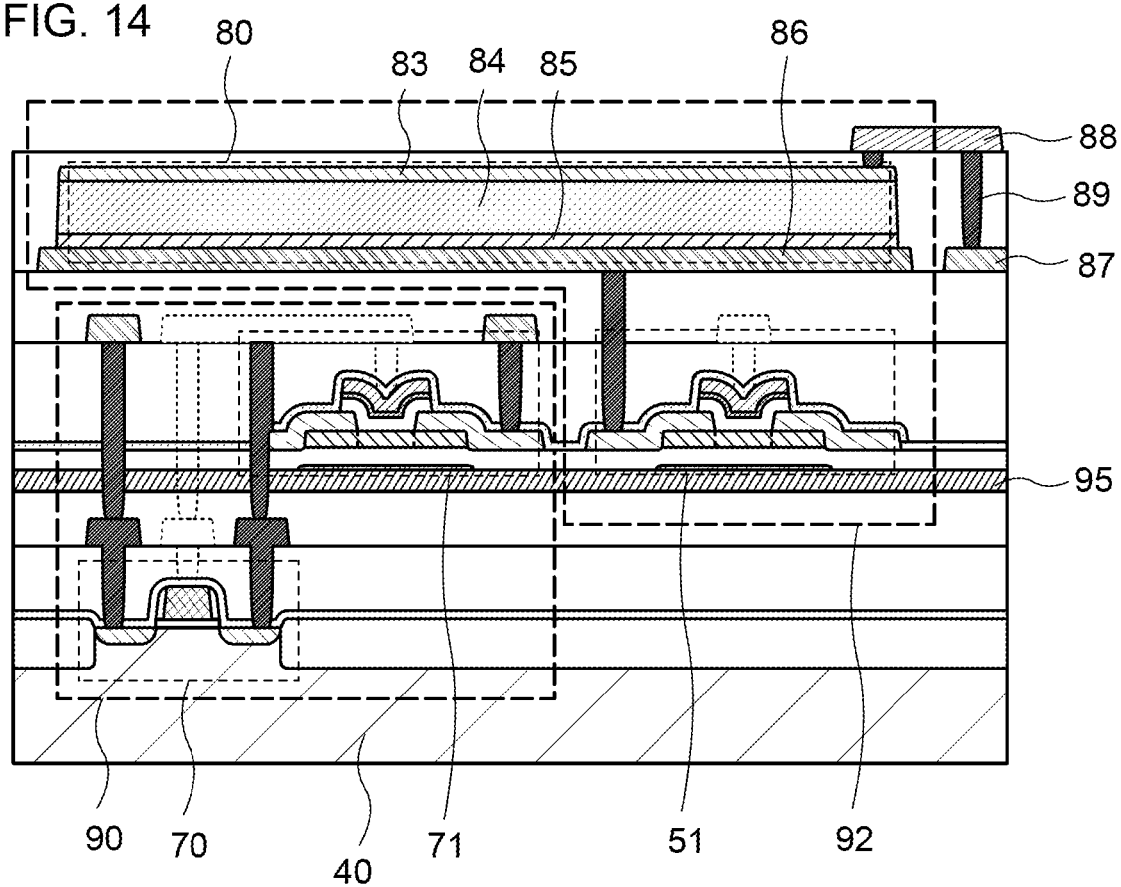
FIG. 14 is a cross-sectional view of an imaging device including a circuit portion.

FIG. 14 illustrates an example in which a thin film PIN photodiode is used as the photoelectric conversion element 80. In the photodiode, an n-type semiconductor layer 85, an i-type semiconductor layer 84, and a p-type semiconductor layer 83 are stacked in that order. The i-type semiconductor layer 84 is preferably formed using amorphous silicon. The p-type semiconductor layer 83 and the n-type semiconductor layer 85 can each be formed using amorphous silicon, microcrystalline silicon, or the like that includes a dopant imparting the corresponding conductivity type. A photodiode in which a photoelectric conversion layer is formed using amorphous silicon has high sensitivity in a visible light wavelength region, and therefore can easily sense weak visible light.

In the photoelectric conversion element 80 in FIG. 14, the n-type semiconductor layer 85 functioning as a cathode is electrically connected to the electrode 86 that is electrically connected to the transistor 56. Furthermore, the p-type semiconductor layer 83 functioning as an anode is electrically connected to the wirings 88 and 87 through the conductor 89.

In any case, the photoelectric conversion element 80 is preferably formed so that the p-type semiconductor layer 83 serves as a light-receiving surface. When the p-type semiconductor layer 83 serves as a light-receiving surface, the output current of the photoelectric conversion element 80 can be increased. Therefore, as for the connection configuration of the photoelectric conversion element 80 with wirings or the like, what the anode is connected to and what the cathode is connected to in FIG. 14 may be reversed.

Furthermore, any of examples illustrated in FIGS. 15A to 15F may be applied to the structure of the photoelectric conversion element 80 having a configuration of a PIN thin film photodiode and the connection between the photoelectric conversion element 80 and the wirings. Note that the structure of the photoelectric conversion element 80 and the connection between the photoelectric conversion element 80 and the wirings are not limited thereto, and other configurations may be applied.

Figure 15A:
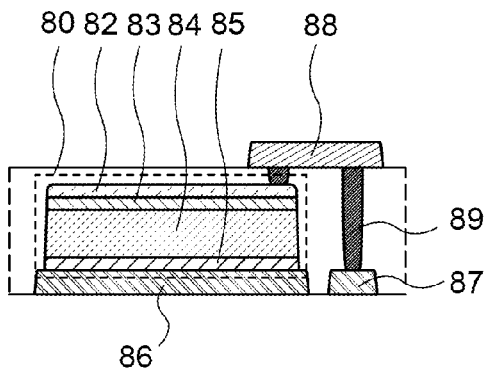
FIGS. 15A to 15F are cross-sectional views each illustrating a connection configuration of a photoelectric conversion element.

FIG. 15A illustrates a structure provided with the light-transmitting conductive layer 82 in contact with the p-type semiconductor layer 83 of the photoelectric conversion element 80. The light-transmitting conductive layer 82 functions as an electrode and can increase the output current of the photoelectric conversion element 80.

For the light-transmitting conductive layer 82, the following can be used: indium tin oxide; indium tin oxide containing silicon; indium oxide containing zinc; zinc oxide; zinc oxide containing gallium; zinc oxide containing aluminum; tin oxide; tin oxide containing fluorine; tin oxide containing antimony; graphene; or the like. The light-transmitting conductive layer 82 is not limited to a single layer, and may be a stacked layer of different films.

Figure 15B:
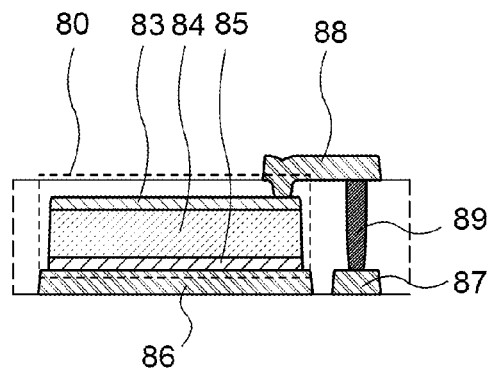

FIG. 15B illustrates a structure in which the p-type semiconductor layer 83 of the photoelectric conversion element 80 is directly connected to the wiring 88.

Figure 15C:
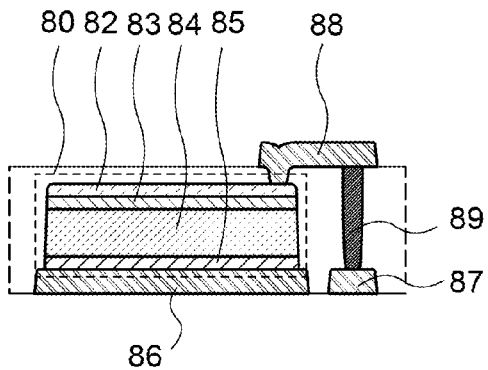

FIG. 15C illustrates a structure in which the light-transmitting conductive layer 82 in contact with the p-type semiconductor layer 83 of the photoelectric conversion element 80 is provided, and the wiring 88 is electrically connected to the light-transmitting conductive layer 82.

Figure 15D:
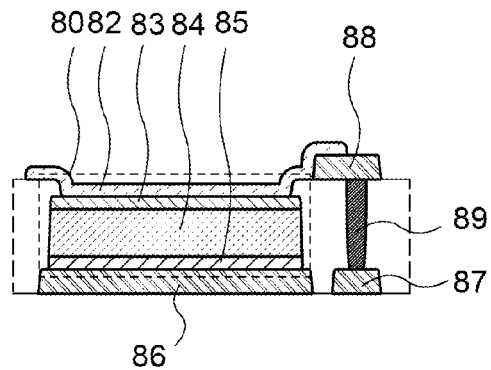

FIG. 15D illustrates a structure in which an opening portion exposing the p-type semiconductor layer 83 is provided in an insulating layer covering the photoelectric conversion element 80, and the light-transmitting conductive layer 82 that covers the opening portion is electrically connected to the wiring 88.

Figure 15E:
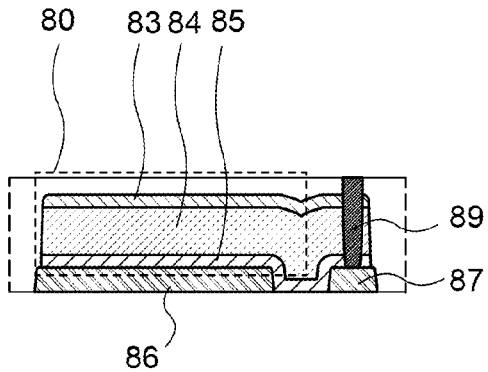

FIG. 15E illustrates a structure provided with the conductor 89 that penetrates the photoelectric conversion element 80. In the structure, the wiring 87 is electrically connected to the p-type semiconductor layer 83 through the conductor 89. Note that in the drawing, the wiring 87 appears to be electrically connected to the electrode 86 through the n-type semiconductor layer 85. However, resistance in the lateral direction of the n-type semiconductor layer 85 is high; therefore, when an appropriate distance is provided between the wiring 87 and the electrode 86, the resistance between the wiring 87 and the electrode 86 is extremely high. Thus, the photoelectric conversion element 80 can have diode characteristics without a short circuit between the anode and the cathode. Note that two or more conductors 89 that are electrically connected to the p-type semiconductor layer 83 may be provided.

Figure 15F:
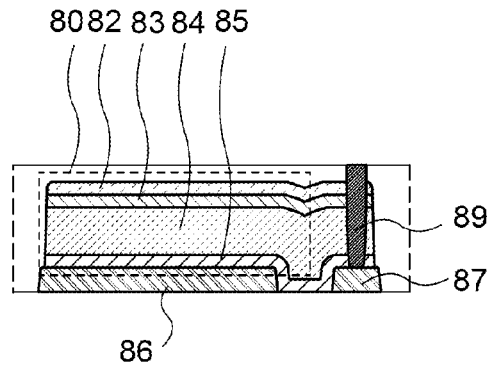

FIG. 15F illustrates a structure in which the photoelectric conversion element 80 in FIG. 15E is provided with the light-transmitting conductive layer 82 in contact with the p-type semiconductor layer 83.

Note that each of the photoelectric conversion elements 80 in FIGS. 15D to 15F has an advantage of having a large light-receiving area because wirings and the like do not overlap with a light-receiving region.

The photoelectric conversion element 80 formed using the selenium-based material, amorphous silicon, or the like can be formed through general semiconductor manufacturing processes such as a deposition process, a lithography process, and an etching process. Furthermore, the resistance of the selenium-based material is high; thus, a structure in which the photoelectric conversion layer 81 is not divided between the circuits can be employed as illustrated in FIG. 11A. Therefore, the imaging device in one embodiment of the present invention can be manufactured with a high yield at low cost. Meanwhile, to form a photodiode in which the photoelectric conversion layer 81 is formed using crystalline silicon, processes with high difficulty, such as a polishing process and a bonding process, are needed.

As illustrated in FIGS. 16A1 and 16B1, the imaging device may be bent. FIG. 16A1 illustrates a state in which the imaging device is bent in the direction of dashed-two dotted line X1-X2. FIG. 16A2 is a cross-sectional view illustrating a portion indicated by dashed-two dotted line X1-X2 in FIG. 16A1. FIG. 16A3 is a cross-sectional view illustrating a portion indicated by dashed-two dotted line Y1-Y2 in FIG. 16A1.

FIG. 16B1 illustrates a state where the imaging device is bent in the direction of dashed-two dotted line X3-X4 and the direction of dashed-two dotted line Y3-Y4. FIG. 16B2 is a cross-sectional view illustrating a portion indicated by dashed-two dotted line X3-X4 in FIG. 16B1. FIG. 16B3 is a cross-sectional view illustrating a portion indicated by dashed-two dotted line Y3-Y4 in FIG. 16B1.

Bending the imaging device can reduce field curvature and astigmatism. Thus, the optical design of lens and the like, which are used in combination of the imaging device, can be facilitated. For example, the number of lenses used for aberration correction can be reduced; accordingly, the size or weight of semiconductor devices including the imaging device can be easily reduced. In addition, the quality of a captured image can be improved.

In this embodiment, one embodiment of the present invention has been described. Other embodiments of the present invention are described in the other embodiments. Note that one embodiment of the present invention is not limited thereto. Although an example in which one embodiment of the present invention is applied to an imaging device is described, one embodiment of the present invention is not limited thereto. Depending on circumstances or conditions, one embodiment of the present invention is not necessarily applied to an imaging device. One embodiment of the present invention may be applied to a semiconductor device with an another function, for example. Although examples in which, in one embodiment of the present invention, a function of compensating variation or degradation in electrical characteristics of a transistor is provided or compensation operation is performed, one embodiment of the present invention is not limited thereto. Depending on circumstances or conditions, one embodiment of the present invention does not necessarily compensate variation or degradation in electrical characteristics of a transistor.

This embodiment can be combined with any of the structures described in the other embodiments as appropriate.

Embodiment 2

In this embodiment, an example of a method for driving a pixel circuit is described.

The pixel circuit described in Embodiment 1 can perform first operation in which normal imaging is performed and second operation in which differential data of imaging data of an initial frame and imaging data of a current frame can be retained and a signal based on the differential data can be output. In the second operation, differential data can be output without a comparison process or the like in an external circuit; thus, the pixel circuit can be applied to a low-power security camera or the like.

Figure 17A:
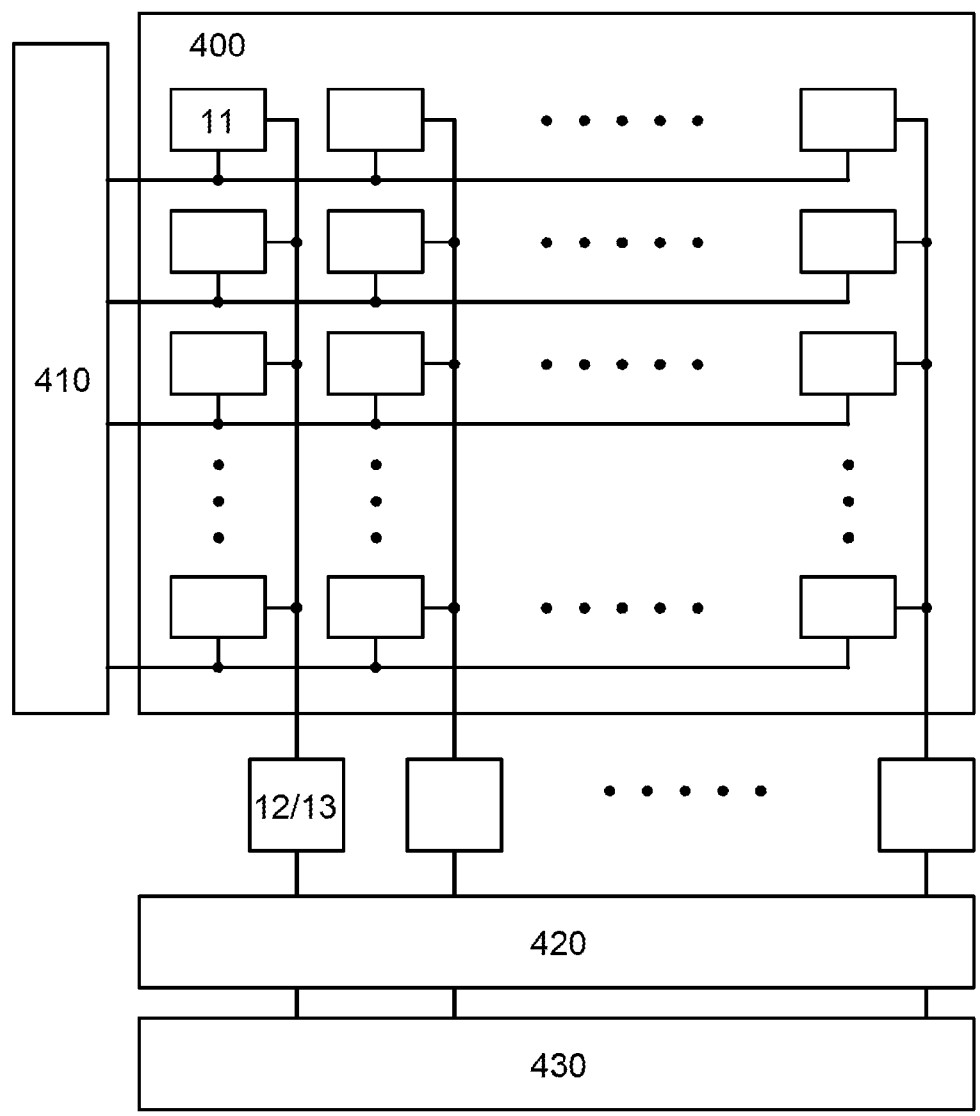
FIGS. 17A and 17B each illustrate a structure of an imaging device.
Figure 17B:
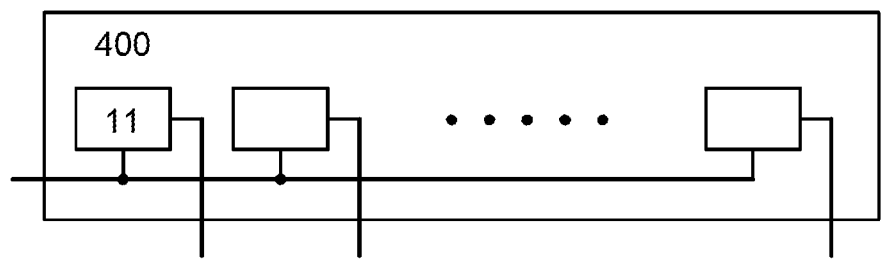

As illustrated in FIGS. 17A and 17B, an imaging device in one embodiment of the present invention includes a pixel portion 400 that includes the circuits 11 arranged in a matrix, a row driver 410 connected to the circuits 11, the circuits 12 and the circuits 13 that are connected to the circuits 11, an A/D converter 420 connected to the circuits 12, and a column driver 430 connected to the A/D converter 420. The pixel portion 400 can have a structure in which the circuits 11 are arranged in a line as illustrated in FIG. 17B. In the imaging device having the structure illustrated in FIG. 17B, data in a plane can be read by scanning in one direction.

Imaging data obtained in the circuit 11 selected by the row driver 410 is input to the A/D converter 420 through the circuit 12. The A/D converter 420 converts input imaging data into digital data by A/D conversion. The A/D converted digital data are sequentially extracted to the outside by the column driver 430. As the row driver 410 and the column driver 430, for example, a variety of circuits such as a decoder and a shift register can be used.

Figure 18:
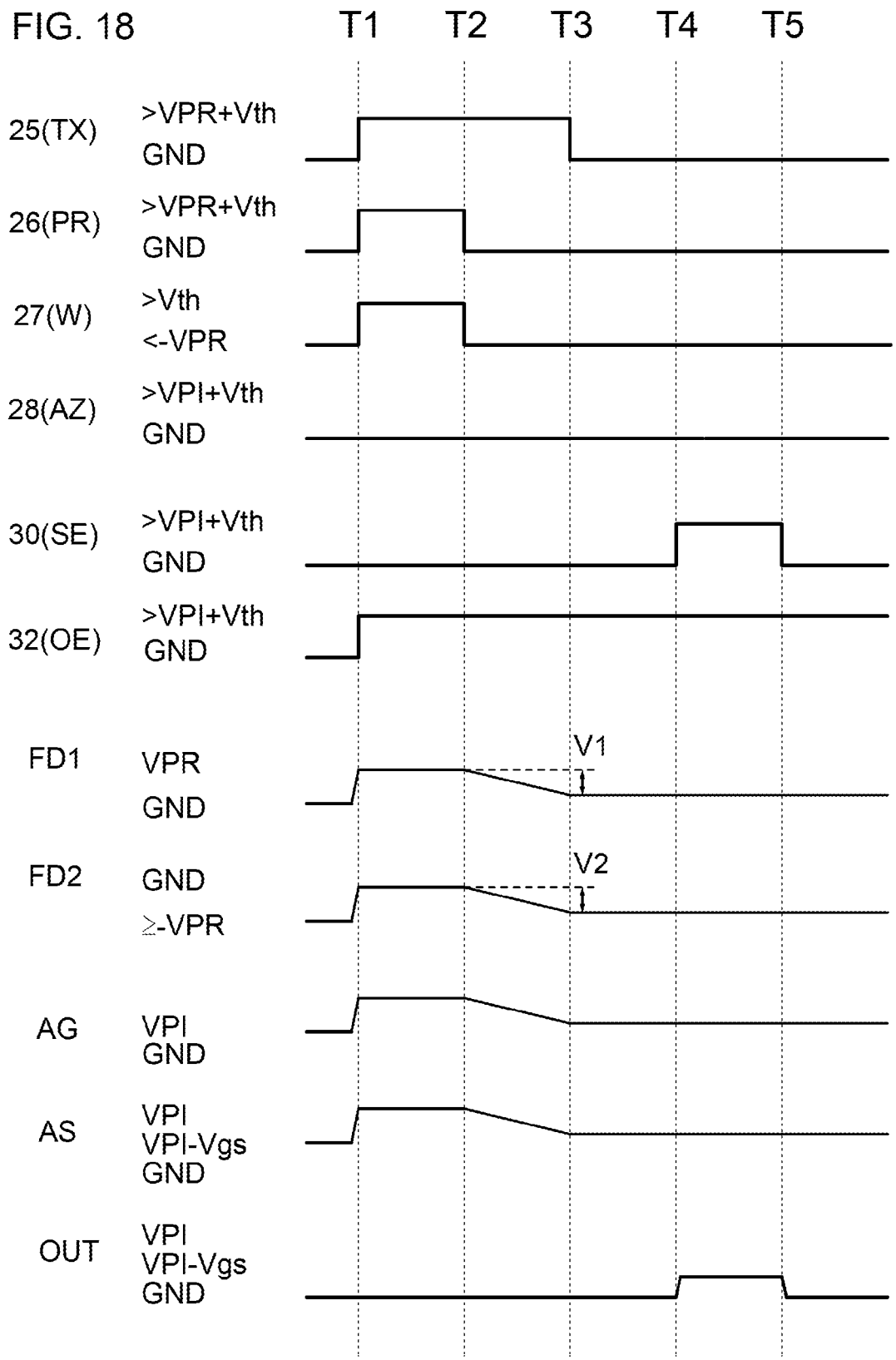
FIG. 18 is a timing chart illustrating operation of an imaging device.

Next, first operation of the circuit in FIG. 1 is described with reference to a timing chart in FIG. 18.

From the time T1 to the time T2, the wiring 25 (TX) is set to a potential higher than VPR+$V_{th}$, the wiring 26 (PR) is set to a potential higher than VPR+$V_{th}$, and the wiring 27 (W) is set to a potential higher than $V_{th}$. At this time, the potential of the node FD1 is set to the potential of the wiring 22 (VPR), i.e., "VPR" and the potential of the node FD2 is set to the potential of the wiring 21 (VPD), i.e., "GND" (reset operation).

From the time T2 to the time T3, the wiring 25 (TX) is set to a potential higher than VPR+$V_{th}$, the wiring 26 (PR) is set to "GND," and the wiring 27 (W) is set to a potential lower than −VPR. Here, the potentials of the node FD1 and the node FD2 are decreased in response to light with which the photodiode 60 is irradiated. When the amount of decrease in the potential of the node FD1 at the time T3 is denoted by V1, the potential of the node FD1 is VPR−V1. In addition, the potential of the node FD2 is decreased by V2 due to capacitive coupling and becomes GND−V2 (accumulation operation). Note that in the circuit structure in FIG. 1, as the intensity of light delivered to the photodiode 60 becomes higher, the potentials of the node FD1 and the node FD2 become lower.

In the case where the wiring 25 (TX) is set to "GND," the wiring 26 (PR) is set to "GND," and the wiring 27 (W) is set to a potential lower than −VPR from the time T3 to the time T4, the potentials of the node FD1 and the node FD2 are held.

In the case where the wiring 30 (SE) is set to a potential higher than VPI+$V_{th}$ from the time T4 to time T5, a signal based on imaging data is output to the output terminal (OUT) in accordance with the potential of the node FD2 (selection operation). Through the operation from the time T1 to the time T5, the first operation can be performed.

Figure 19:
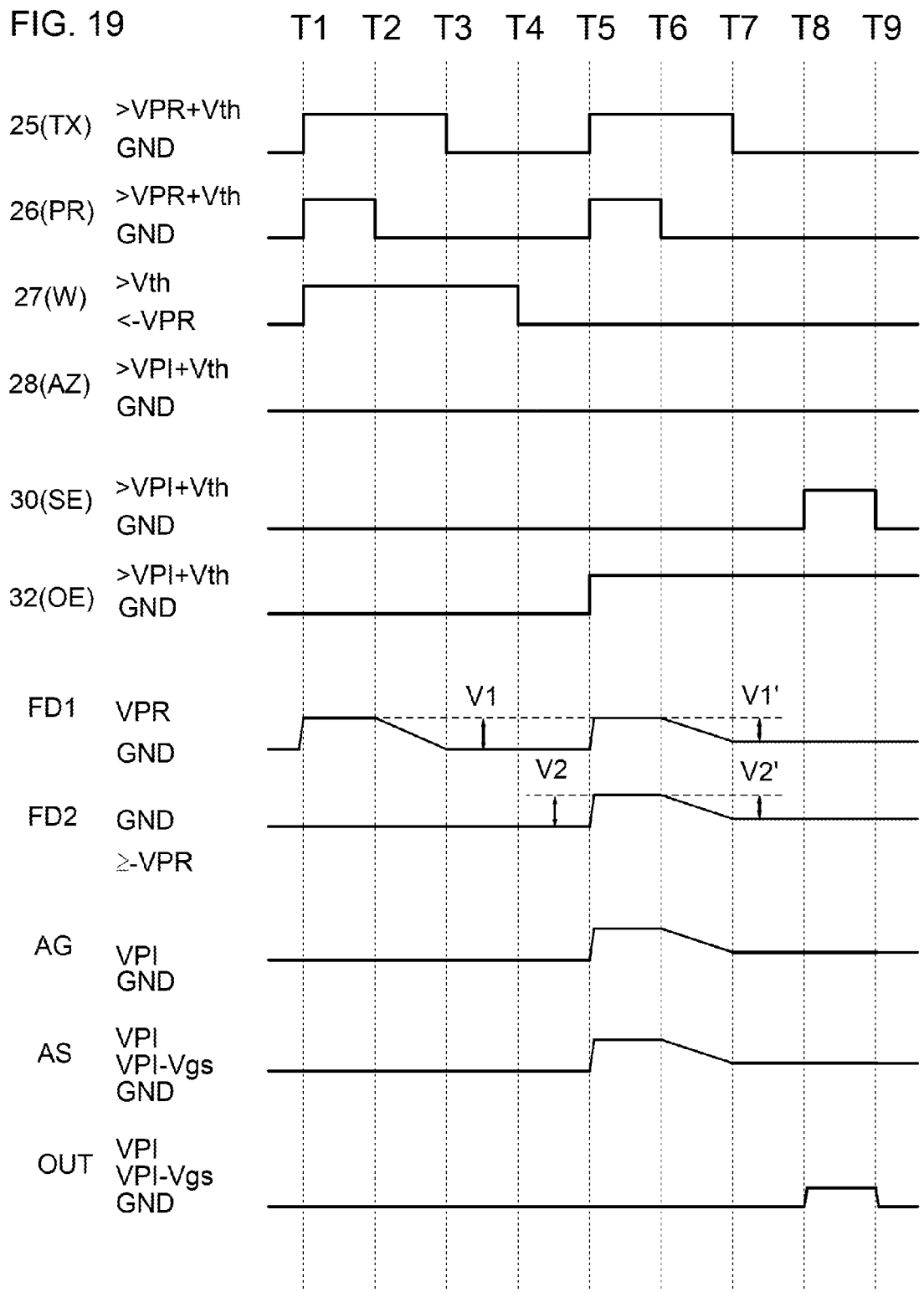
FIG. 19 is a timing chart illustrating operation of an imaging device.

Next, second operation of the circuit in FIG. 1 is described with reference to a timing chart in FIG. 19.

From the time T1 to the time T2, the wiring 25 (TX) is set to a potential higher than VPR+$V_{th}$, the wiring 26 (PR) is set to a potential higher than VPR+$V_{th}$, and the wiring 27 (W) is set to a potential higher than $V_{th}$. At this time, the potential of the node FD1 is set to the potential of the wiring 22 (VPR), i.e., "VPR" and the potential of the node FD2 is set to the potential of the wiring 21 (VPD), i.e., "GND."

From the time T2 to the time T3, the wiring 25 (TX) is set to a potential higher than VPR+$V_{th}$, the wiring 26 (PR) is set to "GND," and the wiring 27 (W) is set to a potential higher than $V_{th}$. Here, the potential of the node FD1 is decreased in response to light with which the photodiode 60 is irradiated. When the amount of decrease in the potential of the node FD1 at the time T3 is denoted by V1, the potential of the node FD1 is VPR−V1. Note that in the circuit structure in FIG. 1, as the intensity of light delivered to the photodiode 60 becomes higher, the potential of the node FD1 becomes lower.

In the case where the wiring 25 (TX) is set to "GND," the wiring 26 (PR) is set to "GND," and the wiring 27 (W) is set to a potential higher than $V_{th}$ from the time T3 to the time T4, the potential of the node FD1 is held.

In the case where the wiring 25 (TX) is set to "GND," the wiring 26 (PR) is set to "GND," and the wiring 27 (W) is set to a potential lower than −VPR from the time T4 to the time T5, the potentials of the node FD1 and the node FD2 are held.

In the case where the wiring 25 (TX) is set to a potential higher than VPR+$V_{th}$, the wiring 26 (PR) is set to a potential higher than VPR+$V_{th}$, and the wiring 27 (W) is set to a potential lower than −VPR from the time T5 to time T6, the potential of the node FD1 is increased by V1 and the potential of the node FD2 is increased by V2 due to capacitive coupling. Here, V1 and V2 are potentials that reflect illuminance of an initial frame.

In the case where the wiring 25 (TX) is set to a potential higher than VPR+$V_{th}$, the wiring 26 (PR) is set to "GND," and the wiring 27 (W) is set to a potential lower than −VPR from the time T6 to time T7, the potentials of the node FD1 and the node FD2 are decreased in response to light with which the photodiode 60 is irradiated. When the amount of decrease in the potential of the node FD1 at the time T6 is denoted by V1', the potential of the node FD1 is VPR−V1'. In addition, the potential of the node FD2 is decreased by V2' due to capacitive coupling and becomes GND+V2−V2'.

In the case where the wiring 25 (TX) is set to "GND," the wiring 26 (PR) is set to "GND," and the wiring 27 (W) is set to a potential lower than −VPR from the time T7 to time T8, the potentials of the node FD1 and the node FD2 are held.

In the case where the wiring 30 (SE) is set to a potential higher than VPI+$V_{th}$ from the time T8 to time T9, a signal based on imaging data is output to the output terminal (OUT) in accordance with the potential of the node FD2. In the above case, the potential of the node FD2 at the time of signal output is GND+V2−V2'; thus, the potential is V2−V2' when GND is 0 V, for example. Here, V2 is a potential that reflects the illuminance of the initial frame, and V2' is a potential that reflects illuminance of a later frame (current frame). In other words, the second operation in which a difference between the initial frame and the current frame is output can be performed.

This embodiment can be combined with any of the structures described in the other embodiments as appropriate.

Embodiment 3

In this embodiment, an example of a method for driving a pixel circuit is described.

As described in Embodiment 2, the operation of the pixel circuit is repetition of the reset operation, the accumulation operation, and the selection operation. As imaging modes in which the whole pixel matrix is controlled, a global shutter system and a rolling shutter system are known.

Figure 20A:
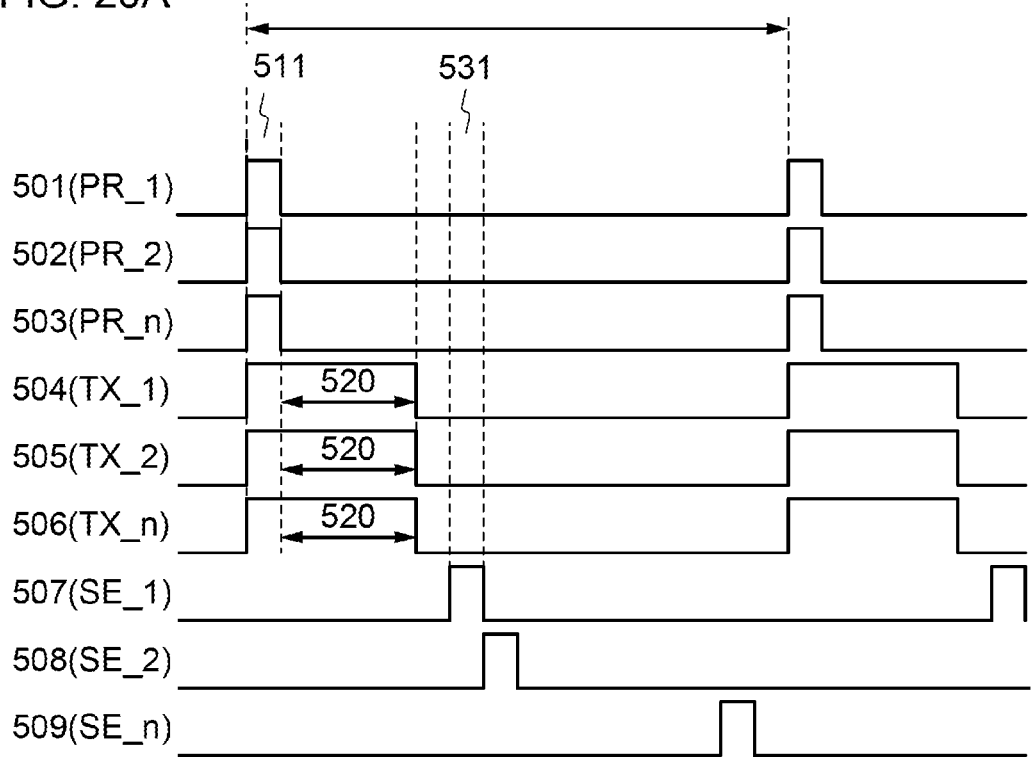
FIGS. 20A and 20B are timing charts illustrating operations of a global shutter system and a rolling shutter system, respectively.

FIG. 20A is a timing chart of a global shutter system. The timing chart illustrates operation of an imaging device in which a plurality of pixel circuits in FIG. 1 are arranged in a matrix. Specifically, the timing chart illustrates operation of the pixel circuits from a first row to an n-th row (n is a natural number of 3 or more). The operation is described giving the first operation described in Embodiment 2 as an example.

In FIG. 20A, a signal 501, a signal 502, and a signal 503 are input to the wirings 26 (PR) connected to the pixel circuits in the first row, the second row, and the n-th row, respectively. A signal 504, a signal 506, and a signal 508 are input to the wirings 25 (TX) connected to the pixel circuits in the first row, the second row, and the n-th row, respectively. A signal 505, a signal 507, and a signal 509 are input to the wirings 29 (SE) connected to the pixel circuits in the first row, the second row, and the n-th row, respectively.

A period 510 is a period required for one imaging. A period 511 and a period 520 are periods in which reset operation and accumulation operation are performed at the same time in the pixel circuits in each row, respectively. Note that the selection operation is sequentially performed in the pixel circuits in each row. For example, in a period 531, the selection operation is performed in the pixel circuits in the first row. As described above, in the global shutter system, the reset operation and the accumulation operation are performed in all the pixel circuits substantially at the same time, and then read operation is sequentially performed in each row.

That is, in the global shutter system, since the accumulation operation is performed in all the pixel circuits substantially at the same time, imaging is simultaneously performed in the pixel circuits in all the rows. Therefore, an image with little distortion can be obtained even in the case of a moving object.

Figure 20B:
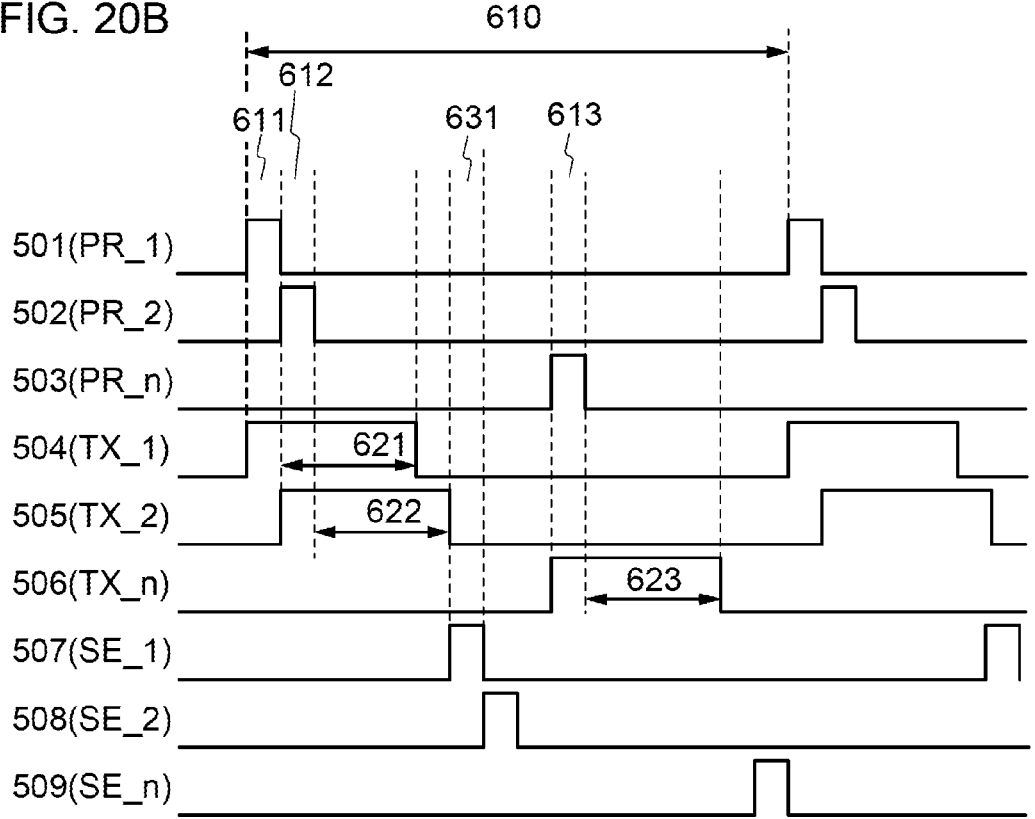

FIG. 20B is a timing chart of the case using a rolling shutter system. The description of FIG. 20A can be referred to for the signals 501 to 509. A period 610 is a period required for one imaging. A period 611 is a period in which the pixels in the first row perform reset operation. A period 612 is a period in which the pixels in the second row perform reset operation. A period 613 is a period in which the pixels in the n-th row perform reset operation. A period 621 is a period in which the pixels in the first row perform accumulation operation. A period 622 is a period in which the pixels in the second row perform accumulation operation. A period 623 is a period in which the pixels in the n-th row perform accumulation operation. A period 631 is a period in which the pixels in the first row perform selection operation. As described above, in the rolling shutter system, the accumulation operation is not performed at the same time in all the pixels but is sequentially performed in all the rows; thus, imaging is not simultaneously performed in the pixels in all the rows. Therefore, the timing of imaging in the first row is different from that of imaging in the last row, and thus an image with large distortion is obtained in the case of a moving object.

To achieve the global shutter system, the potential of a charge accumulation portion (the node FD2) needs to be held for a long time until sequential reading of signals from the pixels is terminated. When a transistor including a channel formation region formed using an oxide semiconductor and having extremely low off-state current is used as the transistor 55 or the like, the potential of the charge accumulation portion (the node FD2) can be held for a long time. In the case where a transistor including a channel formation region formed using silicon or the like is used as the transistor 55 or the like, the potential of the charge accumulation portion (the node FD2) cannot be held for a long time because of high off-state current, which makes it difficult to use the global shutter system.

As described above, the use of the transistor in which a channel formation region is formed using an oxide semiconductor for the pixel circuits makes it easy to achieve the global shutter system. Note that one embodiment of the present invention is not limited thereto. Depending on circumstances or conditions, a system other than the global shutter system may be used. For example, depending on circumstances or conditions, the rolling shutter system may be used.

This embodiment can be combined with any of the structures described in the other embodiments as appropriate.

Embodiment 4

In this embodiment, a transistor including an oxide semiconductor that can be used in one embodiment of the present invention is described with reference to drawings. In the drawings in this embodiment, some components are enlarged, reduced in size, or omitted for easy understanding.

Figure 21A:
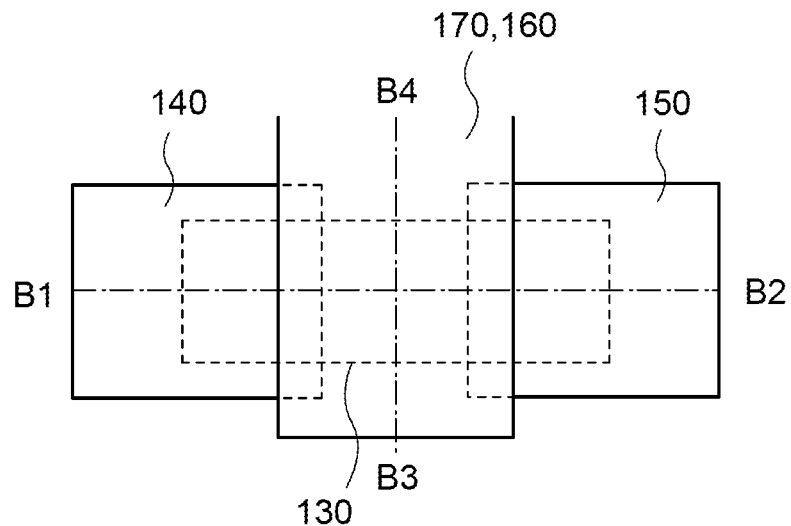
FIGS. 21A and 21B are a top view and a cross-sectional view of a transistor.
Figure 21B:
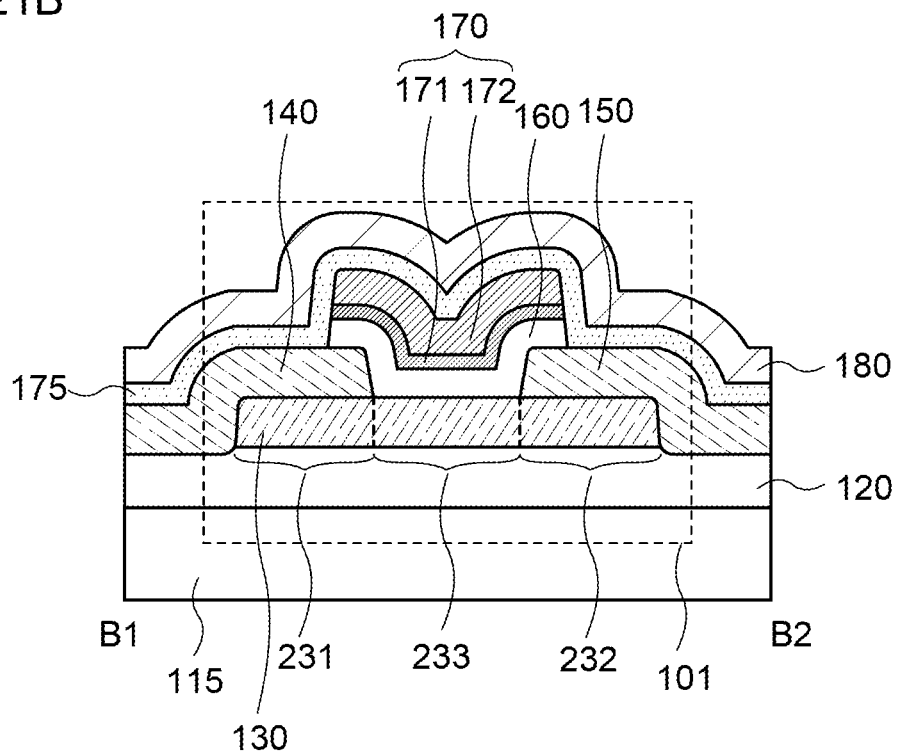
Figure 27A:
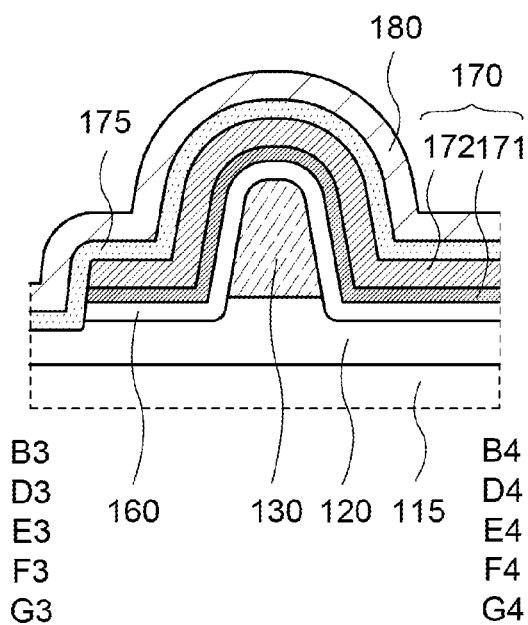
FIGS. 27A to 27D are cross-sectional views of transistors in the channel width direction.

FIGS. 21A and 21B are a top view and a cross-sectional view illustrating a transistor 101 in one embodiment of the present invention. A cross section in the direction of dashed-dotted line B1-B2 in FIG. 21A is illustrated in FIG. 21B. A cross section in the direction of dashed-dotted line B3-B4 in FIG. 21A is illustrated in FIG. 27A. In some cases, the direction of dashed-dotted line B1-B2 is referred to as a channel length direction, and the direction of dashed-dotted line B3-B4 is referred to as a channel width direction.

The transistor 101 includes an insulating layer 120 in contact with a substrate 115; an oxide semiconductor layer 130 in contact with the insulating layer 120; conductive layers 140 and 150 electrically connected to the oxide semiconductor layer 130; an insulating layer 160 in contact with the oxide semiconductor layer 130 and the conductive layers 140 and 150; a conductive layer 170 in contact with the insulating layer 160; an insulating layer 175 in contact with the conductive layers 140 and 150, the insulating layer 160, and the conductive layer 170; and an insulating layer 180 in contact with the insulating layer 175. The insulating layer 180 may function as a planarization film as necessary.

Here, the conductive layer 140, the conductive layer 150, the insulating layer 160, and the conductive layer 170 can function as a source electrode layer, a drain electrode layer, a gate insulating film, and a gate electrode layer, respectively.

A region 231, a region 232, and a region 233 in FIG. 21B can function as a source region, a drain region, and a channel formation region, respectively. The region 231 and the region 232 are in contact with the conductive layer 140 and the conductive layer 150, respectively. When a conductive material that is easily bonded to oxygen is used for the conductive layers 140 and 150, for example, the resistance of the regions 231 and 232 can be reduced.

Specifically, since the oxide semiconductor layer 130 is in contact with the conductive layers 140 and 150, an oxygen vacancy is generated in the oxide semiconductor layer 130, and interaction between the oxygen vacancy and hydrogen that remains in the oxide semiconductor layer 130 or diffuses into the oxide semiconductor layer 130 from the outside changes the regions 231 and 232 to n-type regions with low resistance.

Note that functions of a "source" and a "drain" of a transistor are sometimes interchanged with each other when a transistor of an opposite conductivity type is used or when the direction of current flow is changed in circuit operation, for example. Therefore, the terms "source" and "drain" can be interchanged with each other in this specification. In addition, the term "electrode layer" can be changed into the term "wiring."

The conductive layer 170 includes two layers, conductive layers 171 and 172, but also may be a single layer or a stack of three or more layers. The same applies to other transistors described in this embodiment.

Each of the conductive layers 140 and 150 is a single layer, but also may be a stack of two or more layers. The same applies to other transistors described in this embodiment.

Figure 22A:
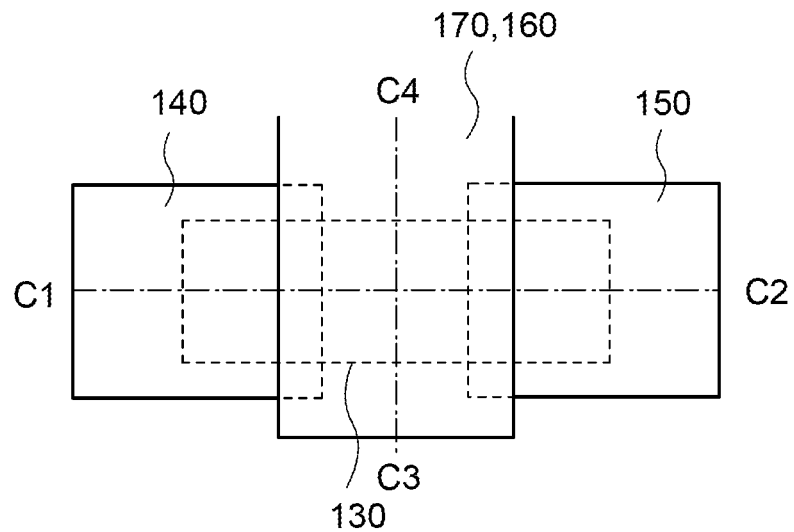
FIGS. 22A and 22B are a top view and a cross-sectional view of a transistor.
Figure 22B:
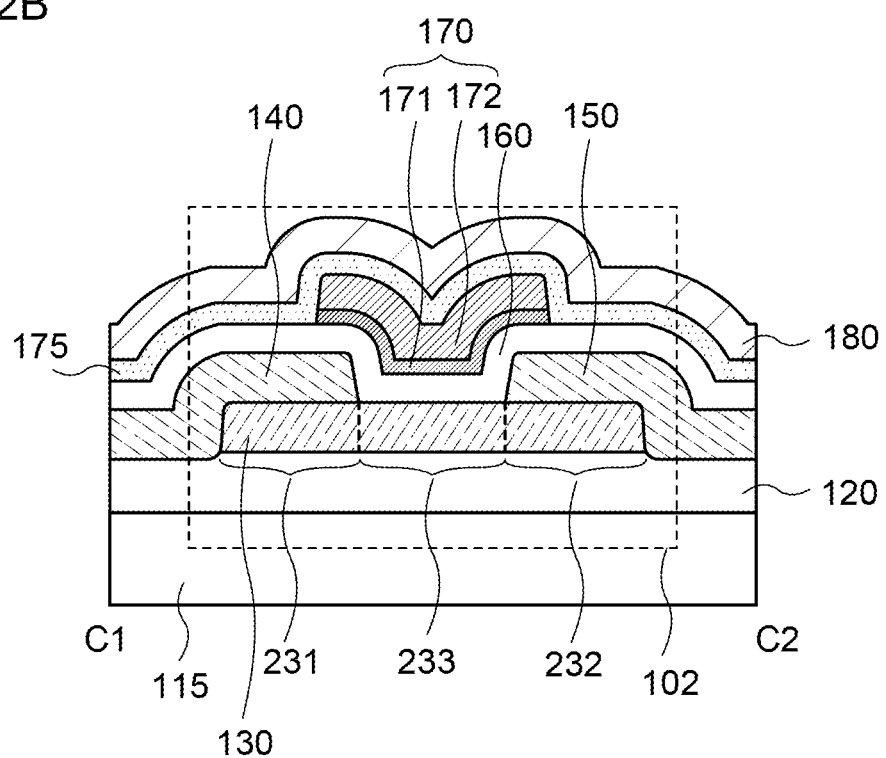
Figure 27B:
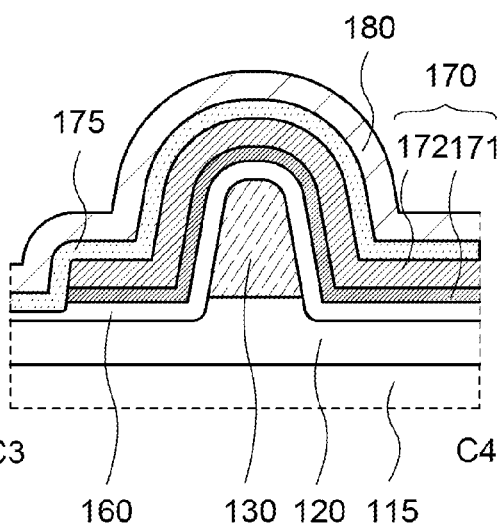

The transistor in one embodiment of the present invention may have a structure illustrated in FIGS. 22A and 22B. FIG. 22A is a top view of a transistor 102. A cross section in the direction of dashed-dotted line C1-C2 in FIG. 22A is illustrated in FIG. 22B. A cross section in the direction of dashed-dotted line C3-C4 in FIG. 22A is illustrated in FIG. 27B. In some cases, the direction of dashed-dotted line C1-C2 is referred to as a channel length direction, and the direction of dashed-dotted line C3-C4 is referred to as a channel width direction.

The transistor 102 has the same structure as the transistor 101 except that an end portion of the insulating layer 160 functioning as a gate insulating film is not aligned with an end portion of the conductive layer 170 functioning as a gate electrode layer. In the transistor 102, wide areas of the conductive layers 140 and 150 are covered with the insulating layer 160 and accordingly the resistance between the conductive layer 170 and the conductive layers 140 and 150 is high; therefore, the transistor 102 has low gate leakage current.

The transistors 101 and 102 each have a top-gate structure including a region where the conductive layer 170 overlaps with the conductive layers 140 and 150. To reduce parasitic capacitance, the width of the region in the channel length direction is preferably greater than or equal to 3 nm and less than 300 nm. Since an offset region is not formed in the oxide semiconductor layer 130 in this structure, a transistor with high on-state current can be easily formed.

Figure 23A:
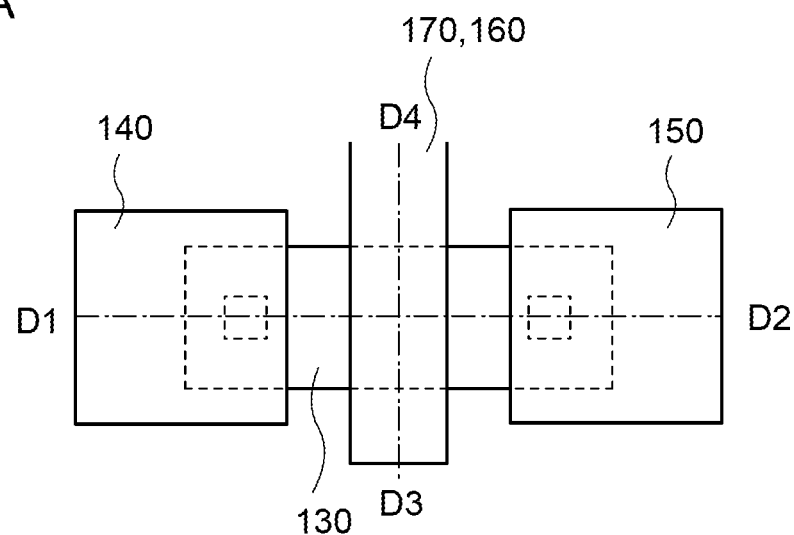
FIGS. 23A and 23B are a top view and a cross-sectional view of a transistor.
Figure 23B:
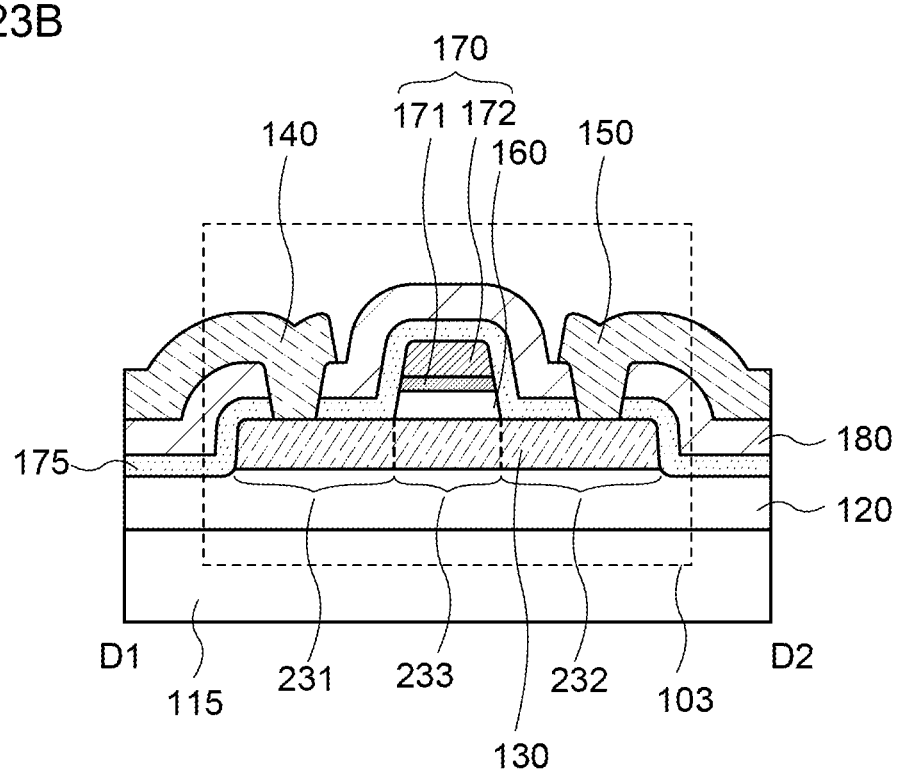

The transistor in one embodiment of the present invention may have a structure illustrated in FIGS. 23A and 23B. FIG. 23A is a top view of a transistor 103. A cross section in the direction of dashed-dotted line D1-D2 in FIG. 23A is illustrated in FIG. 23B. A cross section in the direction of dashed-dotted line D3-D4 in FIG. 23A is illustrated in FIG. 27A. In some cases, the direction of dashed-dotted line D1-D2 is referred to as a channel length direction, and the direction of dashed-dotted line D3-D4 is referred to as a channel width direction.

The transistor 103 includes the insulating layer 120 in contact with the substrate 115; the oxide semiconductor layer 130 in contact with the insulating layer 120; the insulating layer 160 in contact with the oxide semiconductor layer 130; the conductive layer 170 in contact with the insulating layer 160; the insulating layer 175 covering the oxide semiconductor layer 130, the insulating layer 160, and the conductive layer 170; the insulating layer 180 in contact with the insulating layer 175; and the conductive layers 140 and 150 electrically connected to the oxide semiconductor layer 130 through openings provided in the insulating layers 175 and 180. The transistor 103 may further include, for example, an insulating layer (planarization film) in contact with the insulating layer 180 and the conductive layers 140 and 150 as necessary.

Here, the conductive layer 140, the conductive layer 150, the insulating layer 160, and the conductive layer 170 can function as a source electrode layer, a drain electrode layer, a gate insulating film, and a gate electrode layer, respectively.

The region 231, the region 232, and the region 233 in FIG. 23B can function as a source region, a drain region, and a channel formation region, respectively. The regions 231 and 232 are in contact with the insulating layer 175. When an insulating material containing hydrogen is used for the insulating layer 175, for example, the resistance of the regions 231 and 232 can be reduced.

Specifically, interaction between an oxygen vacancy generated in the regions 231 and 232 by the steps up to formation of the insulating layer 175 and hydrogen that diffuses into the regions 231 and 232 from the insulating layer 175 changes the regions 231 and 232 to n-type regions with low resistance. As the insulating material containing hydrogen, for example, silicon nitride, aluminum nitride, or the like can be used.

Figure 24A:
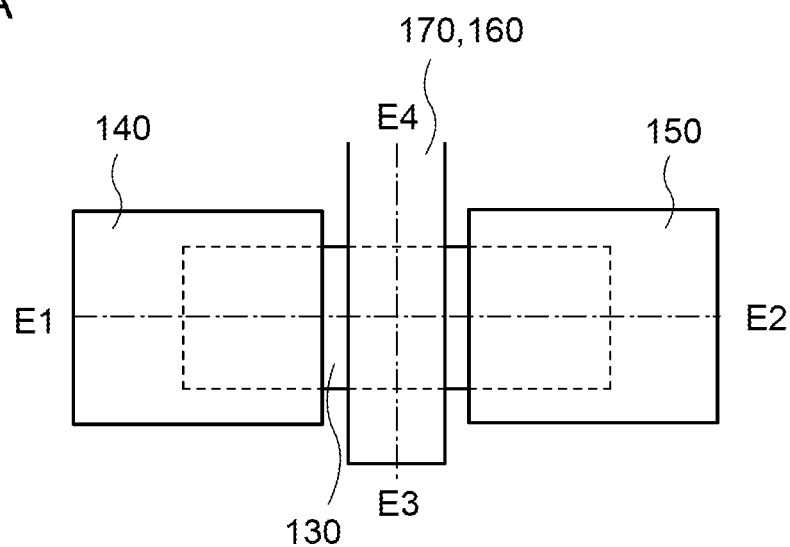
FIGS. 24A and 24B are a top view and a cross-sectional view of a transistor.
Figure 24B:
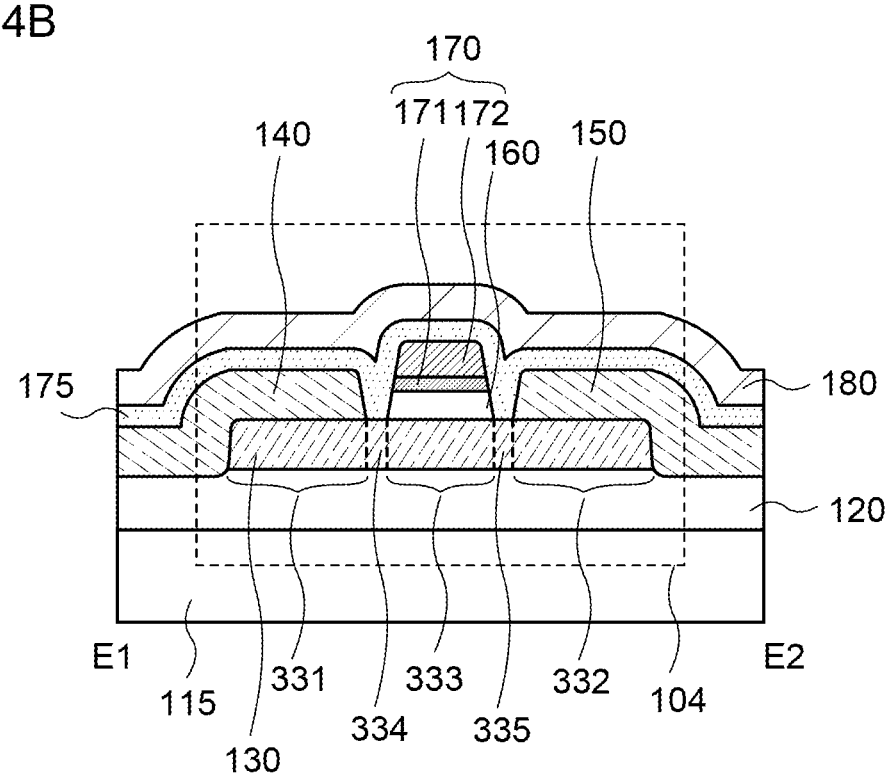

The transistor in one embodiment of the present invention may have a structure illustrated in FIGS. 24A and 24B. FIG. 24A is a top view of a transistor 104. A cross section in the direction of dashed-dotted line E1-E2 in FIG. 24A is illustrated in FIG. 24B. A cross section in the direction of dashed-dotted line E3-E4 in FIG. 24A is illustrated in FIG. 27A. In some cases, the direction of dashed-dotted line E1-E2 is referred to as a channel length direction, and the direction of dashed-dotted line E3-E4 is referred to as a channel width direction.

The transistor 104 has the same structure as the transistor 103 except that the conductive layers 140 and 150 in contact with the oxide semiconductor layer 130 cover end portions of the oxide semiconductor layer 130.

In FIG. 24B, regions 331 and 334 can function as a source region, regions 332 and 335 can function as a drain region, and a region 333 can function as a channel formation region.

The resistance of the regions 331 and 332 can be reduced in a manner similar to that of the regions 231 and 232 in the transistor 101.

The resistance of the regions 334 and 335 can be reduced in a manner similar to that of the regions 231 and 232 in the transistor 103. In the case where the length of the regions 334 and 335 in the channel length direction is less than or equal to 100 nm, preferably less than or equal to 50 nm, a gate electric field prevents a significant decrease in on-state current. Therefore, a reduction in resistance of the regions 334 and 335 is not performed in some cases.

The transistors 103 and 104 each have a self-aligned structure that does not include a region where the conductive layer 170 overlaps with the conductive layers 140 and 150. A transistor with a self-aligned structure, which has extremely low parasitic capacitance between a gate electrode layer and source and drain electrode layers, is suitable for applications that require high-speed operation.

Figure 25A:
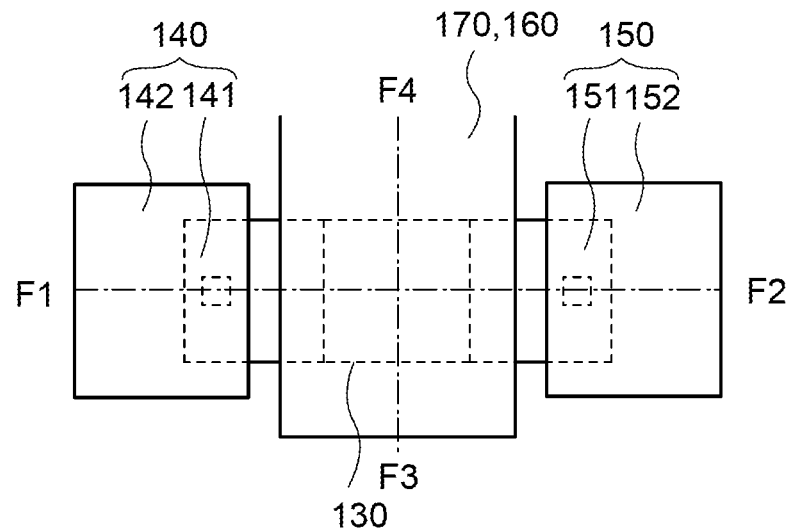
FIGS. 25A and 25B are a top view and a cross-sectional view of a transistor.
Figure 25B:
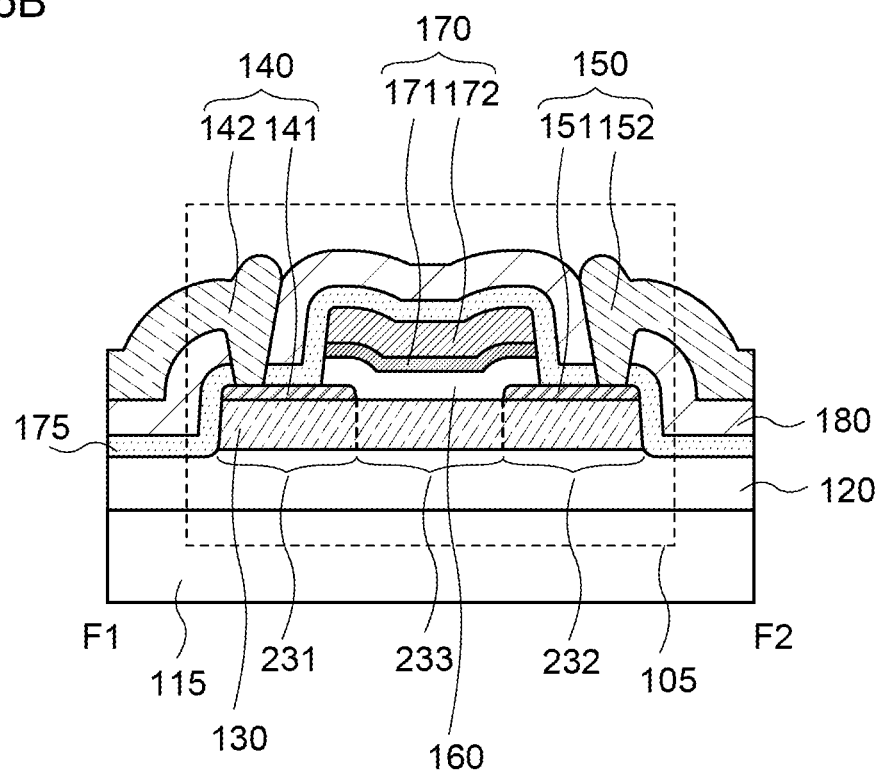

The transistor in one embodiment of the present invention may have a structure illustrated in FIGS. 25A and 25B. FIG. 25A is a top view of a transistor 105. A cross section in the direction of dashed-dotted line F1-F2 in FIG. 25A is illustrated in FIG. 25B. A cross section in the direction of dashed-dotted line F3-F4 in FIG. 25A is illustrated in FIG. 27A. In some cases, the direction of dashed-dotted line F1-F2 is referred to as a channel length direction, and the direction of dashed-dotted line F3-F4 is referred to as a channel width direction.

The transistor 105 includes the insulating layer 120 in contact with the substrate 115; the oxide semiconductor layer 130 in contact with the insulating layer 120; conductive layers 141 and 151 electrically connected to the oxide semiconductor layer 130; the insulating layer 160 in contact with the oxide semiconductor layer 130 and the conductive layers 141 and 151; the conductive layer 170 in contact with the insulating layer 160; the insulating layer 175 in contact with the oxide semiconductor layer 130, the conductive layers 141 and 151, the insulating layer 160, and the conductive layer 170; the insulating layer 180 in contact with the insulating layer 175; and conductive layers 142 and 152 electrically connected to the conductive layers 141 and 151, respectively, through openings provided in the insulating layers 175 and 180. The transistor 105 may further include, for example, an insulating layer in contact with the insulating layer 180 and the conductive layers 142 and 152 as necessary.

Here, the conductive layers 141 and 151 are in contact with the top surface of the oxide semiconductor layer 130 and are not in contact with side surfaces of the oxide semiconductor layer 130.

The transistor 105 has the same structure as the transistor 101 except that the conductive layers 141 and 151 are provided, that openings are provided in the insulating layers 175 and 180, and that the conductive layers 142 and 152 electrically connected to the conductive layers 141 and 151, respectively, through the openings are provided. The conductive layer 140 (the conductive layers 141 and 142) can function as a source electrode layer, and the conductive layer 150 (the conductive layers 151 and 152) can function as a drain electrode layer.

Figure 26A:
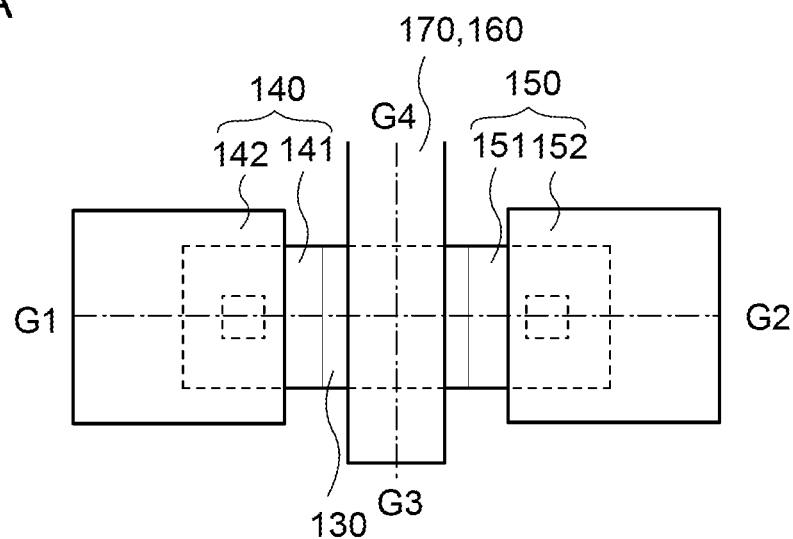
FIGS. 26A and 26B are a top view and a cross-sectional view of a transistor.
Figure 26B:
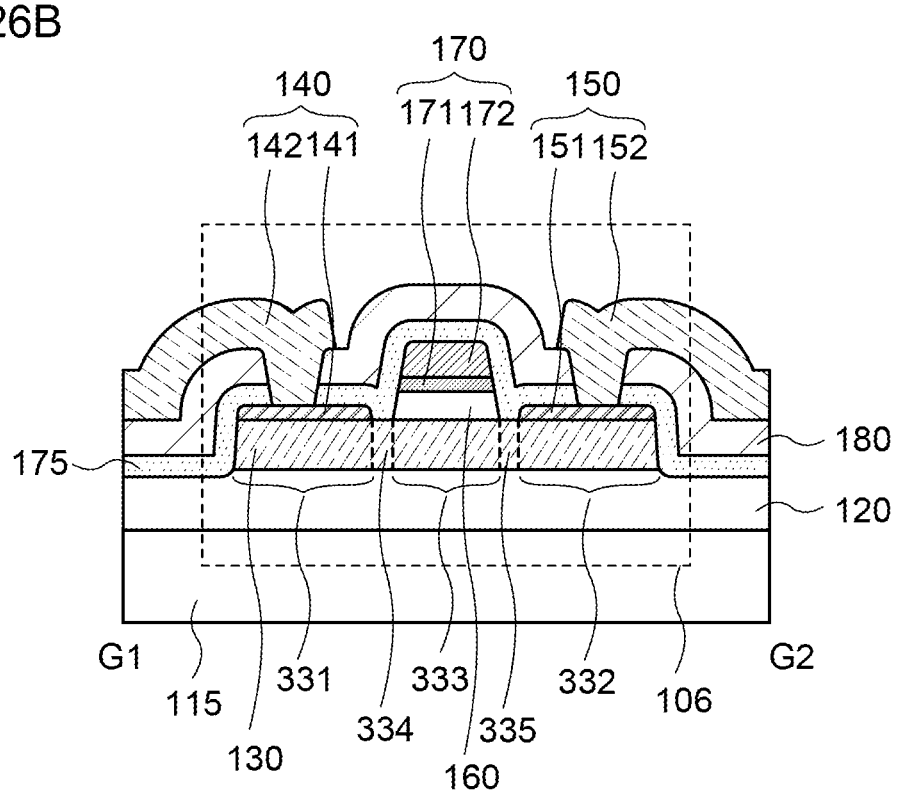

The transistor in one embodiment of the present invention may have a structure illustrated in FIGS. 26A and 26B. FIG. 26A is a top view of a transistor 106. A cross section in the direction of dashed-dotted line G1-G2 in FIG. 26A is illustrated in FIG. 26B. A cross section in the direction of dashed-dotted line G3-G4 in FIG. 26A is illustrated in FIG. 27A. In some cases, the direction of dashed-dotted line G1-G2 is referred to as a channel length direction, and the direction of dashed-dotted line G3-G4 is referred to as a channel width direction.

The transistor 106 includes the insulating layer 120 in contact with the substrate 115; the oxide semiconductor layer 130 in contact with the insulating layer 120; the conductive layers 141 and 151 electrically connected to the oxide semiconductor layer 130; the insulating layer 160 in contact with the oxide semiconductor layer 130; the conductive layer 170 in contact with the insulating layer 160; the insulating layer 175 in contact with the insulating layer 120, the oxide semiconductor layer 130, the conductive layers 141 and 151, the insulating layer 160, and the conductive layer 170; the insulating layer 180 in contact with the insulating layer 175; and the conductive layers 142 and 152 electrically connected to the conductive layers 141 and 151, respectively, through openings provided in the insulating layers 175 and 180. The transistor 106 may further include, for example, an insulating layer (planarization film) in contact with the insulating layer 180 and the conductive layers 142 and 152 as necessary.

Here, the conductive layers 141 and 151 are in contact with the top surface of the oxide semiconductor layer 130 and are not in contact with side surfaces of the oxide semiconductor layer 130.

The transistor 106 has the same structure as the transistor 103 except that the conductive layers 141 and 151 are provided. The conductive layer 140 (the conductive layers 141 and 142) can function as a source electrode layer, and the conductive layer 150 (the conductive layers 151 and 152) can function as a drain electrode layer.

In the structures of the transistors 105 and 106, the conductive layers 140 and 150 are not in contact with the insulating layer 120. These structures make the insulating layer 120 less likely to be deprived of oxygen by the conductive layers 140 and 150 and facilitate oxygen supply from the insulating layer 120 to the oxide semiconductor layer 130.

An impurity for forming an oxygen vacancy to increase conductivity may be added to the regions 231 and 232 in the transistor 103 and the regions 334 and 335 in the transistors 104 and 106. As an impurity for forming an oxygen vacancy in an oxide semiconductor layer, for example, one or more of the following can be used: phosphorus, arsenic, antimony, boron, aluminum, silicon, nitrogen, helium, neon, argon, krypton, xenon, indium, fluorine, chlorine, titanium, zinc, and carbon. As a method for adding the impurity, plasma treatment, ion implantation, ion doping, plasma immersion ion implantation, or the like can be used.

When the above element is added as an impurity element to the oxide semiconductor layer, a bond between a metal element and oxygen in the oxide semiconductor layer is cut, so that an oxygen vacancy is formed. Interaction between an oxygen vacancy in the oxide semiconductor layer and hydrogen that remains in the oxide semiconductor layer or is added to the oxide semiconductor layer later can increase the conductivity of the oxide semiconductor layer.

When hydrogen is added to an oxide semiconductor in which an oxygen vacancy is formed by addition of an impurity element, hydrogen enters an oxygen vacant site and forms a donor level in the vicinity of the conduction band. Consequently, an oxide conductor can be formed. Here, an oxide conductor refers to an oxide semiconductor having become a conductor. Note that the oxide conductor has a light-transmitting property in a manner similar to the oxide semiconductor.

The oxide conductor is a degenerated semiconductor and it is suggested that the conduction band edge equals or substantially equals the Fermi level. For that reason, an ohmic contact is made between an oxide conductor layer and conductive layers functioning as a source electrode layer and a drain electrode layer; thus, contact resistance between the oxide conductor layer and the conductive layers functioning as a source electrode layer and a drain electrode layer can be reduced.

Figure 27C:
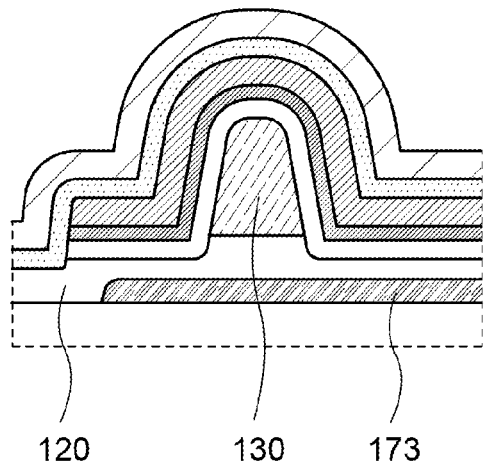
Figure 27D:
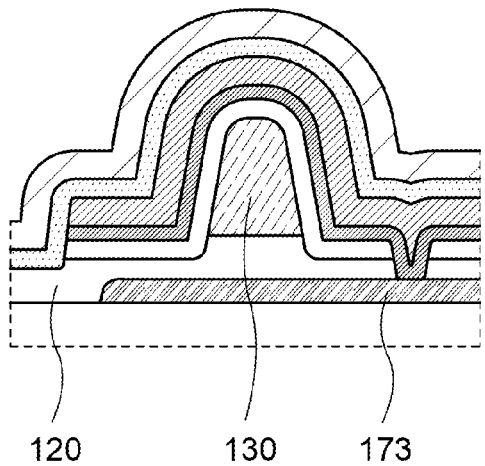
Figure 28A:
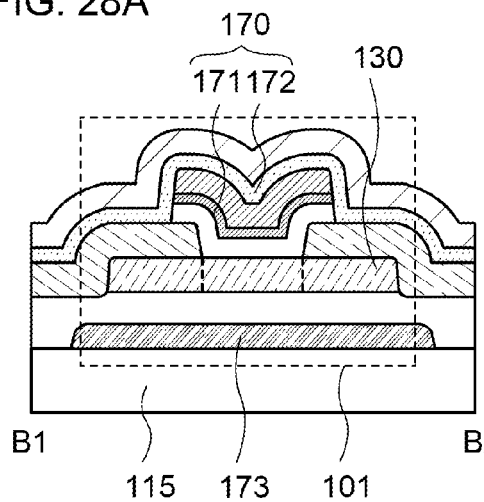
FIGS. 28A to 28F are each a cross-sectional view of a transistor in the channel length direction.
Figure 28B:
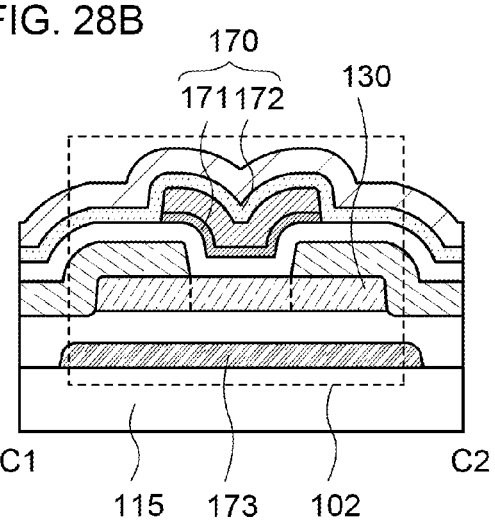
Figure 28C:
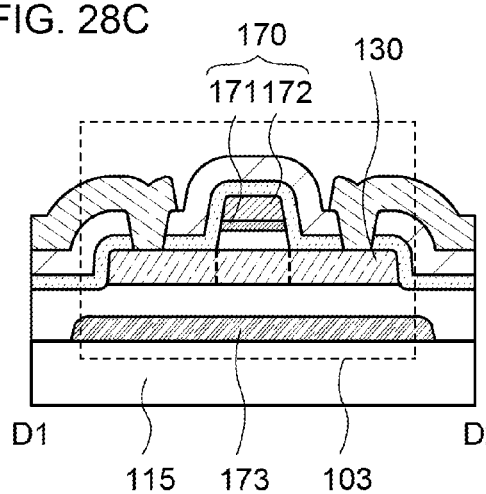
Figure 28D:
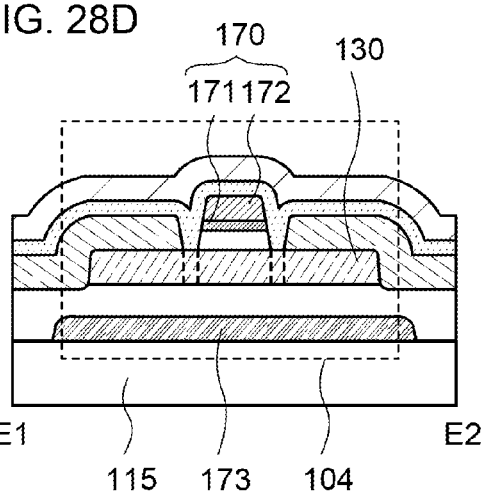
Figure 28E:
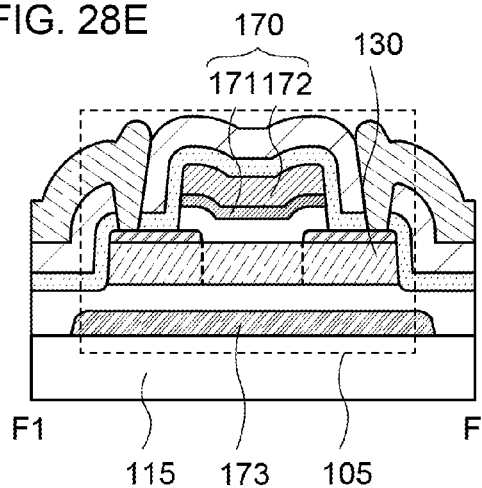
Figure 28F:
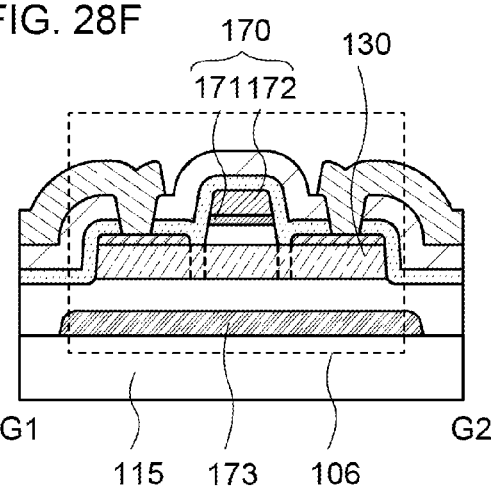

The transistor in one embodiment of the present invention may include a conductive layer 173 between the oxide semiconductor layer 130 and the substrate 115 as illustrated in cross-sectional views in the channel length direction in FIGS. 28A to 28F and cross-sectional views in the channel width direction in FIGS. 27C and 27D. When the conductive layer 173 is used as a second gate electrode layer (back gate), the on-state current can be increased or the threshold voltage can be controlled. In the cross-sectional views in FIGS. 28A to 28F, the width of the conductive layer 173 may be shorter than that of the oxide semiconductor layer 130. Moreover, the width of the conductive layer 173 may be shorter than that of the conductive layer 170.

In order to increase the on-state current, for example, the conductive layers 170 and 173 are made to have the same potential, and the transistor is driven as a double-gate transistor. Furthermore, in order to control the threshold voltage, a fixed potential that is different from the potential of the conductive layer 170 is applied to the conductive layer 173. To set the conductive layers 170 and 173 at the same potential, for example, as illustrated in FIG. 27D, the conductive layers 170 and 173 may be electrically connected to each other through a contact hole.

Although the transistors 101 to 106 in FIGS. 21A and 21B, FIGS. 22A and 22B, FIGS. 23A and 23B, FIGS. 24A and 24B, FIGS. 25A and 25B, and FIGS. 26A and 26B are examples in which the oxide semiconductor layer 130 is a single layer, the oxide semiconductor layer 130 may be a stacked layer. The oxide semiconductor layer 130 in the transistors 101 to 106 can be replaced with the oxide semiconductor layer 130 in FIGS. 29A to 29C or FIGS. 30A to 30C.

Figure 29A:
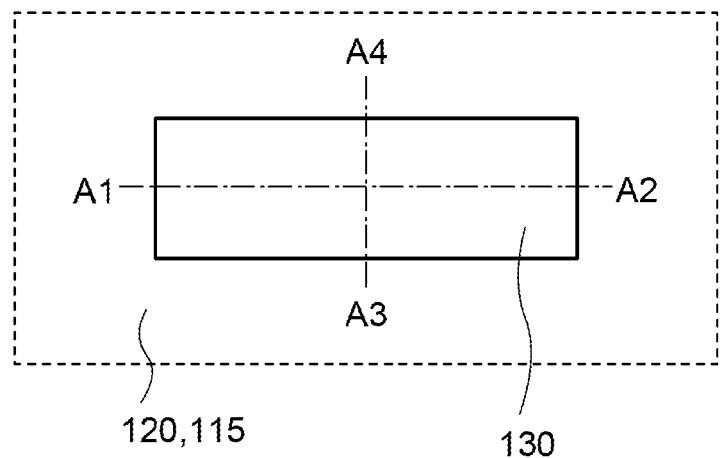
FIGS. 29A to 29C are a top view and cross-sectional views illustrating a semiconductor layer.
Figure 29B:
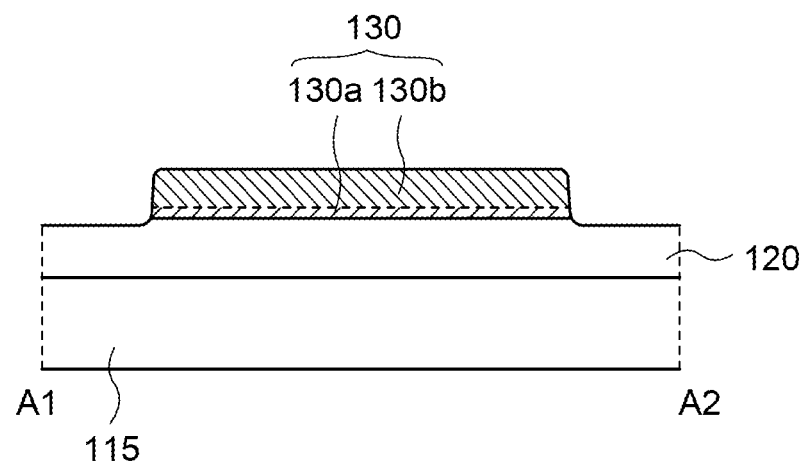
Figure 29C:
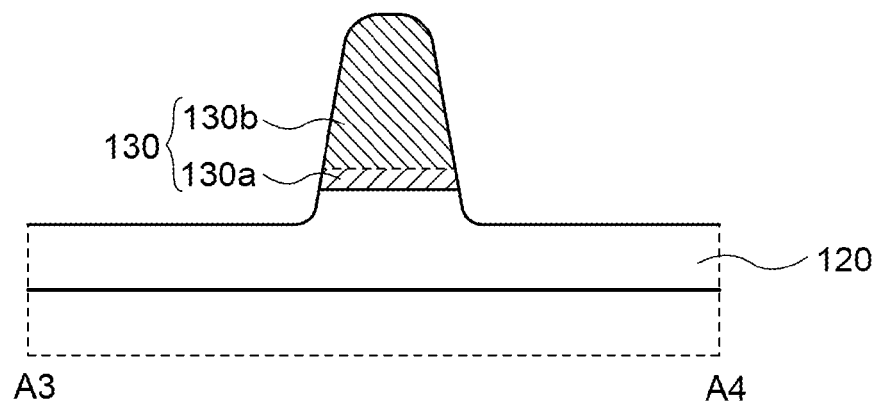

FIGS. 29A to 29C are a top view and cross-sectional views of the oxide semiconductor layer 130 with a two-layer structure. FIG. 29B illustrates a cross section in the direction of dashed-dotted line A1-A2 in FIG. 29A. FIG. 29C illustrates a cross section in the direction of dashed-dotted line A3-A4 in FIG. 29A.

Figure 30A:
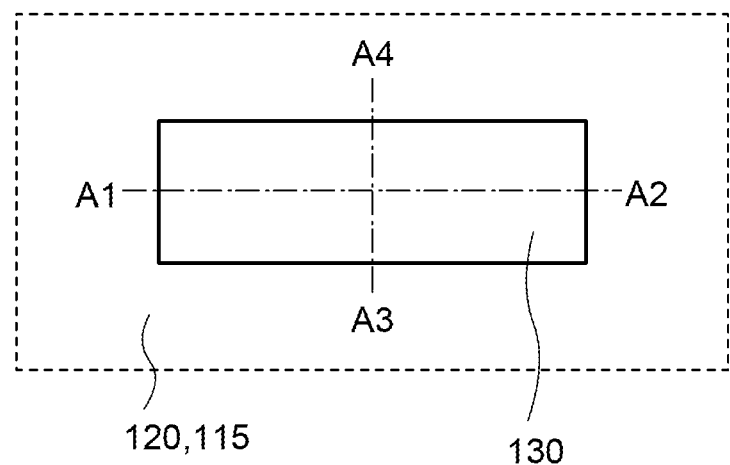
FIGS. 30A to 30C are a top view and cross-sectional views illustrating a semiconductor layer.
Figure 30B:
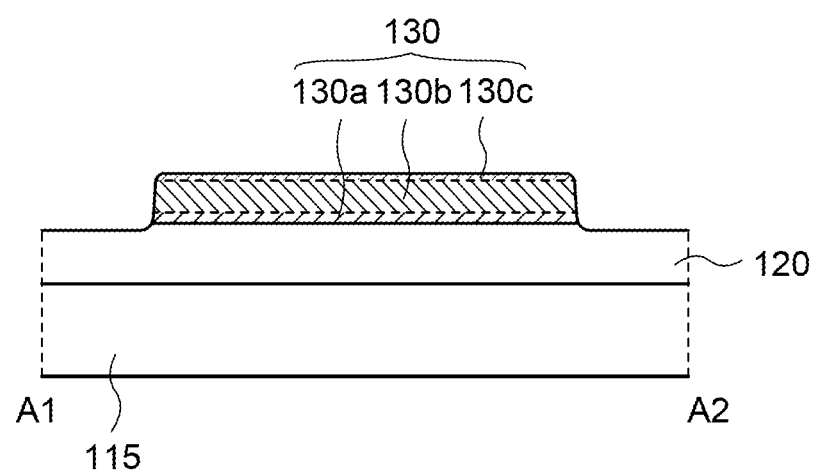
Figure 30C:
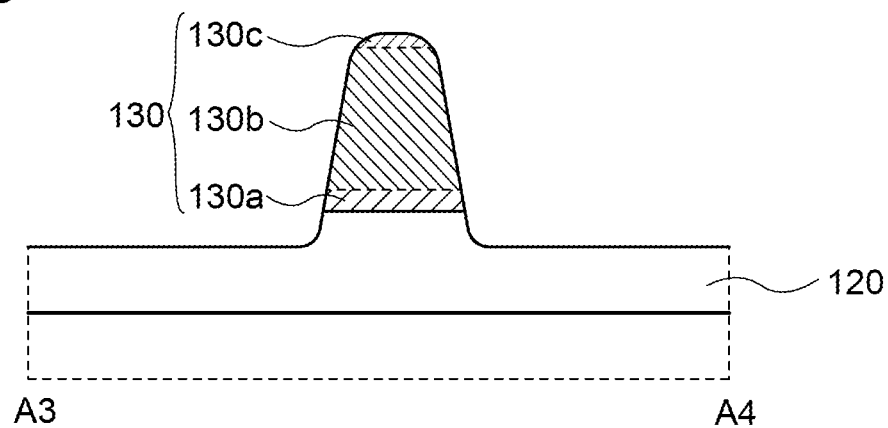

FIGS. 30A to 30C are a top view and cross-sectional views of the oxide semiconductor layer 130 with a three-layer structure. FIG. 30B illustrates a cross section in the direction of dashed-dotted line A1-A2 in FIG. 30A. FIG. 30C illustrates a cross section in the direction of dashed-dotted line A3-A4 in FIG. 30A.

Oxide semiconductor layers with different compositions, for example, can be used as an oxide semiconductor layer 130a, an oxide semiconductor layer 130b, and an oxide semiconductor layer 130c.

Figure 31A:
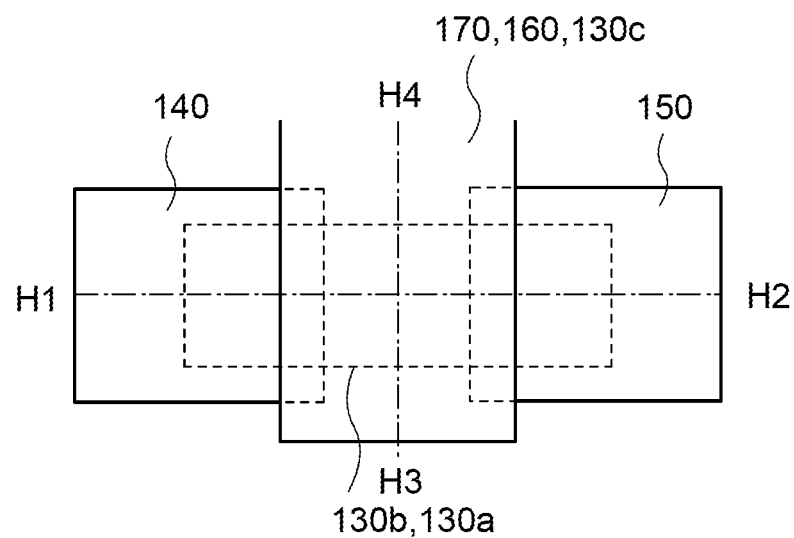
FIGS. 31A and 31B are a top view and a cross-sectional view illustrating a transistor.
Figure 31B:
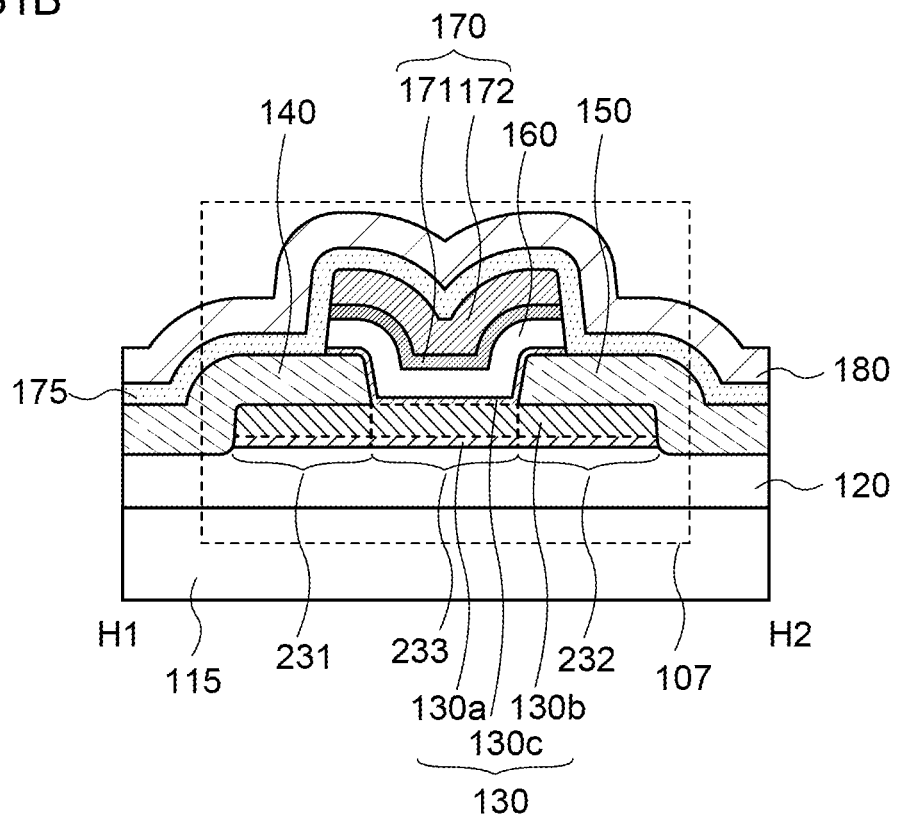
Figure 37A:
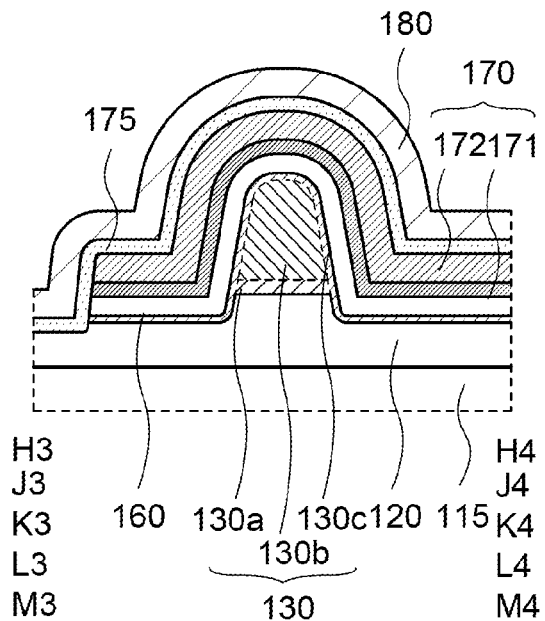
FIGS. 37A to 37D are cross-sectional views of transistors in the channel width direction.

The transistor in one embodiment of the present invention may have a structure illustrated in FIGS. 31A and 31B. FIG. 31A is a top view of a transistor 107. A cross section in the direction of dashed-dotted line H1-H2 in FIG. 31A is illustrated in FIG. 31B. A cross section in the direction of dashed-dotted line H3-H4 in FIG. 31A is illustrated in FIG. 37A. In some cases, the direction of dashed-dotted line H1-H2 is referred to as a channel length direction, and the direction of dashed-dotted line H3-H4 is referred to as a channel width direction.

The transistor 107 includes the insulating layer 120 in contact with the substrate 115; a stack of the oxide semiconductor layers 130a and 130b in contact with the insulating layer 120; the conductive layers 140 and 150 electrically connected to the stack; the oxide semiconductor layer 130c in contact with the stack and the conductive layers 140 and 150; the insulating layer 160 in contact with the oxide semiconductor layer 130c; the conductive layer 170 in contact with the insulating layer 160; the insulating layer 175 in contact with the conductive layers 140 and 150, the oxide semiconductor layer 130c, the insulating layer 160, and the conductive layer 170; and the insulating layer 180 in contact with the insulating layer 175. The insulating layer 180 may function as a planarization film as necessary.

The transistor 107 has the same structure as the transistor 101 except that the oxide semiconductor layer 130 includes two layers (the oxide semiconductor layers 130a and 130b) in the regions 231 and 232, that the oxide semiconductor layer 130 includes three layers (the oxide semiconductor layers 130a to 130c) in the region 233, and that part of the oxide semiconductor layer (the oxide semiconductor layer 130c) exists between the insulating layer 160 and the conductive layers 140 and 150.

Figure 32A:
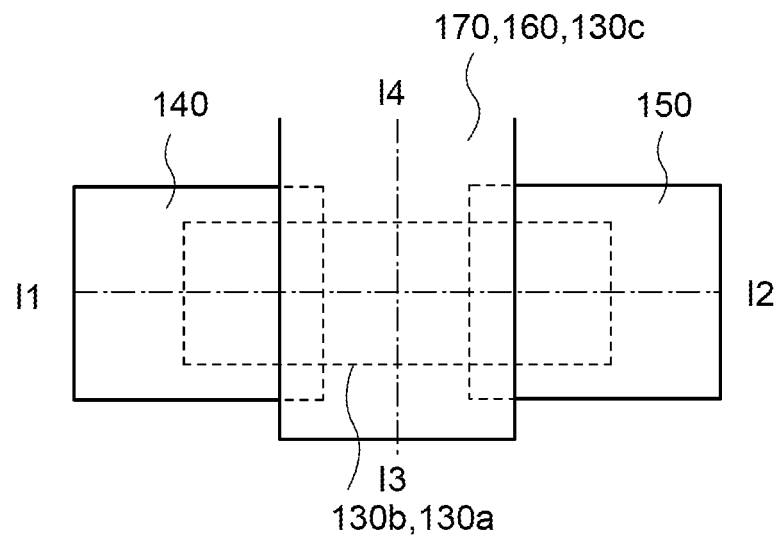
FIGS. 32A and 32B are a top view and a cross-sectional view illustrating a transistor.
Figure 32B:
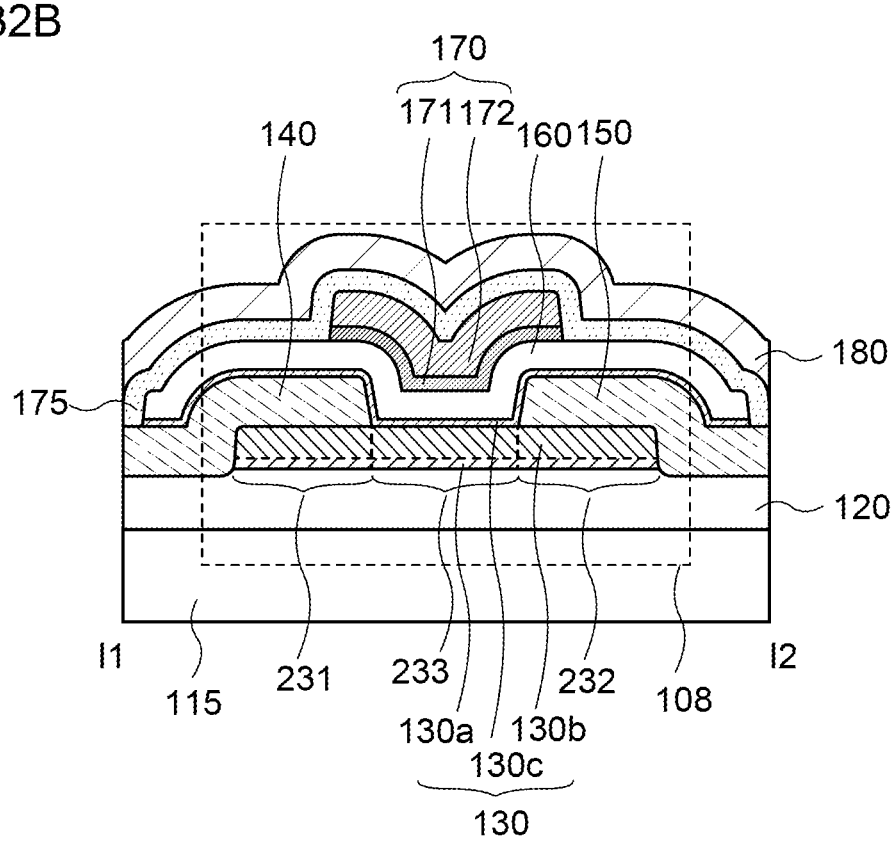
Figure 37B:
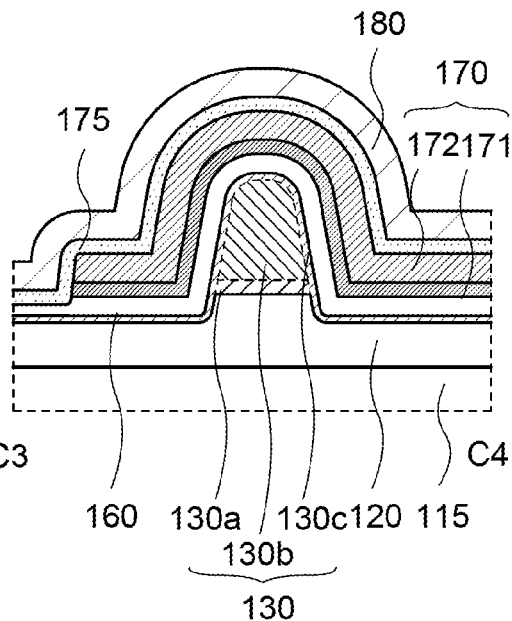

The transistor in one embodiment of the present invention may have a structure illustrated in FIGS. 32A and 32B. FIG. 32A is a top view of a transistor 108. A cross section in the direction of dashed-dotted line 11-12 in FIG. 32A is illustrated in FIG. 32B. A cross section in the direction of dashed-dotted line 13-14 in FIG. 32A is illustrated in FIG. 37B. In some cases, the direction of dashed-dotted line 11-12 is referred to as a channel length direction, and the direction of dashed-dotted line 13-14 is referred to as a channel width direction.

The transistor 108 differs from the transistor 107 in that end portions of the insulating layer 160 and the oxide semiconductor layer 130c are not aligned with the end portion of the conductive layer 170.

Figure 33A:
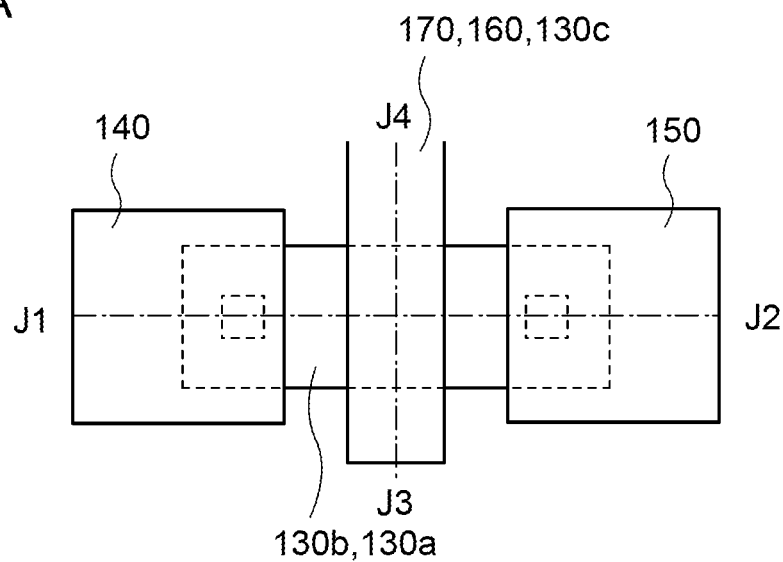
FIGS. 33A and 33B are a top view and a cross-sectional view illustrating a transistor.
Figure 33B:
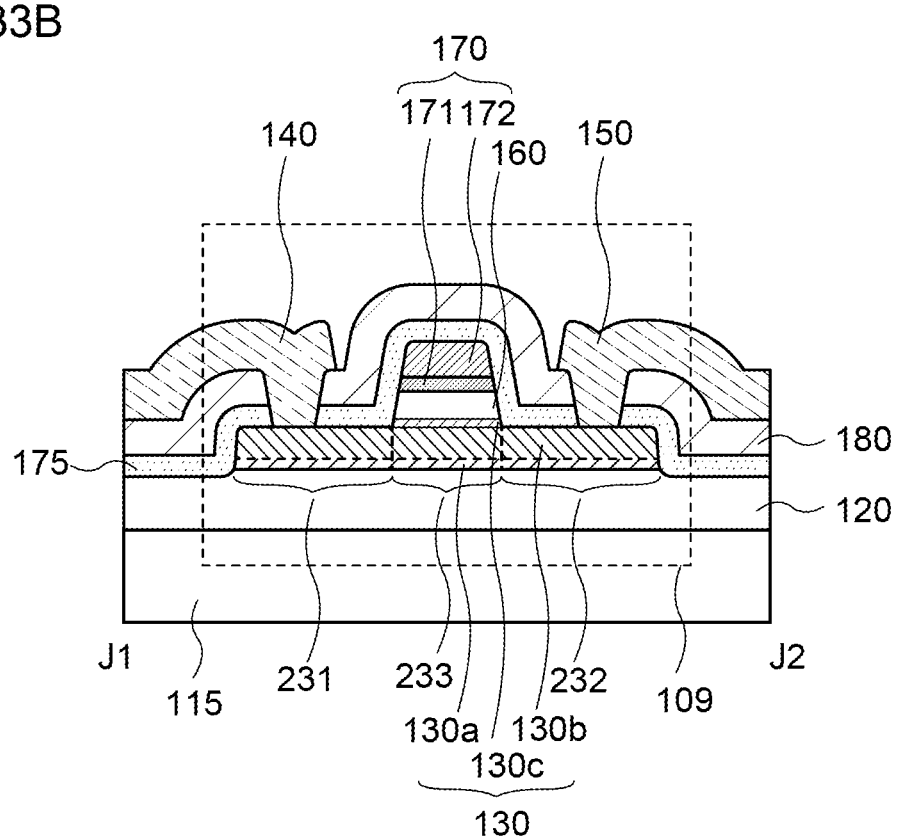

The transistor in one embodiment of the present invention may have a structure illustrated in FIGS. 33A and 33B. FIG. 33A is a top view of a transistor 109. A cross section in the direction of dashed-dotted line J1-J2 in FIG. 33A is illustrated in FIG. 33B. A cross section in the direction of dashed-dotted line J3-J4 in FIG. 33A is illustrated in FIG. 37A. In some cases, the direction of dashed-dotted line J1-J2 is referred to as a channel length direction, and the direction of dashed-dotted line J3-J4 is referred to as a channel width direction.

The transistor 109 includes the insulating layer 120 in contact with the substrate 115; a stack of the oxide semiconductor layers 130a and 130b in contact with the insulating layer 120; the oxide semiconductor layer 130c in contact with the stack; the insulating layer 160 in contact with the oxide semiconductor layer 130c; the conductive layer 170 in contact with the insulating layer 160; the insulating layer 175 covering the stack, the oxide semiconductor layer 130c, the insulating layer 160, and the conductive layer 170; the insulating layer 180 in contact with the insulating layer 175; and the conductive layers 140 and 150 electrically connected to the stack through openings provided in the insulating layers 175 and 180. The transistor 109 may further include, for example, an insulating layer (planarization film) in contact with the insulating layer 180 and the conductive layers 140 and 150 as necessary.

The transistor 109 has the same structure as the transistor 103 except that the oxide semiconductor layer 130 includes two layers (the oxide semiconductor layers 130a and 130b) in the regions 231 and 232 and that the oxide semiconductor layer 130 includes three layers (the oxide semiconductor layers 130a to 130c) in the region 233.

Figure 34A:
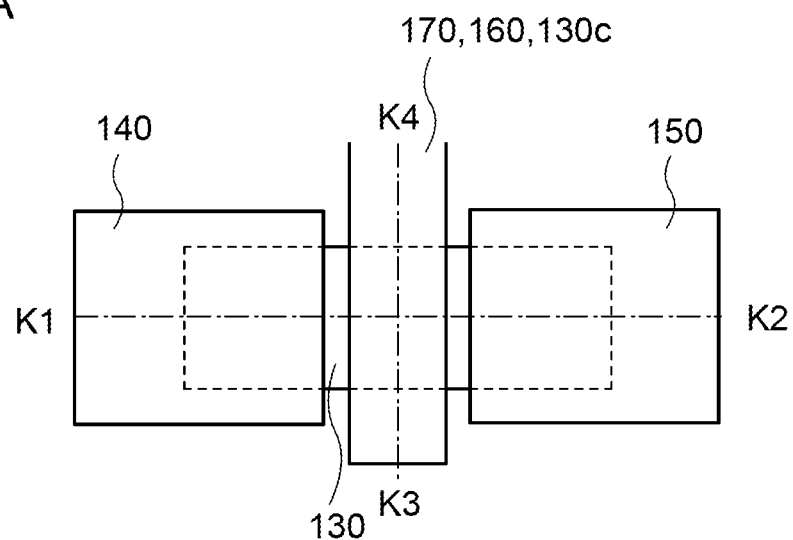
FIGS. 34A and 34B are a top view and a cross sectional view illustrating a transistor.
Figure 34B:
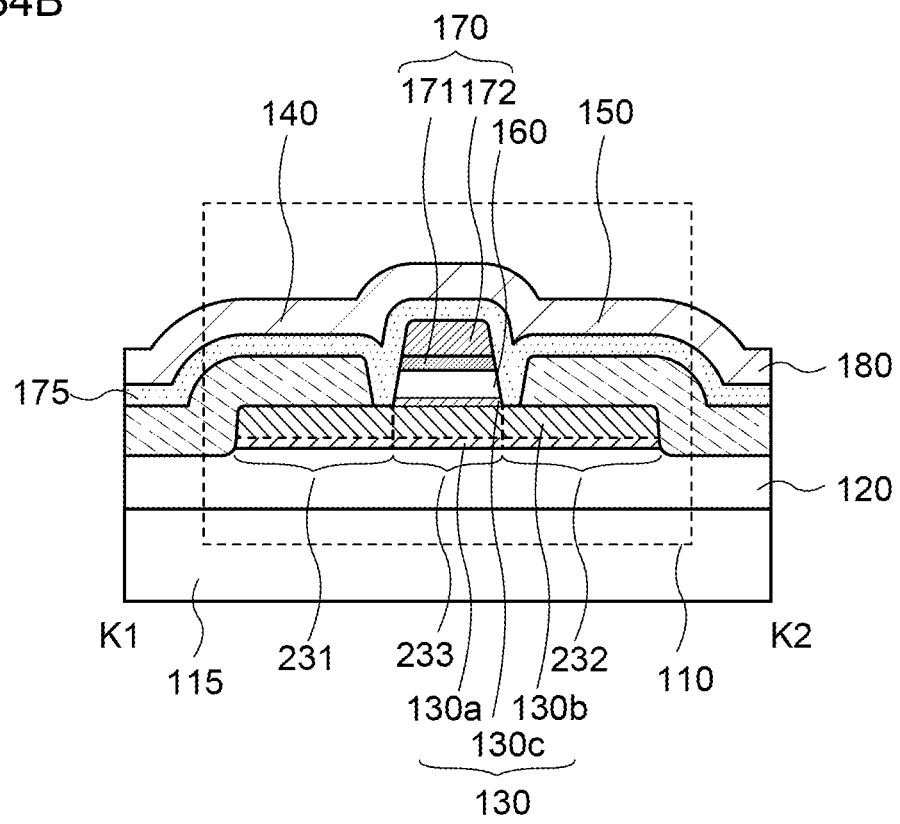

The transistor in one embodiment of the present invention may have a structure illustrated in FIGS. 34A and 34B. FIG. 34A is a top view of a transistor 110. A cross section in the direction of dashed-dotted line K1-K2 in FIG. 34A is illustrated in FIG. 34B. A cross section in the direction of dashed-dotted line K3-K4 in FIG. 34A is illustrated in FIG. 37A. In some cases, the direction of dashed-dotted line K1-K2 is referred to as a channel length direction, and the direction of dashed-dotted line K3-K4 is referred to as a channel width direction.

The transistor 110 has the same structure as the transistor 104 except that the oxide semiconductor layer 130 includes two layers (the oxide semiconductor layers 130a and 130b) in the regions 231 and 232 and that the oxide semiconductor layer 130 includes three layers (the oxide semiconductor layers 130a to 130c) in the region 233.

Figure 35A:
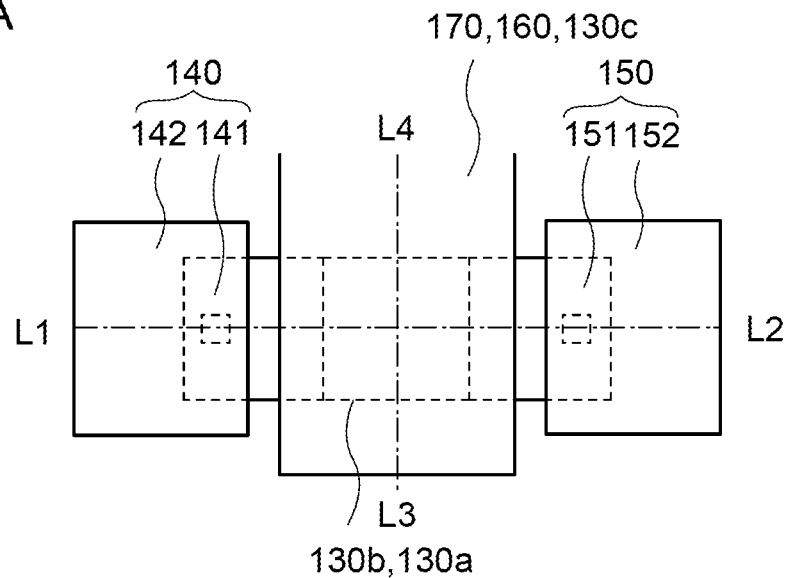
FIGS. 35A and 35B are a top view and a cross-sectional view illustrating a transistor.
Figure 35B:
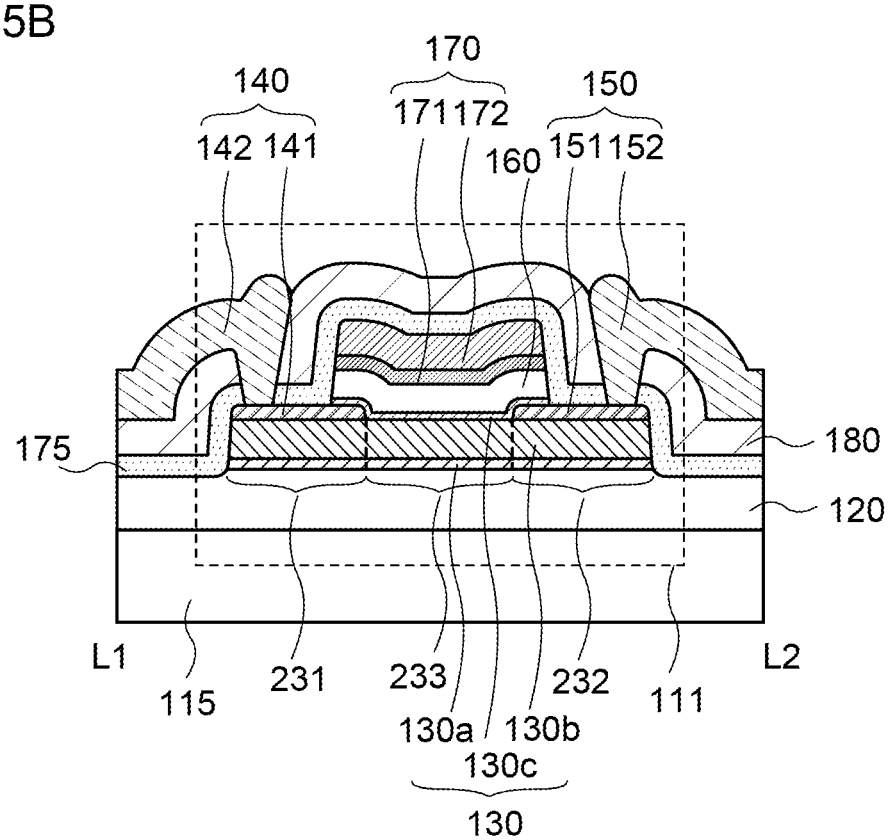

The transistor in one embodiment of the present invention may have a structure illustrated in FIGS. 35A and 35B. FIG. 35A is a top view of a transistor 111. A cross section in the direction of dashed-dotted line L1-L2 in FIG. 35A is illustrated in FIG. 35B. A cross section in the direction of dashed-dotted line L3-L4 in FIG. 35A is illustrated in FIG. 37A. In some cases, the direction of dashed-dotted line L1-L2 is referred to as a channel length direction, and the direction of dashed-dotted line L3-L4 is referred to as a channel width direction.

The transistor 111 includes the insulating layer 120 in contact with the substrate 115; a stack of the oxide semiconductor layers 130a and 130b in contact with the insulating layer 120; the conductive layers 141 and 151 electrically connected to the stack; the oxide semiconductor layer 130c in contact with the stack and the conductive layers 141 and 151; the insulating layer 160 in contact with the oxide semiconductor layer 130c; the conductive layer 170 in contact with the insulating layer 160; the insulating layer 175 in contact with the stack, the conductive layers 141 and 151, the oxide semiconductor layer 130c, the insulating layer 160, and the conductive layer 170; the insulating layer 180 in contact with the insulating layer 175; and the conductive layers 142 and 152 electrically connected to the conductive layers 141 and 151, respectively, through openings provided in the insulating layers 175 and 180. The transistor 111 may further include, for example, an insulating layer (planarization film) in contact with the insulating layer 180 and the conductive layers 142 and 152 as necessary.

The transistor 111 has the same structure as the transistor 105 except that the oxide semiconductor layer 130 includes two layers (the oxide semiconductor layers 130a and 130b) in the regions 231 and 232, that the oxide semiconductor layer 130 includes three layers (the oxide semiconductor layers 130a to 130c) in the region 233, and that part of the oxide semiconductor layer (the oxide semiconductor layer 130c) exists between the insulating layer 160 and the conductive layers 141 and 151.

Figure 36A:
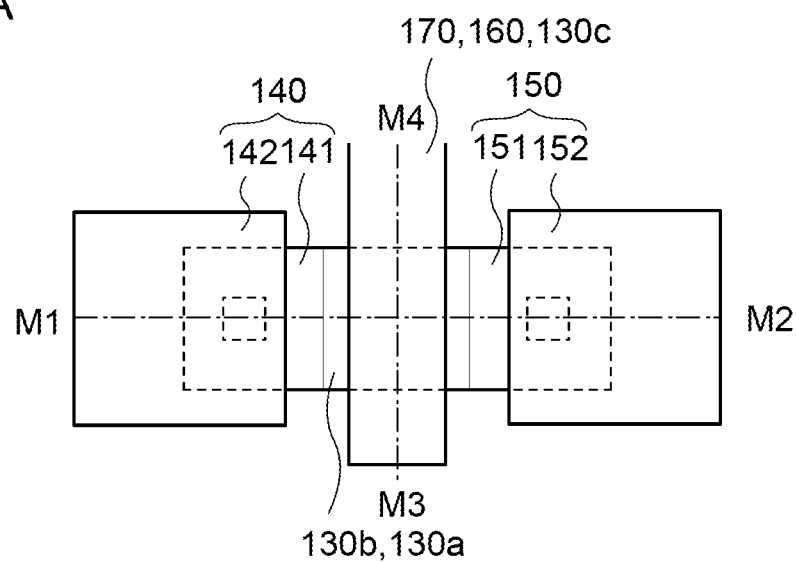
FIGS. 36A and 36B are a top view and a cross-sectional view illustrating a transistor.
Figure 36B:
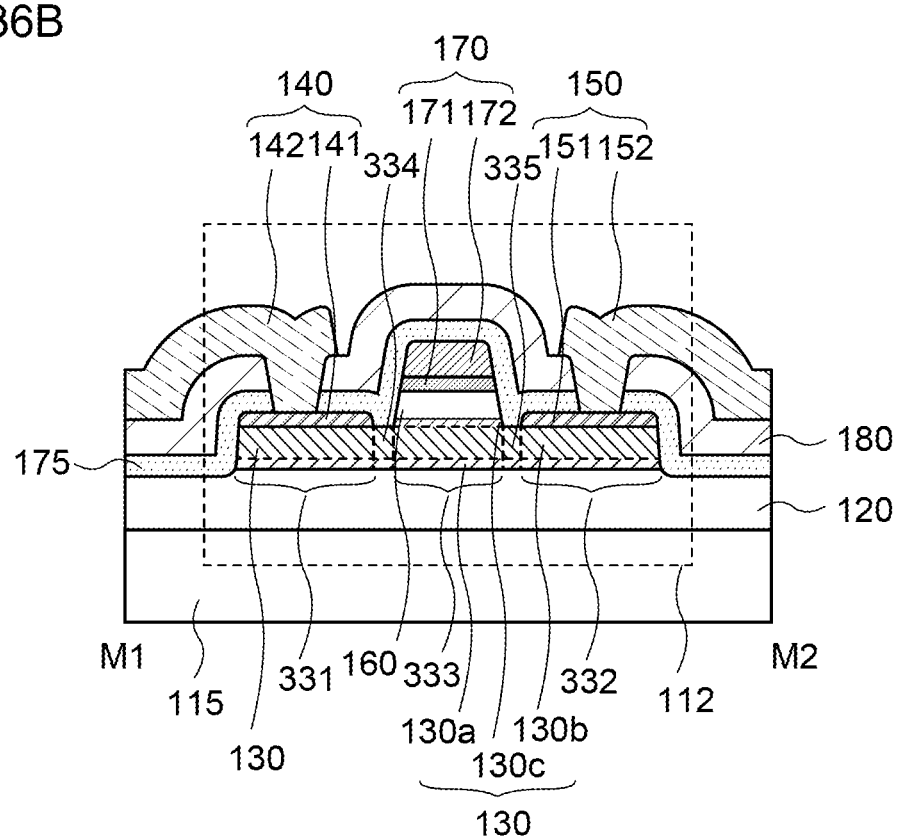

The transistor in one embodiment of the present invention may have a structure illustrated in FIGS. 36A and 36B. FIG. 36A is a top view of a transistor 112. A cross section in the direction of dashed-dotted line M1-M2 in FIG. 36A is illustrated in FIG. 36B. A cross section in the direction of dashed-dotted line M3-M4 in FIG. 36A is illustrated in FIG. 37A. In some cases, the direction of dashed-dotted line M1-M2 is referred to as a channel length direction, and the direction of dashed-dotted line M3-M4 is referred to as a channel width direction.

The transistor 112 has the same structure as the transistor 106 except that the oxide semiconductor layer 130 includes two layers (the oxide semiconductor layers 130a and 130b) in the regions 331, 332, 334, and 335 and that the oxide semiconductor layer 130 includes three layers (the oxide semiconductor layers 130a to 130c) in the region 333.

Figure 37C:
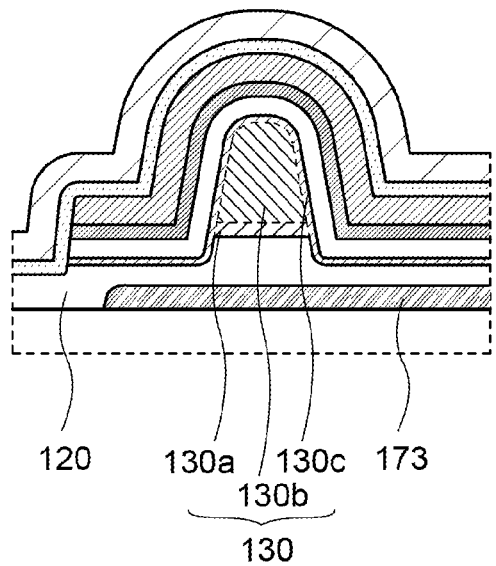
Figure 37D:
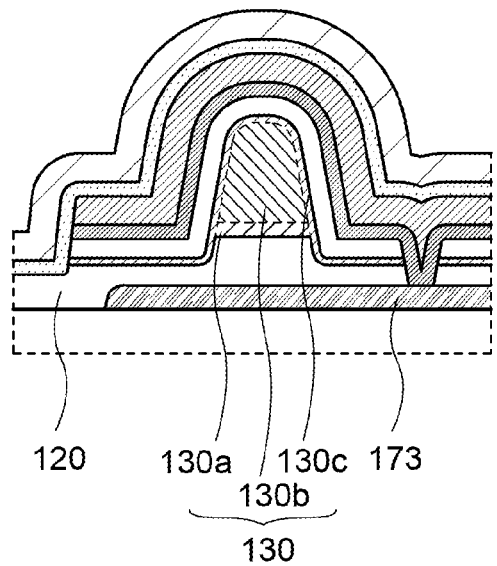
Figure 38A:
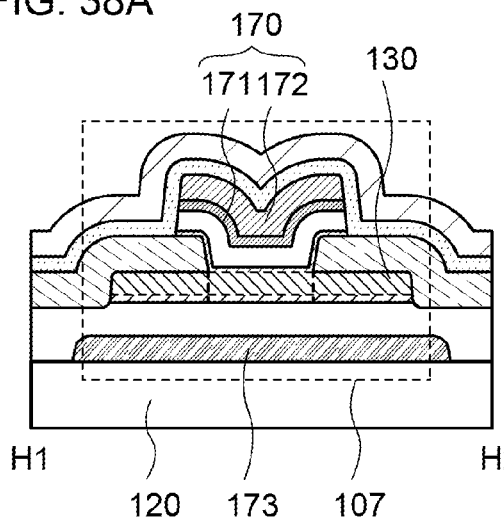
FIGS. 38A to 38F are each a cross-sectional view of a transistor in the channel length direction.
Figure 38B:
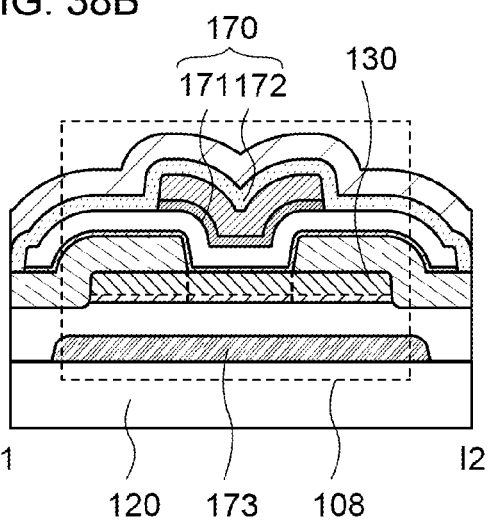
Figure 38C:
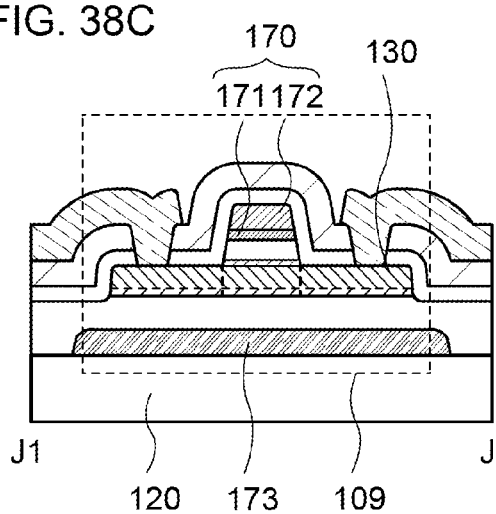
Figure 38D:
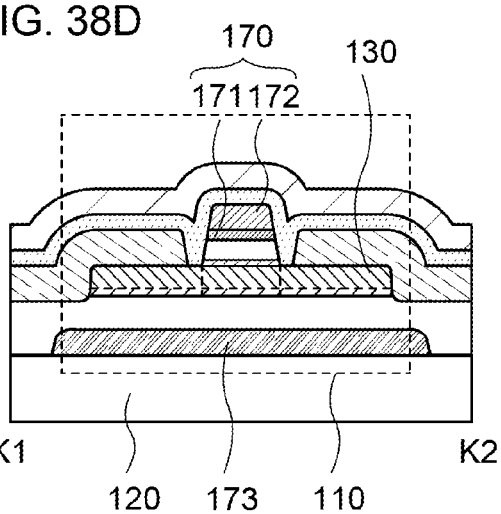
Figure 38E:
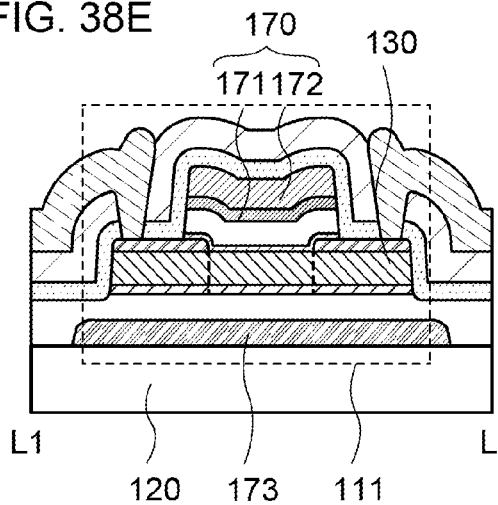
Figure 38F:
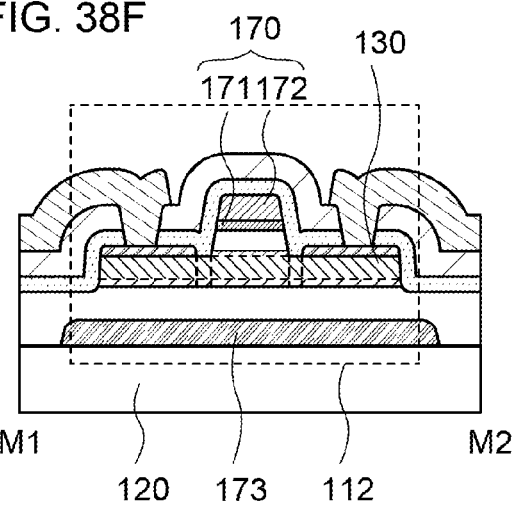

The transistor in one embodiment of the present invention may include the conductive layer 173 between the oxide semiconductor layer 130 and the substrate 115 as illustrated in cross-sectional views in the channel length direction in FIGS. 38A to 38F and cross-sectional views in the channel width direction in FIGS. 37C and 37D. When the conductive layer is used as a second gate electrode layer (back gate), the on-state current can be increased or the threshold voltage can be controlled. In the cross-sectional views in FIGS. 38A to 38F, the width of the conductive layer 173 may be shorter than that of the oxide semiconductor layer 130. Moreover, the width of the conductive layer 173 may be shorter than that of the conductive layer 170.

Figure 39A:
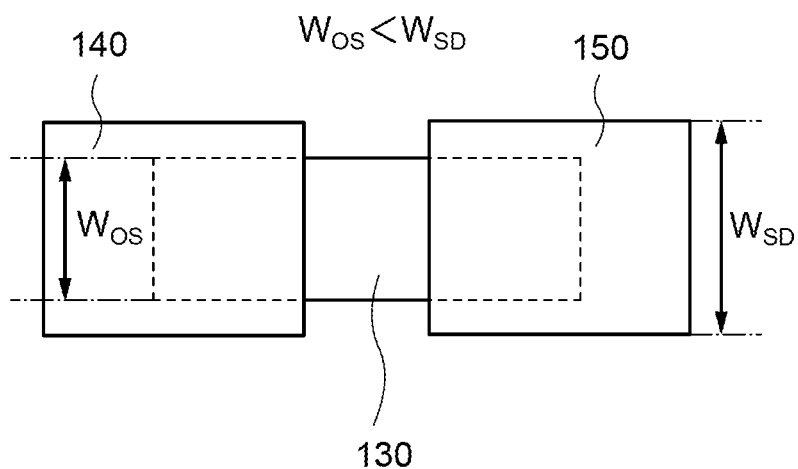
FIGS. 39A and 39B are each a top view illustrating a transistor.
Figure 39B:
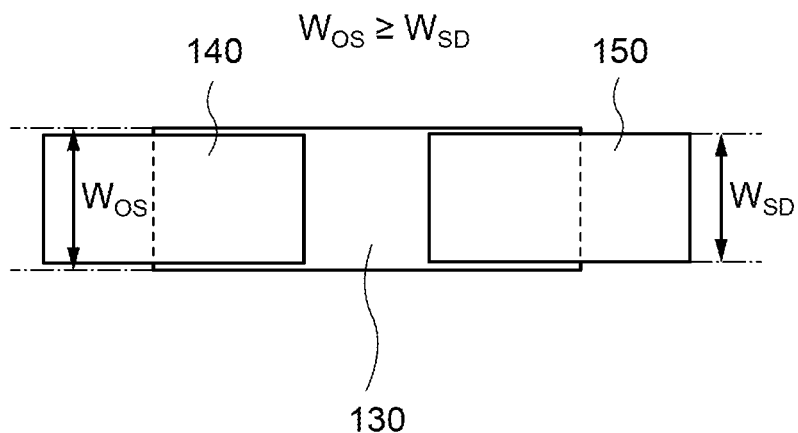

As illustrated in FIG. 39A, the width ($W_{SD}$) of the conductive layer 140 (source electrode layer) and the conductive layer 150 (drain electrode layer) in the transistor in one embodiment of the present invention may be longer than the width ($W_{OS}$) of the oxide semiconductor layer 130. Furthermore, as illustrated in FIG. 39B, $W_{SD}$ may be shorter than $W_{OS}$. When $W_{OS} \geq W_{SD}$ ($W_{SD}$ is less than or equal to $W_{OS}$) is satisfied, a gate electric field is easily applied to the entire oxide semiconductor layer 130, so that electrical characteristics of the transistor can be improved.

In the transistor in one embodiment of the present invention (any of the transistors 101 to 112), the conductive layer 170 functioning as a gate electrode layer electrically surrounds the oxide semiconductor layer 130 in the channel width direction with the insulating layer 160 functioning as a gate insulating film positioned therebetween. This structure increases the on-state current. Such a transistor structure is referred to as a surrounded channel (s-channel) structure.

In the transistor including the oxide semiconductor layers 130a and 130b and the transistor including the oxide semiconductor layers 130a to 130c, selecting appropriate materials for the two or three layers forming the oxide semiconductor layer 130 makes current flow to the oxide semiconductor layer 130b. Since current flows to the oxide semiconductor layer 130b, the current is hardly influenced by interface scattering, leading to high on-state current. Note that increasing the thickness of the oxide semiconductor layer 130b can increase the on-state current. The thickness of the oxide semiconductor layer 130b may be, for example, 100 nm to 200 nm.

A semiconductor device including a transistor with any of the above structures can have favorable electrical characteristics.

Note that in this specification, the channel length refers to, for example, a distance between a source (a source region or a source electrode) and a drain (a drain region or a drain electrode) in a region where a semiconductor (or a portion where current flows in a semiconductor when a transistor is on) and a gate electrode overlap with each other or in a region where a channel is formed in a top view of the transistor. In one transistor, channel lengths in all regions are not necessarily the same. In other words, the channel length of one transistor is not fixed to one value in some cases. Therefore, in this specification, the channel length is any one of values, the maximum value, the minimum value, or the average value in a region where a channel is formed.

The channel width refers to, for example, the length of a portion where a source and a drain face each other in a region where a semiconductor (or a portion where current flows in a semiconductor when a transistor is on) and a gate electrode overlap with each other or a region where a channel is formed. In one transistor, channel widths in all regions do not necessarily have the same value. In other words, the channel width of one transistor is not fixed to one value in some cases. Therefore, in this specification, the channel width is any one of values, the maximum value, the minimum value, or the average value in a region where a channel is formed.

Note that depending on transistor structures, a channel width in a region where a channel is actually formed (hereinafter referred to as an effective channel width) is sometimes different from a channel width shown in a top view of a transistor (hereinafter referred to as an apparent channel width). For example, in a transistor having a gate electrode covering a side surface of a semiconductor, an effective channel width is greater than an apparent channel width, and its influence cannot be ignored in some cases. For example, in a miniaturized transistor having a gate electrode covering a side surface of a semiconductor, the proportion of a channel region formed in a side surface of a semiconductor is increased. In that case, an effective channel width is greater than an apparent channel width.

In such a case, measuring an effective channel width is difficult in some cases. For example, to estimate an effective channel width from a design value, it is necessary to assume that the shape of a semiconductor is known. Therefore, in the case where the shape of a semiconductor is not known accurately, measuring an effective channel width accurately is difficult.

Accordingly, in this specification, an apparent channel width is referred to as a surrounded channel width (SCW) in some cases. Furthermore, in this specification, the term "channel width" may denote a surrounded channel width, i.e., an apparent channel width or an effective channel width. Note that the values of a channel length, a channel width, an effective channel width, an apparent channel width, a surrounded channel width, and the like can be determined by obtaining and analyzing a cross-sectional TEM image and the like.

A surrounded channel width may be used to calculate field-effect mobility, a current value per channel width, and the like of a transistor. In this case, the obtained value is sometimes different from the value obtained by using an effective channel width for the calculation.

The structure described above in this embodiment can be combined with any of the structures described in the other embodiments as appropriate.

Embodiment 5

In this embodiment, components of the transistors described in Embodiment 4 are described in detail.

The substrate 115 includes a silicon substrate provided with a transistor and/or a photodiode; and an insulating layer, a wiring, a conductor functioning as a contact plug, and the like that are provided over the silicon substrate. Note that when p-ch transistors are formed using the silicon substrate, a silicon substrate with n⁻-type conductivity is preferably used. Alternatively, an SOI substrate including an n⁻-type or i-type silicon layer may be used. A surface of the silicon substrate where the transistor is formed preferably has a (110) plane orientation. Forming a p-ch transistor with the (110) plane can increase mobility.

The insulating layer 120 can have a function of supplying oxygen to the oxide semiconductor layer 130 as well as a function of preventing diffusion of impurities from a component included in the substrate 115. For this reason, the insulating layer 120 is preferably an insulating film containing oxygen and more preferably, the insulating layer 120 is an insulating film containing oxygen in which the oxygen content is higher than that in the stoichiometric composition. The insulating layer 120 is a film in which the amount of released oxygen when converted into oxygen atoms is preferably greater than or equal to $1.0 \times 10^{19}$ atoms/cm³ in TDS analysis. In the TDS analysis, the film surface temperature is higher than or equal to 100° C. and lower than or equal to 700° C., or higher than or equal to 100° C. and lower than or equal to 500° C. The insulating layer 120 also functions as an interlayer insulating film and may be subjected to planarization treatment such as chemical mechanical polishing (CMP) so as to have a flat surface.

For example, the insulating layer 120 can be formed using an oxide insulating film including aluminum oxide, magnesium oxide, silicon oxide, silicon oxynitride, gallium oxide, germanium oxide, yttrium oxide, zirconium oxide, lanthanum oxide, neodymium oxide, hafnium oxide, tantalum oxide, or the like; a nitride insulating film including silicon nitride, silicon nitride oxide, aluminum nitride, aluminum nitride oxide, or the like; or a mixed material of any of these. The insulating layer 120 may be a stack of any of the above materials.

In this embodiment, detailed description is given mainly on the case where the oxide semiconductor layer 130 of the transistor has a three-layer structure in which the oxide semiconductor layers 130a to 130c are sequentially stacked from the insulating layer 120 side.

Note that in the case where the oxide semiconductor layer 130 is a single layer, a layer corresponding to the oxide semiconductor layer 130b described in this embodiment is used.

In the case where the oxide semiconductor layer 130 has a two-layer structure, a stack in which a layer corresponding to the oxide semiconductor layer 130a and a layer corresponding to the oxide semiconductor layer 130b are sequentially stacked from the insulating layer 120 side described in this embodiment is used. In such a case, the oxide semiconductor layers 130a and 130b can be replaced with each other.

In the case where the oxide semiconductor layer 130 has a layered structure of four or more layers, for example, a structure in which another oxide semiconductor layer is added to the three-layer stack of the oxide semiconductor layer 130 described in this embodiment can be employed.

For the oxide semiconductor layer 130b, for example, an oxide semiconductor whose electron affinity (an energy difference between a vacuum level and the conduction band minimum) is higher than those of the oxide semiconductor layers 130a and 130c is used. The electron affinity can be obtained by subtracting an energy difference between the conduction band minimum and the valence band maximum (what is called an energy gap) from an energy difference between the vacuum level and the valence band maximum (what is called an ionization potential).

The oxide semiconductor layers 130a and 130c each contain one or more kinds of metal elements contained in the oxide semiconductor layer 130b. For example, the oxide semiconductor layers 130a and 130c are preferably formed using an oxide semiconductor whose conduction band minimum is closer to a vacuum level than that of the oxide semiconductor layer 130b by 0.05 eV or more, 0.07 eV or more, 0.1 eV or more, or 0.15 eV or more and 2 eV or less, 1 eV or less, 0.5 eV or less, or 0.4 eV or less.

In such a structure, when an electric field is applied to the conductive layer 170, a channel is formed in the oxide semiconductor layer 130b whose conduction band minimum is the lowest in the oxide semiconductor layer 130.

Furthermore, since the oxide semiconductor layer 130a contains one or more kinds of metal elements contained in the oxide semiconductor layer 130b, an interface state is unlikely to be formed at the interface between the oxide semiconductor layers 130a and 130b, compared with the interface between the oxide semiconductor layer 130b and the insulating layer 120 on the assumption that the oxide semiconductor layer 130b is in contact with the insulating layer 120. The interface state sometimes forms a channel; therefore, the threshold voltage of the transistor is changed in some cases. Thus, with the oxide semiconductor layer 130a, variations in electrical characteristics of the transistor, such as a threshold voltage, can be reduced. Moreover, the reliability of the transistor can be improved.

Furthermore, since the oxide semiconductor layer 130c contains one or more kinds of metal elements contained in the oxide semiconductor layer 130b, scattering of carriers is unlikely to occur at the interface between the oxide semiconductor layers 130b and 130c, compared with the interface between the oxide semiconductor layer 130b and the gate insulating film (the insulating layer 160) on the assumption that the oxide semiconductor layer 130b is in contact with the gate insulating film. Thus, with the oxide semiconductor layer 130c, the field-effect mobility of the transistor can be increased.

For the oxide semiconductor layers 130a and 130c, for example, a material containing Al, Ti, Ga, Ge, Y, Zr, Sn, La, Ce, or Hf with a higher atomic ratio than that used for the oxide semiconductor layer 130b can be used. Specifically, the atomic ratio of any of the above metal elements in the oxide semiconductor layers 130a and 130c is 1.5 times or more, preferably 2 times or more, more preferably 3 times or more as large as that in the oxide semiconductor layer 130b. Any of the above metal elements is strongly bonded to oxygen and thus has a function of suppressing generation of an oxygen vacancy in the oxide semiconductor layers 130a and 130c. That is, an oxygen vacancy is less likely to be generated in the oxide semiconductor layers 130a and 130c than in the oxide semiconductor layer 130b.

An oxide semiconductor that can be used for each of the oxide semiconductor layers 130a to 130c preferably contains at least In or Zn. Both In and Zn are preferably contained. In order to reduce variations in electrical characteristics of the transistor including the oxide semiconductor, the oxide semiconductor preferably contains a stabilizer in addition to In and Zn.

Examples of a stabilizer include Ga, Sn, Hf, Al, and Zr. Other examples of the stabilizer include lanthanoids such as La, Ce, Pr, Nd, Sm, Eu, Gd, Tb, Dy, Ho, Er, Tm, Yb, and Lu.

As the oxide semiconductor, for example, any of the following can be used: indium oxide, tin oxide, gallium oxide, zinc oxide, an In—Zn oxide, a Sn—Zn oxide, an Al—Zn oxide, a Zn—Mg oxide, a Sn—Mg oxide, an In—Mg oxide, an In—Ga oxide, an In—Ga—Zn oxide, an In—Al—Zn oxide, an In—Sn—Zn oxide, a Sn—Ga—Zn oxide, an Al—Ga—Zn oxide, a Sn—Al—Zn oxide, an In—Hf—Zn oxide, an In—La—Zn oxide, an In—Ce—Zn oxide, an In—Pr—Zn oxide, an In—Nd—Zn oxide, an In—Sm—Zn oxide, an In—Eu—Zn oxide, an In—Gd—Zn oxide, an In—Tb—Zn oxide, an In—Dy—Zn oxide, an In—Ho—Zn oxide, an In—Er—Zn oxide, an In—Tm—Zn oxide, an In—Yb—Zn oxide, an In—Lu—Zn oxide, an In—Sn—Ga—Zn oxide, an In—Hf—Ga—Zn oxide, an In—Al—Ga—Zn oxide, an In—Sn—Al—Zn oxide, an In—Sn—Hf—Zn oxide, and an In—Hf—Al—Zn oxide.

For example, an In—Ga—Zn oxide means an oxide containing In, Ga, and Zn as its main components. The In—Ga—Zn oxide may contain another metal element in addition to In, Ga, and Zn. In this specification, a film containing the In—Ga—Zn oxide is also referred to as an IGZO film.

A material represented by $InMO_3(ZnO)_m$ (m>0, where m is not an integer) may be used. Note that M represents one or more metal elements selected from Ga, Y, Zr, La, Ce, and Nd. Alternatively, a material represented by $In_2SnO_5(ZnO)_n$ (n>0, where n is an integer) may be used.

Note that when each of the oxide semiconductor layers 130a to 130c is an In-M-Zn oxide containing at least indium, zinc, and M (M is a metal such as Al, Ti, Ga, Ge, Y, Zr, Sn, La, Ce, or Hf), in the case where the oxide semiconductor layer 130a has an atomic ratio of In to M and Zn which is $x_1:y_1:z_1$, the oxide semiconductor layer 130b has an atomic ratio of In to M and Zn which is $x_2:y_2:z_2$, and the oxide semiconductor layer 130c has an atomic ratio of In to M and Zn which is $x_3:y_3:z_3$, each of $y_1/x_1$ and $y_3/x_3$ is preferably larger than $y_2/x_2$. Each of $y_1/x_1$ and $y_3/x_3$ is 1.5 times or more, preferably 2 times or more, more preferably 3 times or more as large as $y_2/x_2$. At this time, when $y_2$ is greater than or equal to $x_2$ in the oxide semiconductor layer 130b, the transistor can have stable electrical characteristics. However, when $y_2$ is 3 times or more as large as $x_2$, the field-effect mobility of the transistor is reduced; accordingly, $y_2$ is preferably smaller than 3 times $x_2$.

In the case where Zn and O are not taken into consideration, the proportion of In and the proportion of M in each of the oxide semiconductor layers 130a and 130c are preferably less than 50 atomic % and greater than or equal to 50 atomic %, respectively, more preferably less than 25 atomic % and greater than or equal to 75 atomic %, respectively. Furthermore, in the case where Zn and O are not taken into consideration, the proportion of In and the proportion of M in the oxide semiconductor layer 130b are preferably greater than or equal to 25 atomic % and less than 75 atomic %, respectively, more preferably greater than or equal to 34 atomic % and less than 66 atomic %, respectively.

The indium content in the oxide semiconductor layer 130b is preferably higher than those in the oxide semiconductor layers 130a and 130c. In an oxide semiconductor, the s orbital of heavy metal mainly contributes to carrier transfer, and when the proportion of In in the oxide semiconductor is increased, overlap of the s orbitals is likely to be increased. Therefore, an oxide in which the proportion of In is higher than that of M has higher mobility than an oxide in which the proportion of In is equal to or lower than that of M. Thus, with the use of an oxide having a high content of indium for the oxide semiconductor layer 130b, a transistor having high field-effect mobility can be obtained.

The thickness of the oxide semiconductor layer 130a is greater than or equal to 3 nm and less than or equal to 100 nm, preferably greater than or equal to 5 nm and less than or equal to 50 nm, more preferably greater than or equal to 5 nm and less than or equal to 25 nm. The thickness of the oxide semiconductor layer 130b is greater than or equal to 3 nm and less than or equal to 200 nm, preferably greater than or equal to 10 nm and less than or equal to 150 nm, more preferably greater than or equal to 15 nm and less than or equal to 100 nm. The thickness of the oxide semiconductor layer 130c is greater than or equal to 1 nm and less than or equal to 50 nm, preferably greater than or equal to 2 nm and less than or equal to 30 nm, more preferably greater than or equal to 3 nm and less than or equal to 15 nm. In addition, the oxide semiconductor layer 130b is preferably thicker than the oxide semiconductor layers 130a and 130c.

Note that in order that a transistor in which a channel is formed in an oxide semiconductor layer have stable electrical characteristics, it is effective to make the oxide semiconductor layer intrinsic or substantially intrinsic by reducing the concentration of impurities in the oxide semiconductor layer. The term "substantially intrinsic" refers to a state where an oxide semiconductor layer has a carrier density lower than $1 \times 10^{17}/cm^3$, lower than $1 \times 10^{15}/cm^3$, or lower than $1 \times 10^{13}/cm^3$.

In the oxide semiconductor layer, hydrogen, nitrogen, carbon, silicon, and a metal element other than main components of the oxide semiconductor layer are impurities. For example, hydrogen and nitrogen form donor levels to increase the carrier density, and silicon forms impurity levels in the oxide semiconductor layer. The impurity levels serve as traps and might cause deterioration of electrical characteristics of the transistor. Therefore, it is preferable to reduce the concentration of the impurities in the oxide semiconductor layers 130a to 130c and at interfaces between the oxide semiconductor layers.

In order to make the oxide semiconductor layer intrinsic or substantially intrinsic, the oxide semiconductor layer is controlled to have a region in which the concentration of hydrogen, which is measured by measured by secondary ion mass spectrometry (SIMS), is lower than or equal to $2\times10^{20}$ atoms/cm$^3$, preferably lower than or equal to $5\times10^{19}$ atoms/cm$^3$, more preferably lower than or equal to $1\times10^{19}$ atoms/cm$^3$, still more preferably lower than or equal to $5\times10^{18}$ atoms/cm$^3$ and is higher than or equal to $1\times10^{17}$ atoms/cm$^3$. Furthermore, the concentration of nitrogen is lower than $5\times10^{19}$ atoms/cm$^3$, preferably lower than or equal to $5\times10^{18}$ atoms/cm$^3$, more preferably lower than or equal to $1\times10^{18}$ atoms/cm$^3$, still more preferably lower than or equal to $5\times10^{17}$ atoms/cm$^3$ and is higher than or equal to $5\times10^{16}$ atoms/cm$^3$.

The high concentration of silicon or carbon might reduce the crystallinity of the oxide semiconductor layer. In order not to lower the crystallinity of the oxide semiconductor layer, for example, the oxide semiconductor layer is controlled to have a region in which the concentration of silicon is lower than $1\times10^{19}$ atoms/cm$^3$, preferably lower than $5\times10^{18}$ atoms/cm$^3$, more preferably lower than $1\times10^{18}$ atoms/cm$^3$ and is higher than or equal to $1\times10^{18}$ atoms/cm$^3$. Furthermore, the oxide semiconductor layer is controlled to have a region in which the concentration of carbon is lower than $1\times10^{19}$ atoms/cm$^3$, preferably lower than $5\times10^{18}$ atoms/cm$^3$, more preferably lower than $1\times10^{18}$ atoms/cm$^3$ and is higher than or equal to $6\times10^{17}$ atoms/cm$^3$.

A transistor in which a highly purified oxide semiconductor film is used for a channel formation region exhibits extremely low off-state current. When voltage between a source and a drain is set at about 0.1 V, 5 V, or 10 V, for example, the off-state current per channel width of the transistor can be as low as several yoctoamperes per micrometer to several zeptoamperes per micrometer.

As the gate insulating film of the transistor, an insulating film containing silicon is used in many cases; thus, it is preferable that, as in the transistor in one embodiment of the present invention, a region of the oxide semiconductor layer that serves as a channel not be in contact with the gate insulating film for the above reason. In the case where a channel is formed at the interface between the gate insulating film and the oxide semiconductor layer, scattering of carriers occurs at the interface, so that the field-effect mobility of the transistor is reduced. Also from the view of the above, it is preferable that the region of the oxide semiconductor layer that serves as a channel be separated from the gate insulating film.

Accordingly, with the oxide semiconductor layer 130 having a layered structure including the oxide semiconductor layers 130a to 130c, a channel can be formed in the oxide semiconductor layer 130b; thus, the transistor can have high field-effect mobility and stable electrical characteristics.

In a band structure, the conduction band minimums of the oxide semiconductor layers 130a to 130c are continuous. This can be understood also from the fact that the compositions of the oxide semiconductor layers 130a to 130c are close to one another and oxygen is easily diffused among the oxide semiconductor layers 130a to 130c. Thus, the oxide semiconductor layers 130a to 130c have a continuous physical property though they have different compositions and form a stack. In the drawings, interfaces between the oxide semiconductor layers of the stack are indicated by dotted lines.

The oxide semiconductor layer 130 in which layers containing the same main components are stacked is formed to have not only a simple layered structure of the layers but also a continuous energy band (here, in particular, a well structure having a U shape in which the conduction band minimums are continuous (U-shape well)). In other words, the layered structure is formed such that there exists no impurity that forms a defect level such as a trap center or a recombination center at each interface. If impurities exist between the stacked oxide semiconductor layers, the continuity of the energy band is lost and carriers disappear by a trap or recombination at the interface.

For example, an In—Ga—Zn oxide whose atomic ratio of In to Ga and Zn is 1:3:2, 1:3:3, 1:3:4, 1:3:6, 1:4:5, 1:6:4, or 1:9:6 can be used for the oxide semiconductor layers 130a and 130c, and an In—Ga—Zn oxide whose atomic ratio of In to Ga and Zn is 1:1:1, 2:1:3, 5:5:6, or 3:1:2 can be used for the oxide semiconductor layer 130b. In each of the oxide semiconductor layers 130a to 130c, the proportion of each atom in the atomic ratio varies within a range of ±20% as a margin.

The oxide semiconductor layer 130b of the oxide semiconductor layer 130 serves as a well, so that a channel is formed in the oxide semiconductor layer 130b. Note that since the conduction band minimums are continuous, the oxide semiconductor layer 130 can also be referred to as a U-shaped well. Furthermore, a channel formed to have such a structure can also be referred to as a buried channel.

Note that trap levels due to impurities or defects might be formed in the vicinity of the interface between an insulating layer such as a silicon oxide film and each of the oxide semiconductor layers 130a and 130c. The oxide semiconductor layer 130b can be distanced away from the trap levels owing to existence of the oxide semiconductor layers 130a and 130c.

However, when the energy differences between the conduction band minimum of the oxide semiconductor layer 130b and the conduction band minimum of each of the oxide semiconductor layers 130a and 130c are small, an electron in the oxide semiconductor layer 130b might reach the trap level by passing over the energy differences. When the electron is trapped in the trap level, negative charge is generated at the interface with the insulating layer, so that the threshold voltage of the transistor is shifted in a positive direction.

The oxide semiconductor layers 130a to 130c preferably include crystal parts. In particular, when crystals with c-axis alignment are used, the transistor can have stable electrical characteristics. Moreover, crystals with c-axis alignment are resistant to bending; therefore, using such crystals can improve the reliability of a semiconductor device using a flexible substrate.

As the conductive layer 140 functioning as a source electrode layer and the conductive layer 150 functioning as a drain electrode layer, for example, a single layer or a stacked layer formed using a material selected from Al, Cr, Cu, Ta, Ti, Mo, W, Ni, Mn, Nd, and Sc and alloys of any of these metal materials can be used. Typically, it is preferable to use Ti, which is particularly easily bonded to oxygen, or W, which has a high melting point and thus makes subsequent process temperatures comparatively high. It is also possible to use a stack of any of the above materials and Cu or an alloy such as Cu—Mn, which has low resistance. In the transistors 105, 106, 111, and 112, for example, it is possible to use W for the conductive layers 141 and 151 and use a stack of Ti and Al for the conductive layers 142 and 152.

The above materials are capable of extracting oxygen from an oxide semiconductor layer. Therefore, in a region of the oxide semiconductor layer that is in contact with any of the above materials, oxygen is released from the oxide semiconductor layer and an oxygen vacancy is formed. Hydrogen slightly contained in the layer and the oxygen vacancy are bonded to each other, so that the region is changed to an n-type region. Accordingly, the n-type region can serve as a source or a drain of the transistor.

In the case where W is used for the conductive layers 140 and 150, the conductive layers 140 and 150 may be doped with nitrogen. Doping with nitrogen can appropriately lower the capability of extracting oxygen and prevent the n-type region from spreading to a channel region. It is possible to prevent the n-type region from spreading to a channel region also by using a stack of W and an n-type semiconductor layer as the conductive layers 140 and 150 and putting the n-type semiconductor layer in contact with the oxide semiconductor layer. As the n-type semiconductor layer, an In—Ga—Zn oxide, zinc oxide, indium oxide, tin oxide, indium tin oxide, or the like to which nitrogen is added can be used.

The insulating layer 160 functioning as a gate insulating film can be formed using an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating layer 160 may be a stack including any of the above materials. The insulating layer 160 may contain La, N, Zr, or the like as an impurity.

An example of a layered structure of the insulating layer 160 is described. The insulating layer 160 includes, for example, oxygen, nitrogen, silicon, or hafnium. Specifically, the insulating layer 160 preferably includes hafnium oxide and silicon oxide or silicon oxynitride.

Hafnium oxide and aluminum oxide have higher dielectric constants than silicon oxide and silicon oxynitride. Therefore, the insulating layer 160 using hafnium oxide or aluminum oxide can have larger thickness than the insulating layer 160 using silicon oxide, so that leakage current due to tunnel current can be reduced. That is, a transistor with low off-state current can be provided. Moreover, hafnium oxide with a crystalline structure has a higher dielectric constant than hafnium oxide with an amorphous structure. Therefore, it is preferable to use hafnium oxide with a crystalline structure in order to provide a transistor with low off-state current. Examples of the crystal structure include a monoclinic crystal structure and a cubic crystal structure. Note that one embodiment of the present invention is not limited to the above examples.

For the insulating layers 120 and 160 in contact with the oxide semiconductor layer 130, a film that releases less nitrogen oxide is preferably used. For the insulating layers 120 and 160, for example, a silicon oxynitride film or an aluminum oxynitride film that releases less nitrogen oxide can be used.

A silicon oxynitride film that releases less nitrogen oxide is a film of which the amount of released ammonia is larger than the amount of released nitrogen oxide in TDS; the amount of released ammonia is typically greater than or equal to $1\times10^{18}$ molecules/cm$^3$ and less than or equal to $5\times10^{19}$ molecules/cm$^3$. Note that the amount of released ammonia is the amount of ammonia released by heat treatment with which the surface temperature of the film becomes higher than or equal to 50° C. and lower than or equal to 650° C., preferably higher than or equal to 50° C. and lower than or equal to 550° C.

By using the above oxide insulating layer for the insulating layers 120 and 160, a shift in the threshold voltage of the transistor can be reduced, which leads to reduced fluctuations in the electrical characteristics of the transistor.

For the conductive layer 170 functioning as a gate electrode layer, for example, a conductive film formed using Al, Ti, Cr, Co, Ni, Cu, Y, Zr, Mo, Ru, Ag, Mn, Nd, Sc, Ta, W, or the like can be used. Alternatively, an alloy or a conductive nitride of any of these materials may be used. Alternatively, a stack of a plurality of materials selected from these materials, alloys of these materials, and conductive nitrides of these materials may be used. Typically, tungsten, a stack of tungsten and titanium nitride, a stack of tungsten and tantalum nitride, or the like can be used. Alternatively, Cu or an alloy such as Cu—Mn, which has low resistance, or a stack of any of the above materials and Cu or an alloy such as Cu—Mn may be used. In this embodiment, tantalum nitride is used for the conductive layer 171 and tungsten is used for the conductive layer 172 to form the conductive layer 170.

As the insulating layer 175, a silicon nitride film, an aluminum nitride film, or the like containing hydrogen can be used. In the transistors 103, 104, 106, 109, 110, and 112 described in Embodiment 4, when an insulating film containing hydrogen is used as the insulating layer 175, part of the oxide semiconductor layer can have n-type conductivity. In addition, a nitride insulating film functions as a blocking film against moisture and the like and can improve the reliability of the transistor.

An aluminum oxide film can also be used as the insulating layer 175. It is particularly preferable to use an aluminum oxide film as the insulating layer 175 in the transistors 101, 102, 105, 107, 108, and 111 described in Embodiment 4. The aluminum oxide film has a high blocking effect of preventing penetration of both oxygen and impurities such as hydrogen and moisture. Accordingly, during and after the manufacturing process of the transistor, the aluminum oxide film can suitably function as a protective film that has effects of preventing entry of impurities such as hydrogen and moisture into the oxide semiconductor layer 130, preventing release of oxygen from the oxide semiconductor layer, and preventing unnecessary release of oxygen from the insulating layer 120. Furthermore, oxygen contained in the aluminum oxide film can be diffused into the oxide semiconductor layer.

Furthermore, the insulating layer 180 is preferably formed over the insulating layer 175. The insulating layer 180 can be formed using an insulating film containing one or more of magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating layer 180 may be a stack of any of the above materials.

Here, like the insulating layer 120, the insulating layer 180 preferably contains oxygen more than that in the stoichiometric composition. Oxygen released from the insulating layer 180 can be diffused into the channel formation region in the oxide semiconductor layer 130 through the insulating layer 160, so that oxygen vacancies formed in the channel formation region can be filled with oxygen. In this manner, stable electrical characteristics of the transistor can be achieved.

High integration of a semiconductor device requires miniaturization of a transistor. However, it is known that miniaturization of a transistor causes deterioration of electrical characteristics of the transistor. In particular, a decrease in channel width causes a reduction in on-state current.

In the transistors 107 to 112 in one embodiment of the present invention, the oxide semiconductor layer 130*c* is formed to cover the oxide semiconductor layer 130*b* where a channel is formed; thus, a channel formation layer is not in contact with the gate insulating film. Accordingly, scattering of carriers at the interface between the channel formation layer and the gate insulating film can be reduced and the on-state current of the transistor can be increased.

In the transistor in one embodiment of the present invention, as described above, the gate electrode layer (the conductive layer 170) is formed to electrically surround the oxide semiconductor layer 130 in the channel width direction; accordingly, a gate electric field is applied to the oxide semiconductor layer 130 in a direction perpendicular to its side surface in addition to a direction perpendicular to its top surface. In other words, a gate electric field is applied to the entire channel formation layer and effective channel width is increased, leading to a further increase in the on-state current.

Furthermore, in the transistor in one embodiment of the present invention in which the oxide semiconductor layer 130 has a two-layer structure or a three-layer structure, since the oxide semiconductor layer 130*b* where a channel is formed is provided over the oxide semiconductor layer 130*a*, an effect of making an interface state less likely to be formed is obtained. In the transistor in one embodiment of the present invention in which the oxide semiconductor layer 130 has a three-layer structure, since the oxide semiconductor layer 130*b* is positioned at the middle of the three-layer structure, an effect of eliminating the influence of an impurity that enters from upper and lower layers on the oxide semiconductor layer 130*b* is obtained as well. Therefore, the transistor can achieve not only the increase in the on-state current of the transistor but also stabilization of the threshold voltage and a reduction in the S value (subthreshold value). Thus, current when gate voltage VG is 0 V can be reduced and power consumption can be reduced. In addition, since the threshold voltage of the transistor becomes stable, long-term reliability of the semiconductor device can be improved. Furthermore, the transistor in one embodiment of the present invention is suitable for a highly integrated semiconductor device because deterioration of electrical characteristics due to miniaturization is reduced.

The structure described above in this embodiment can be combined with any of the structures described in the other embodiments as appropriate.

Embodiment 6

In this embodiment, methods for manufacturing the transistors 101, 107, and 111 described in Embodiment 4 are described.

First, a method for manufacturing a silicon transistor included in the substrate 115 is described. Here, an example of a method for manufacturing a p-ch transistor is described. An n⁻-type single crystal silicon substrate is used as a silicon substrate, and an element formation region isolated with an insulating layer (also referred to as a field oxide film) is formed in the surface. The element formation region can be formed by local oxidation of silicon (LOCOS), shallow trench isolation (STI), or the like.

Here, the substrate is not limited to the single crystal silicon substrate. A silicon on insulator (SOI) substrate or the like can also be used.

Next, a gate insulating film is formed to cover the element formation region. For example, a silicon oxide film is formed by oxidation of a surface of the element formation region by heat treatment. Furthermore, after the silicon oxide film is formed, a surface of the silicon oxide film may be nitrided by nitriding treatment.

Next, a conductive film is formed to cover the gate insulating film. The conductive film can be formed using an element selected from Ta, W, Ti, Mo, Al, Cu, Cr, Nb, and the like, or an alloy material or a compound material containing such an element as a main component. Alternatively, a metal nitride film obtained by nitriding of any of these elements can be used. Alternatively, a semiconductor material typified by polycrystalline silicon doped with an impurity element such as phosphorus can be used.

Then, the conductive film is selectively etched, so that a gate electrode layer is formed over the gate insulating film.

Next, an insulating film such as a silicon oxide film or a silicon nitride film is formed to cover the gate electrode layer and etch back is performed, so that sidewalls are formed on side surfaces of the gate electrode layer.

Next, a resist mask is selectively formed to cover regions except the element formation region, and an impurity element is added using the resist mask and the gate electrode layer as masks, so that pt-type impurity regions are formed. Here, in order to form a p-ch transistor, an impurity element imparting p-type conductivity such as B or Ga can be used as the impurity element.

Through the above steps, a p-ch transistor including an active region in the silicon substrate is completed. Note that a passivation film such as a silicon nitride film or an aluminum oxide film is preferably formed over the transistor.

Next, an interlayer insulating film is formed over the silicon substrate where the transistor is formed, and contact plugs and wirings are formed.

A method for manufacturing the transistor 101 is described with reference to FIGS. 40A to 40C and FIGS. 41A to 41C. A cross section of the transistor in the channel length direction is shown on the left side, and a cross section of the transistor in the channel width direction is shown on the right side. The cross-sectional views in the channel width direction are enlarged views; therefore, components on the left side and those on the right side differ in apparent thickness.

The case where the oxide semiconductor layer 130 has a three-layer structure of the oxide semiconductor layers 130*a* to 130*c* is described as an example. In the case where the oxide semiconductor layer 130 has a two-layer structure, the oxide semiconductor layers 130*a* and 130*b* are used. In the case where the oxide semiconductor layer 130 has a single-layer structure, the oxide semiconductor layer 130*b* is used.

First, the insulating layer 120 is formed over the substrate 115. Embodiment 5 can be referred to for the kind of the substrate 115 and the material of the insulating layer 120. The insulating layer 120 can be formed by sputtering, CVD, molecular beam epitaxy (MBE), or the like.

Oxygen may be added to the insulating layer 120 by ion implantation, ion doping, plasma immersion ion implantation, plasma treatment, or the like. Adding oxygen enables the insulating layer 120 to supply oxygen much easily to the oxide semiconductor layer 130.

In the case where a surface of the substrate 115 is made of an insulator and there is no influence of impurity diffusion on the oxide semiconductor layer 130 to be formed later, the insulating layer 120 is not necessarily provided.

Figure 40A:
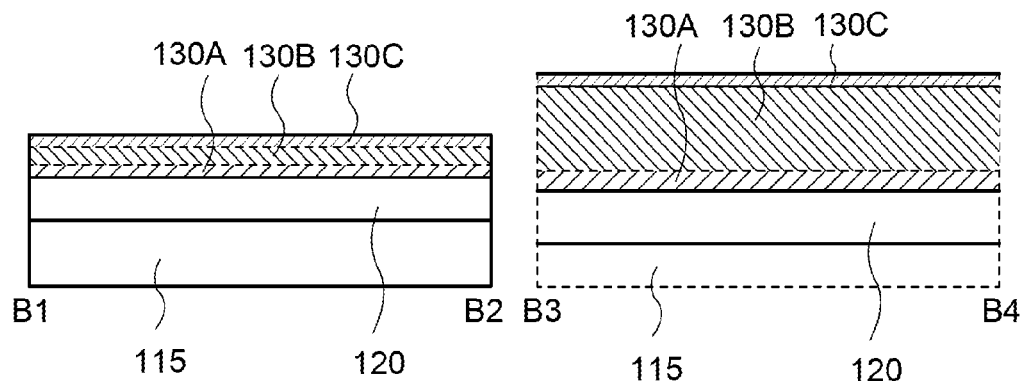
FIGS. 40A to 40C illustrate a method for manufacturing a transistor.

Next, an oxide semiconductor film 130A to be the oxide semiconductor layer 130a, an oxide semiconductor film 130B to be the oxide semiconductor layer 130b, and an oxide semiconductor film 130C to be the oxide semiconductor layer 130c are formed over the insulating layer 120 by sputtering, CVD, MBE, or the like (see FIG. 40A).

In the case where the oxide semiconductor layer 130 has a layered structure, oxide semiconductor films are preferably formed successively without exposure to the air with the use of a multi-chamber deposition apparatus (e.g., a sputtering apparatus) including a load lock chamber. It is preferable that each chamber of the sputtering apparatus be able to be evacuated to a high vacuum (approximately $5\times10^{-7}$ to $1\times10^{-4}$ Pa) by an adsorption vacuum evacuation pump such as a cryopump and that the chamber be able to heat the substrate to higher than or equal to 100° C., preferably higher than or equal to 500° C., so that water and the like serving as impurities of an oxide semiconductor are removed as much as possible. Alternatively, the combination of a turbo molecular pump and a cold trap is preferably used to prevent back-flow of a gas containing a carbon component, moisture, or the like from an exhaust system into the chamber. Alternatively, the combination of a turbo molecular pump and a cryopump may be used as an exhaust system.

Not only high vacuum evacuation of the chamber but also high purity of a sputtering gas is preferred to obtain a highly purified intrinsic oxide semiconductor. As an oxygen gas or an argon gas used for a sputtering gas, a gas which is highly purified to have a dew point of −40° C. or lower, preferably −80° C. or lower, more preferably −100° C. or lower is used, so that entry of moisture or the like into the oxide semiconductor film can be prevented as much as possible.

For the oxide semiconductor films 130A to 130C, any of the materials described in Embodiment 5 can be used. In the case where sputtering is used for deposition, any of the materials described in Embodiment 5 can be used as a target.

Note that as described in detail in Embodiment 5, a material that has a higher electron affinity than the oxide semiconductor films 130A and 130C is used for the oxide semiconductor film 130B.

The oxide semiconductor films are preferably formed by sputtering. As sputtering, RF sputtering, DC sputtering, AC sputtering, or the like can be used.

After the oxide semiconductor film 130C is formed, first heat treatment may be performed. The first heat treatment may be performed at a temperature higher than or equal to 250° C. and lower than or equal to 650° C., preferably higher than or equal to 300° C. and lower than or equal to 500° C., in an inert gas atmosphere, an atmosphere containing an oxidizing gas at 10 ppm or more, or a reduced pressure state. Alternatively, the first heat treatment may be performed in such a manner that heat treatment is performed in an inert gas atmosphere, and then another heat treatment is performed in an atmosphere containing an oxidizing gas at 10 ppm or more, in order to compensate released oxygen. The first heat treatment can increase the crystallinity of the oxide semiconductor films 130A to 130C and remove impurities such as water and hydrogen from the insulating layer 120 and the oxide semiconductor films 130A to 130C. Note that the first heat treatment may be performed after etching for forming the oxide semiconductor layers 130a to 130c described later.

Next, a conductive layer is formed over the oxide semiconductor film 130C. The conductive layer can be, for example, formed by the following method.

First, a first conductive film is formed over the oxide semiconductor film 130C. As the first conductive film, a single layer or a stacked layer can be formed using a material selected from Al, Cr, Cu, Ta, Ti, Mo, W, Ni, Mn, Nd, and Sc and an alloy of any of these metal materials.

Next, a resist film is formed over the first conductive film and the resist film is exposed to light by electron beam exposure, liquid immersion exposure, or EUV exposure and developed, so that a first resist mask is formed. An organic coating film is preferably formed as an adherence agent between the first conductive film and the resist film. Alternatively, the first resist mask may be formed by nanoimprint lithography.

Then, the first conductive film is selectively etched using the first resist mask and the first resist mask is subjected to ashing; thus, the conductive layer is formed.

Figure 40B:
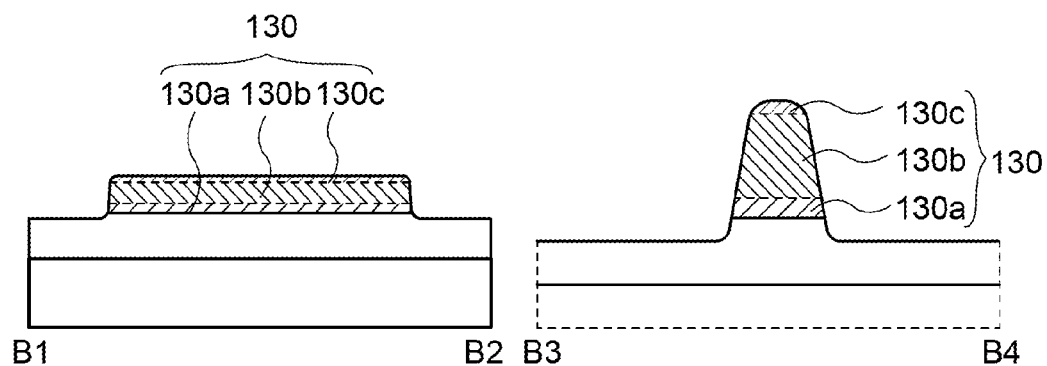
Figure 40C:
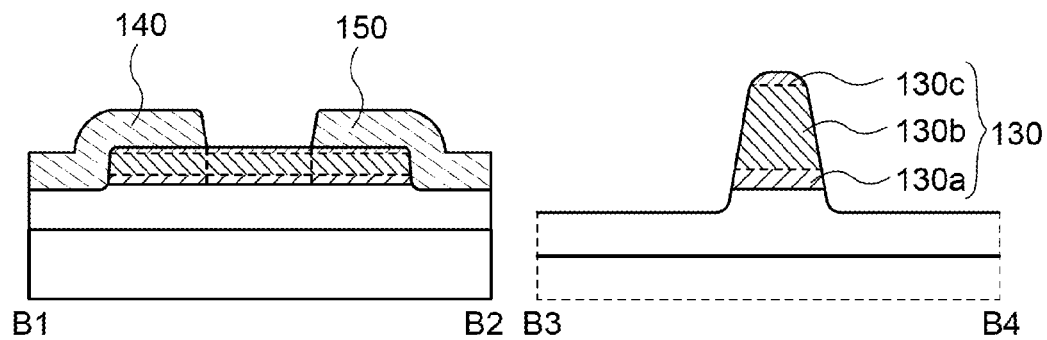

Next, the oxide semiconductor films 130A to 130C are selectively etched using the conductive layer as a hard mask and the conductive layer is removed; thus, the oxide semiconductor layer 130 including a stack of the oxide semiconductor layers 130a to 130c is formed (see FIG. 40B). It is also possible to form the oxide semiconductor layer 130 using the first resist mask, without forming the conductive layer. Here, oxygen ions may be implanted into the oxide semiconductor layer 130.

Next, a second conductive film is formed to cover the oxide semiconductor layer 130. The second conductive film can be formed using a material that can be used for the conductive layers 140 and 150 described in Embodiment 5. Sputtering, CVD, MBE, or the like can be used for the formation of the second conductive film.

Then, a second resist mask is formed over portions to be a source region and a drain region. Then, part of the second conductive film is etched, so that the conductive layers 140 and 150 are formed (see FIG. 40C).

Next, an insulating film 160A is formed over the oxide semiconductor layer 130 and the conductive layers 140 and 150. The insulating film 160A can be formed using a material that can be used for the insulating layer 160 described in Embodiment 5. Sputtering, CVD, MBE, or the like can be used for the formation of the insulating film 160A.

After that, second heat treatment may be performed. The second heat treatment can be performed in a condition similar to that of the first heat treatment. The second heat treatment can make oxygen diffuse from the insulating layer 120 into the entire oxide semiconductor layer 130. Note that it is possible to obtain this effect by third heat treatment, without performing the second heat treatment.

Then, a third conductive film 171A and a fourth conductive film 172A to be the conductive layer 170 are formed over the insulating film 160A. The third conductive film 171A and the fourth conductive film 172A can be formed using materials that can be used for the conductive layers 171 and 172 described in Embodiment 5. Sputtering, CVD, MBE, or the like can be used for the formation of the third conductive film 171A and the fourth conductive film 172A.

Figure 41A:
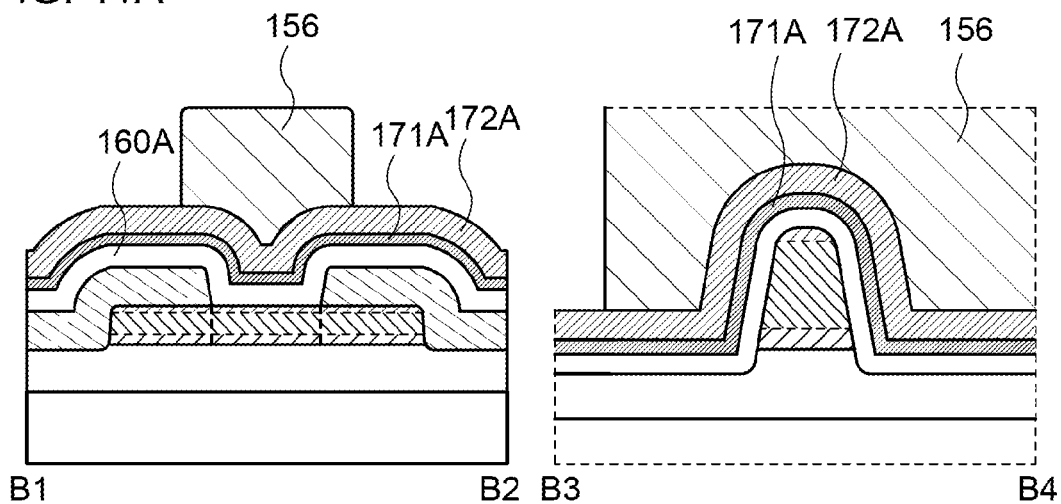
FIGS. 41A to 41C illustrate a method for manufacturing a transistor.
Figure 41B:
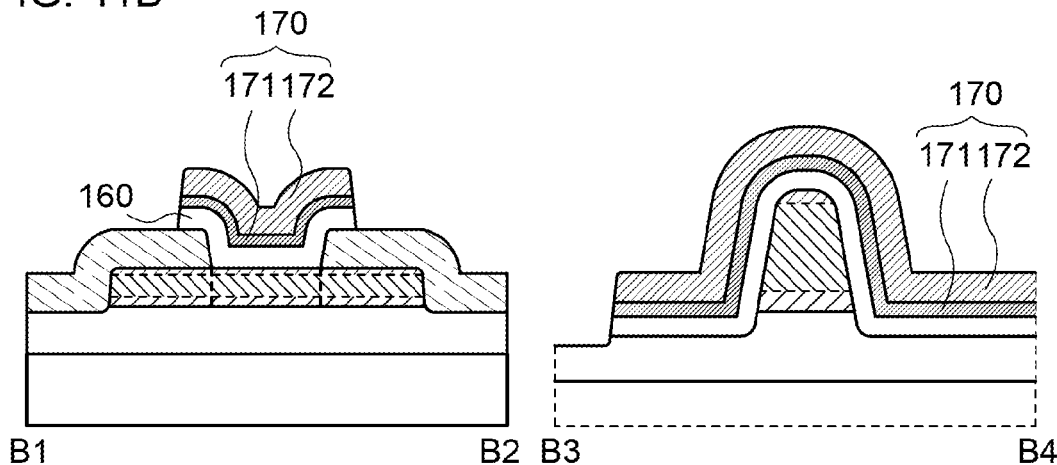

Next, a third resist mask 156 is formed over the fourth conductive film 172A (see FIG. 41A). The third conductive film 171A, the fourth conductive film 172A, and the insulating film 160A are selectively etched using the third resist mask 156, so that the conductive layer 170 including the conductive layers 171 and 172 and the insulating layer 160 are formed (see FIG. 41B). Note that if the insulating film 160A is not etched, the transistor 102 can be manufactured.

After that, the insulating layer 175 is formed over the oxide semiconductor layer 130, the conductive layers 140 and 150, the insulating layer 160, and the conductive layer 170. Embodiment 5 can be referred to for the material of the insulating layer 175. In the transistor 101, an aluminum oxide film is preferably used. The insulating layer 175 can be formed by sputtering, CVD, MBE, or the like.

Figure 41C:
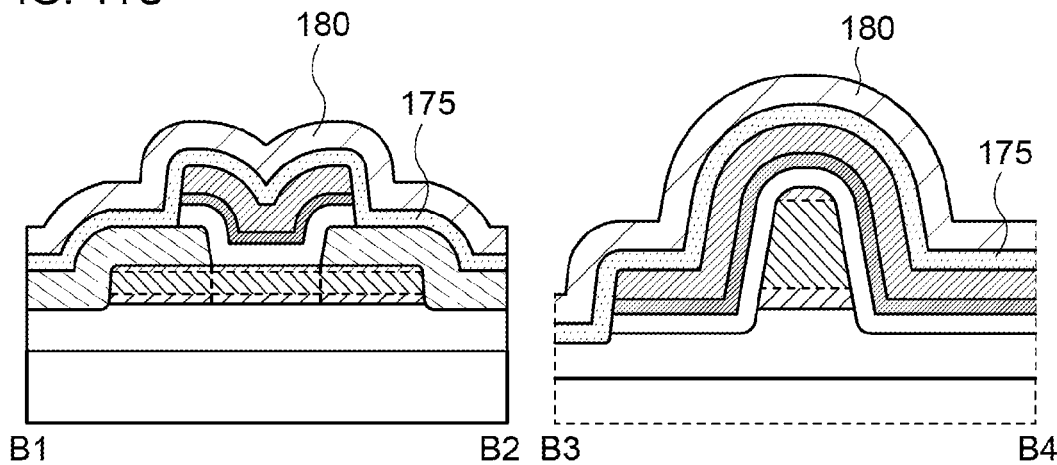

Next, the insulating layer 180 is formed over the insulating layer 175 (see FIG. 41C). Embodiment 5 can be referred to for the material of the insulating layer 180. The insulating layer 180 can be formed by sputtering, CVD, MBE, or the like.

Oxygen may be added to the insulating layer 175 and/or the insulating layer 180 by ion implantation, ion doping, plasma immersion ion implantation, plasma treatment, or the like. Adding oxygen enables the insulating layer 175 and/or the insulating layer 180 to supply oxygen much easily to the oxide semiconductor layer 130.

Next, the third heat treatment may be performed. The third heat treatment can be performed in a condition similar to that of the first heat treatment. By the third heat treatment, excess oxygen is easily released from the insulating layers 120, 175, and 180, so that oxygen vacancies in the oxide semiconductor layer 130 can be reduced.

Next, a method for manufacturing the transistor 107 is described. Note that detailed description of steps similar to those for manufacturing the transistor 102 described above is omitted.

Figure 42A:
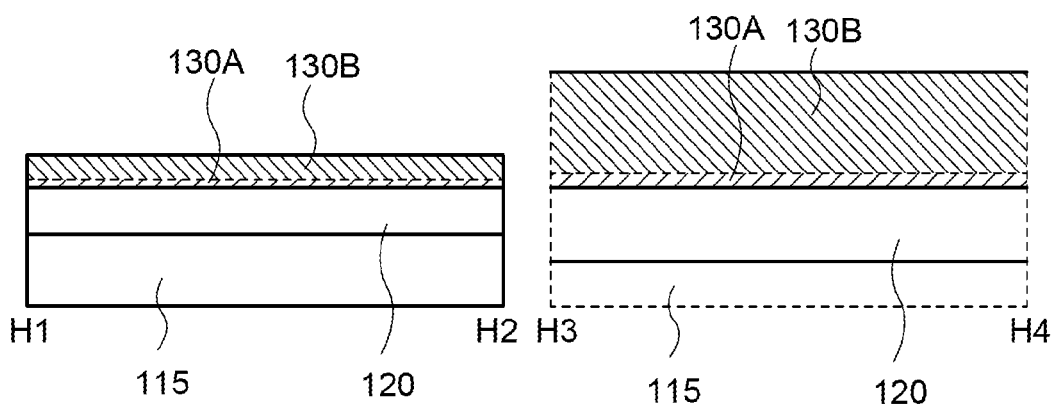
FIGS. 42A to 42C illustrate a method for manufacturing a transistor.

The insulating layer 120 is formed over the substrate 115, and the oxide semiconductor film 130A to be the oxide semiconductor layer 130a and the oxide semiconductor film 130B to be the oxide semiconductor layer 130b are formed over the insulating layer 120 by sputtering, CVD, MBE, or the like (see FIG. 42A).

Figure 42B:
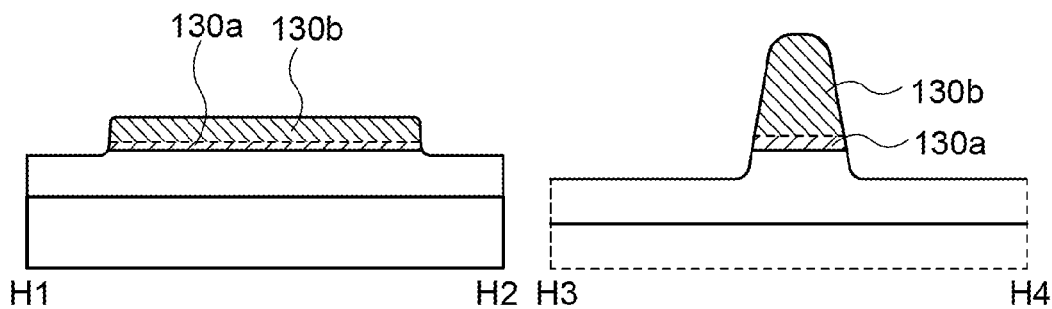

After that, a first conductive film is formed over the oxide semiconductor film 130B, and a conductive layer is formed using a first resist mask by a method similar to the above method. Then, the oxide semiconductor films 130A and 130B are selectively etched using the conductive layer as a hard mask and the conductive layer is removed; thus, a stack of the oxide semiconductor layers 130a and 130b is formed (see FIG. 42B). It is also possible to form the stack using the first resist mask, without forming the hard mask. Here, oxygen ions may be implanted into the oxide semiconductor layers 130a and 130b.

Figure 42C:
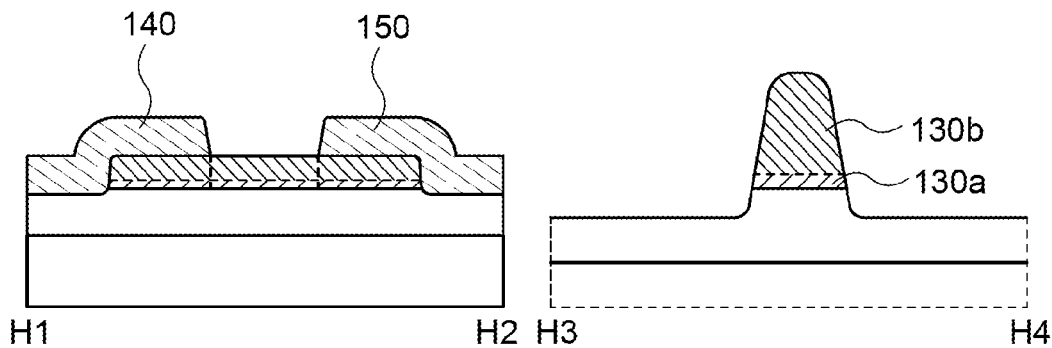

Next, a second conductive film is formed to cover the stack. Then, a second resist mask is formed over portions to be a source region and a drain region, and part of the second conductive film is etched using the second resist mask, so that the conductive layers 140 and 150 are formed (see FIG. 42C).

After that, the oxide semiconductor film 130C to be the oxide semiconductor layer 130c is formed over the stack of the oxide semiconductor layers 130a and 130b and the conductive layers 140 and 150. Furthermore, the insulating film 160A, the third conductive film 171A, and the fourth conductive film 172A are formed over the oxide semiconductor film 130C.

Figure 43A:
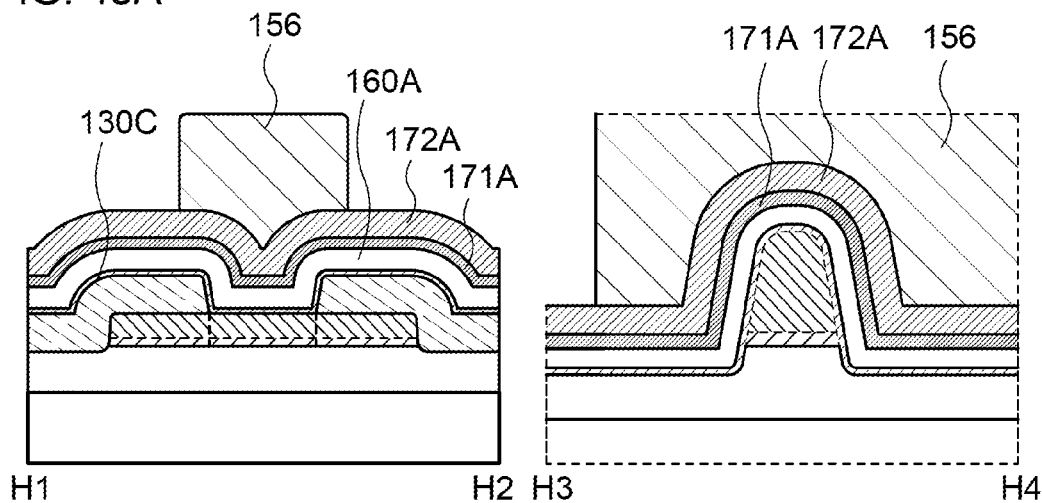
FIGS. 43A to 43C illustrate a method for manufacturing a transistor.
Figure 43B:
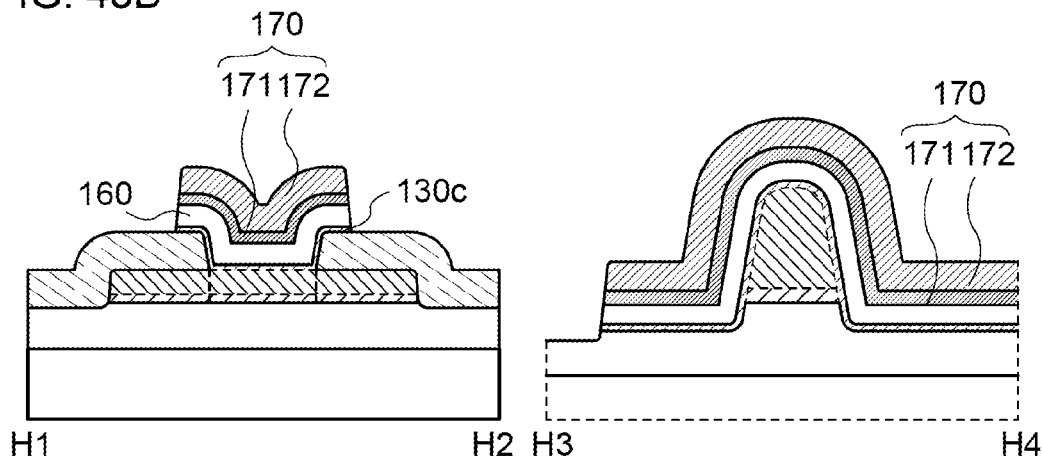

Then, the third resist mask 156 is formed over the fourth conductive film 172A (see FIG. 43A). The third conductive film 171A, the fourth conductive film 172A, the insulating film 160A, and the oxide semiconductor film 130C are selectively etched using the resist mask, so that the conductive layer 170 including the conductive layers 171 and 172, the insulating layer 160, and the oxide semiconductor layer 130c are formed (see FIG. 43B). Note that when the insulating film 160A and the oxide semiconductor film 130C are etched using a fourth resist mask, the transistor 108 can be manufactured.

Figure 43C:
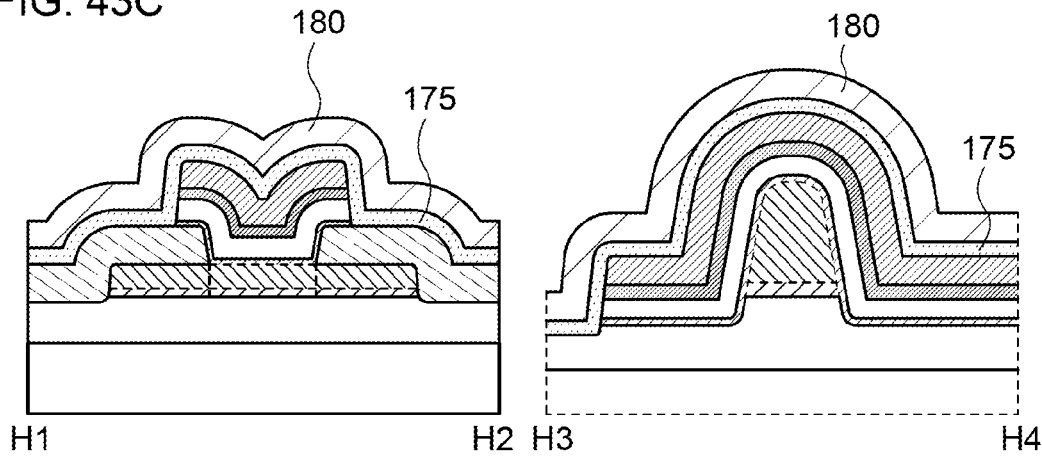

Next, the insulating layers 175 and 180 are formed over the insulating layer 120, the oxide semiconductor layer 130 (the oxide semiconductor layers 130a to 130c), the conductive layers 140 and 150, the insulating layer 160, and the conductive layer 170 (see FIG. 43C).

Through the above steps, the transistor 107 can be manufactured.

Next, a method for manufacturing the transistor 111 is described. Note that detailed description of steps similar to those for manufacturing the transistor 102 described above is omitted.

Figure 44A:
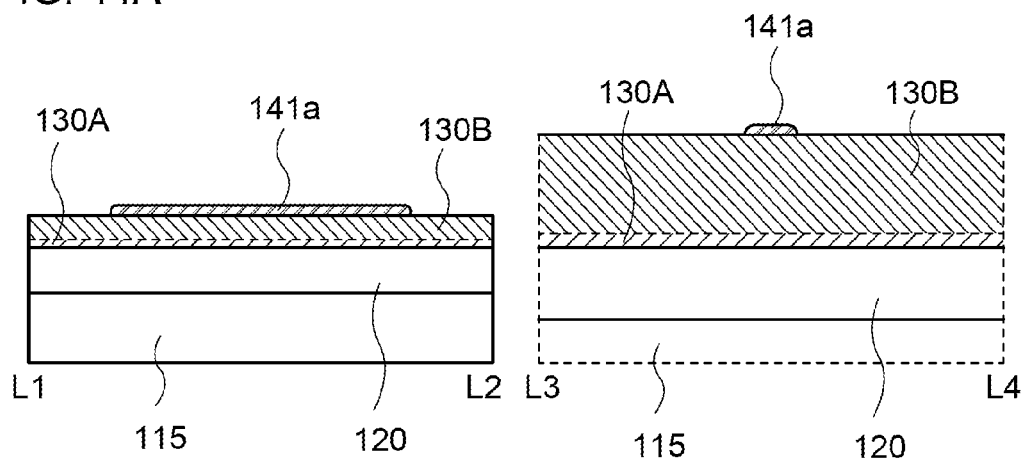
FIGS. 44A to 44C illustrate a method for manufacturing a transistor.

The insulating layer 120 is formed over the substrate 115, and the oxide semiconductor film 130A to be the oxide semiconductor layer 130a and the oxide semiconductor film 130B to be the oxide semiconductor layer 130b are formed over the insulating layer 120 by sputtering, CVD, MBE, or the like. Then, a first conductive film is formed over the oxide semiconductor film 130B, and a conductive layer 141a is formed using a first resist mask (see FIG. 44A).

Figure 44B:
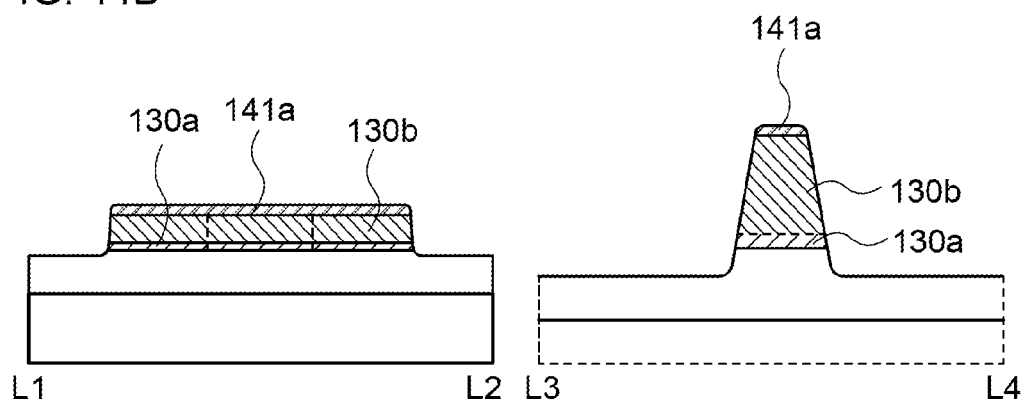

Then, the oxide semiconductor films 130A and 130B are selectively etched using the conductive layer 141a as a hard mask, so that a stack of the oxide semiconductor layers 130a and 130b and the conductive layer 141a is formed (see FIG. 44B). Here, oxygen ions may be implanted into the oxide semiconductor layers 130a and 130b.

Figure 44C:
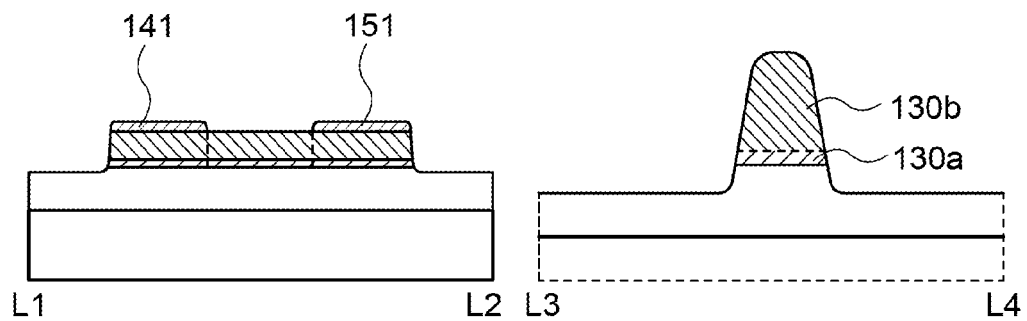

Then, a second resist mask is formed over portions to be a source region and a drain region, and part of the conductive layer 141a is etched using the second resist mask, so that the conductive layers 141 and 151 are formed (see FIG. 44C).

After that, the oxide semiconductor film 130C to be the oxide semiconductor layer 130c is formed over the stack of the oxide semiconductor layers 130a and 130b and the conductive layers 141 and 151. Furthermore, the insulating film 160A, the third conductive film 171A, and the fourth conductive film 172A are formed over the oxide semiconductor film 130C.

Figure 45A:
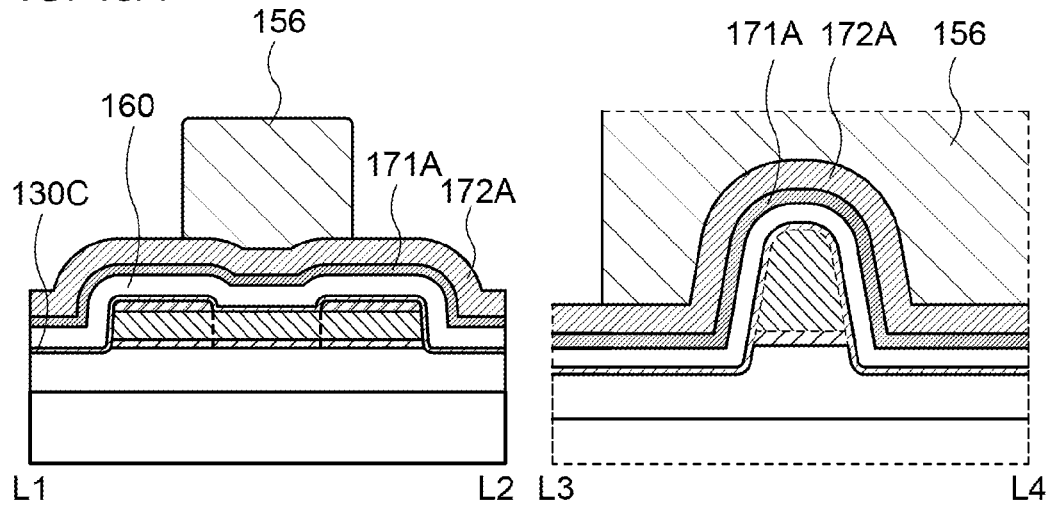
FIGS. 45A to 45C illustrate a method for manufacturing a transistor.
Figure 45B:
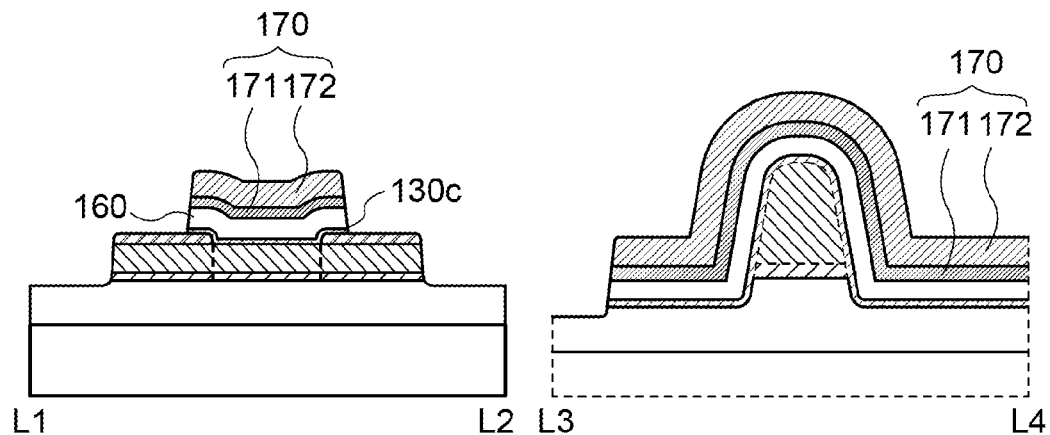

Then, the third resist mask 156 is formed over the fourth conductive film 172A (see FIG. 45A). The third conductive film 171A, the fourth conductive film 172A, the insulating film 160A, and the oxide semiconductor film 130C are selectively etched using the third resist mask 156, so that the conductive layer 170 including the conductive layers 171 and 172, the insulating layer 160, and the oxide semiconductor layer 130c are formed (see FIG. 45B).

Next, the insulating layers 175 and 180 are formed over the insulating layer 120, the oxide semiconductor layer 130 (the oxide semiconductor layers 130a to 130c), the conductive layers 140 and 150, the insulating layer 160, and the conductive layer 170.

Figure 45C:
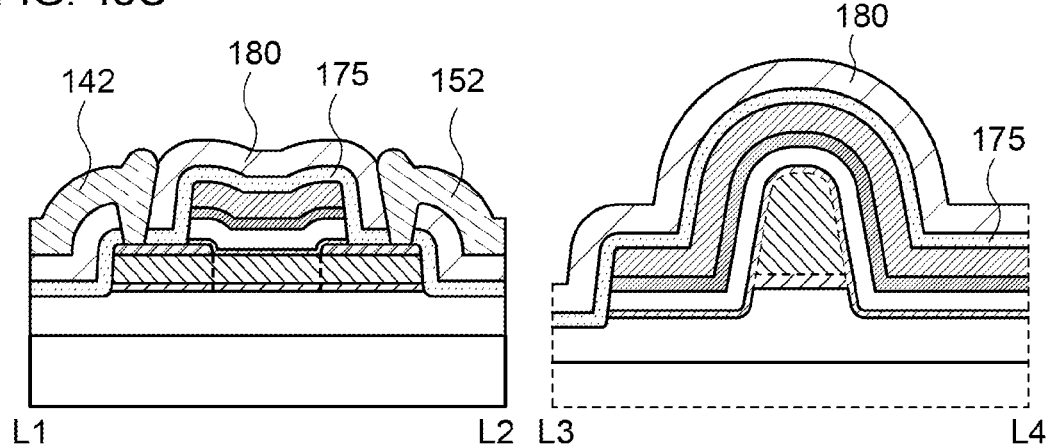

Next, openings reaching the conductive layers 141 and 151 are provided in the insulating layers 175 and 180, and a fifth conductive film is formed to cover the openings. Then, a fourth resist mask is provided over the fifth conductive film and the fifth conductive film is selectively etched using the resist mask, so that the conductive layers 142 and 152 are formed (see FIG. 45C).

Through the above steps, the transistor 111 can be manufactured.

Although the variety of films such as the metal films, the semiconductor films, and the inorganic insulating films that are described in this embodiment typically can be formed by sputtering or plasma-enhanced CVD, such films may be formed by another method such as thermal CVD. Examples of thermal CVD include metal organic chemical vapor deposition (MOCVD) and atomic layer deposition (ALD).

Since plasma is not used for deposition, thermal CVD has an advantage that no defect due to plasma damage is generated.

Deposition by thermal CVD may be performed in such a manner that a source gas and an oxidizer are supplied to the chamber at the same time, the pressure in the chamber is set to an atmospheric pressure or a reduced pressure, and reaction is caused in the vicinity of the substrate or over the substrate.

Deposition by ALD is performed in such a manner that the pressure in a chamber is set to an atmospheric pressure or a reduced pressure, source gases for reaction are introduced into the chamber and reacted, and then the sequence of gas introduction is repeated. An inert gas (e.g., argon or nitrogen) may be introduced as a carrier gas with the source gases. For example, two or more kinds of source gases may be sequentially supplied to the chamber. In that case, after reaction of a first source gas, an inert gas is introduced, and then a second source gas is introduced so that the source gases are not mixed. Alternatively, the first source gas may be exhausted by vacuum evacuation instead of introduction of the inert gas, and then the second source gas may be introduced. The first source gas is adsorbed on the surface of the substrate and reacted to form a first layer, and then, the second source gas introduced is absorbed and reacted. As a result, a second layer is stacked over the first layer, so that a thin film is formed. The sequence of gas introduction is controlled and repeated more than once until desired thickness is obtained, so that a thin film with excellent step coverage can be formed. The thickness of the thin film can be adjusted by the number of repetition times of the sequence of gas introduction; therefore, ALD makes it possible to accurately adjust thickness and thus is suitable for manufacturing a minute FET.

The variety of films such as the metal film, the semiconductor film, and the inorganic insulating film that have been disclosed in the embodiments can be formed by thermal CVD such as MOCVD or ALD. For example, in the case where an In—Ga—Zn—O film is formed, trimethylindium ($In(CH_3)_3$), trimethylgallium ($Ga(CH_3)_3$), and dimethylzinc ($Zn(CH_3)_2$) can be used. Without limitation to the above combination, triethylgallium ($Ga(C_2H_5)_3$) can be used instead of trimethylgallium and diethylzinc ($Zn(C_2H_5)_2$) can be used instead of dimethylzinc.

For example, in the case where a hafnium oxide film is formed by a deposition apparatus using ALD, two kinds of gases, i.e., ozone (O3) as an oxidizer and a source material gas which is obtained by vaporizing liquid containing a solvent and a hafnium precursor (hafnium alkoxide and a hafnium amide such as tetrakis(dimethylamide)hafnium (TDMAH, $Hf[N(CH_3)_2]_4$) and tetrakis(ethylmethylamide) hafnium) are used.

For example, in the case where an aluminum oxide film is formed by a deposition apparatus using ALD, two kinds of gases, i.e., $H_2O$ as an oxidizer and a source gas which is obtained by vaporizing liquid containing a solvent and an aluminum precursor (e.g., trimethylaluminum (TMA, $Al(CH_3)_3$)) are used. Examples of another material include tris(dimethylamide)aluminum, triisobutylaluminum, and aluminum tris(2,2,6,6-tetramethyl-3,5-heptanedionate).

For example, in the case where a silicon oxide film is formed by a deposition apparatus using ALD, hexachlorodisilane is adsorbed on a surface where a film is to be formed, and radicals of an oxidizing gas (e.g., $O_2$ or dinitrogen monoxide) are supplied to react with an adsorbate.

For example, in the case where a tungsten film is formed by a deposition apparatus using ALD, a $WF_6$ gas and a $B_2H_6$ gas are sequentially introduced to form an initial tungsten film, and then a $WF_6$ gas and an $H_2$ gas are sequentially introduced to form a tungsten film. Note that an $SiH_4$ gas may be used instead of a $B_2H_6$ gas.

For example, in the case where an oxide semiconductor film, e.g., an In—Ga—Zn—O film is formed by a deposition apparatus using ALD, an $In(CH_3)_3$ gas and an $O_3$ gas are sequentially introduced to form an In—O layer, a $Ga(CH_3)_3$ gas and an $O_3$ gas are sequentially introduced to form a Ga—O layer, and then a $Zn(CH_3)_2$ gas and an $O_3$ gas are sequentially introduced to form a Zn—O layer. Note that the order of these layers is not limited to this example. A mixed compound layer such as an In—Ga—O layer, an In—Zn—O layer, or a Ga—Zn—O layer may be formed by using these gases. Although an $H_2O$ gas which is obtained by bubbling with an inert gas such as Ar may be used instead of an $O_3$ gas, it is preferable to use an $O_3$ gas, which does not contain H.

The structure described above in this embodiment can be combined with any of the structures described in the other embodiments as appropriate.

Embodiment 7

The structure of an oxide semiconductor film that can be used for one embodiment of the present invention is described below.

In this specification, the term "parallel" indicates that the angle formed between two straight lines is greater than or equal to −10° and less than or equal to 10°, and accordingly includes the case where the angle is greater than or equal to −5° and less than or equal to 5°. The term "perpendicular" indicates that an angle formed between two straight lines is greater than or equal to 80° and less than or equal to 100°, and accordingly includes the case where the angle is greater than or equal to 85° and less than or equal to 95°.

In this specification, the trigonal and rhombohedral crystal systems are included in the hexagonal crystal system.

An oxide semiconductor film is roughly classified into a non-single-crystal oxide semiconductor film and a single-crystal oxide semiconductor film. The non-single-crystal oxide semiconductor film means any of a c-axis aligned crystalline oxide semiconductor (CAAC-OS) film, a polycrystalline oxide semiconductor film, a microcrystalline oxide semiconductor film, an amorphous oxide semiconductor film, and the like.

First, a CAAC-OS film is described.

The CAAC-OS film is one of oxide semiconductor films having a plurality of c-axis aligned crystal parts.

With a transmission electron microscope (TEM), a combined analysis image (also referred to as a high-resolution TEM image) of a bright-field image and a diffraction pattern of the CAAC-OS film is observed. Consequently, a plurality of crystal parts are observed clearly. However, in the high-resolution TEM image, a boundary between crystal parts, i.e., a grain boundary is not observed clearly. Thus, in the CAAC-OS film, a reduction in electron mobility due to the grain boundary is less likely to occur.

According to the high-resolution cross-sectional TEM image of the CAAC-OS film observed in a direction substantially parallel to a sample surface (cross-sectional TEM image), metal atoms are arranged in a layered manner in the crystal parts. Each metal atom layer has a morphology that reflects a surface over which the CAAC-OS film is formed (also referred to as a formation surface) or a top surface of the CAAC-OS film, and is provided parallel to the formation surface or the top surface of the CAAC-OS film.

On the other hand, according to the high-resolution planar TEM image of the CAAC-OS film observed in a direction substantially perpendicular to the sample surface, metal atoms are arranged in a triangular or hexagonal configuration in the crystal parts. However, there is no regularity of arrangement of metal atoms between different crystal parts.

The CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle ($2\theta$) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

Note that when the CAAC-OS film with an $InGaZnO_4$ crystal is analyzed by an out-of-plane method, a peak of $2\theta$ may also be observed at around 36°, in addition to the peak of $2\theta$ at around 31°. The peak of $2\theta$ at around 36° indicates that a crystal having no c-axis alignment is included in part of the CAAC-OS film. It is preferable that in the CAAC-OS film, a peak of $2\theta$ appear at around 31° and a peak of $2\theta$ not appear at around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic order of the oxide semiconductor film by depriving the oxide semiconductor film of oxygen and causes a decrease in crystallinity. Furthermore, a heavy metal such as iron or nickel, argon, carbon dioxide, or the like has a large atomic radius (molecular radius), and thus disturbs the atomic order of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having low density of defect states. In some cases, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as "highly purified intrinsic" or "substantially highly purified intrinsic." A highly purified intrinsic or substantially highly purified intrinsic oxide semiconductor film has few carrier generation sources, and thus can have low carrier density. Thus, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has few variations in electrical characteristics and high reliability. Charge trapped by the carrier traps in the oxide semiconductor film takes a long time to be released and may behave like fixed charge. Thus, the transistor that includes the oxide semiconductor film having high impurity concentration and high density of defect states has unstable electrical characteristics in some cases.

In a transistor including the CAAC-OS film, changes in electrical characteristics of the transistor due to irradiation with visible light or ultraviolet light are small.

Next, a microcrystalline oxide semiconductor film is described.

A microcrystalline oxide semiconductor film has a region where a crystal part is observed in a high-resolution TEM image and a region where a crystal part is not clearly observed in a high-resolution TEM image. In most cases, a crystal part in the microcrystalline oxide semiconductor film is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as a nanocrystalline oxide semiconductor (nc-OS) film. In a high-resolution TEM image, a crystal grain boundary cannot be found clearly in the nc-OS film in some cases.

In the nc-OS film, a microscopic region (e.g., a region with a size greater than or equal to 1 nm and less than or equal to 10 nm, in particular, a region with a size greater than or equal to 1 nm and less than or equal to 3 nm) has periodic atomic order. There is no regularity of crystal orientation between different crystal parts in the nc-OS film. Thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than that of a crystal part, a peak that shows a crystal plane does not appear. Furthermore, a halo pattern is shown in a selected-area electron diffraction pattern of the nc-OS film obtained by using an electron beam having a probe diameter larger than the diameter of a crystal part (e.g., larger than or equal to 50 nm). Meanwhile, spots are shown in a nanobeam electron diffraction pattern of the nc-OS film obtained by using an electron beam having a probe diameter close to or smaller than the diameter of a crystal part. Furthermore, in a nanobeam electron diffraction pattern of the nc-OS film, circumferentially distributed spots are observed in some cases. Also in a nanobeam electron diffraction pattern of the nc-OS film, a plurality of spots are shown in a ring-like region in some cases.

The nc-OS film is an oxide semiconductor film that has higher regularity than an amorphous oxide semiconductor film. Thus, the nc-OS film has a lower density of defect states than the amorphous oxide semiconductor film. Note that there is no regularity of crystal orientation between different crystal parts in the nc-OS film; thus, the nc-OS film has a higher density of defect states than the CAAC-OS film.

Next, an amorphous oxide semiconductor film is described.

The amorphous oxide semiconductor film has disordered atomic arrangement and no crystal part. For example, the amorphous oxide semiconductor film does not have a specific state as in quartz.

In a high-resolution TEM image of the amorphous oxide semiconductor film, crystal parts cannot be found.

When the amorphous oxide semiconductor film is subjected to structural analysis by an out-of-plane method with an XRD apparatus, a peak which shows a crystal plane does not appear. A halo pattern is shown in an electron diffraction pattern of the amorphous oxide semiconductor film. Furthermore, a halo pattern is shown but a spot is not shown in a nanobeam electron diffraction pattern of the amorphous oxide semiconductor film.

Note that an oxide semiconductor film may have a structure having physical properties between the nc-OS film and the amorphous oxide semiconductor film. The oxide semiconductor film having such a structure is specifically referred to as an amorphous-like oxide semiconductor (a-like OS) film.

In a high-resolution TEM image of the a-like OS film, a void may be seen. Furthermore, in the high-resolution TEM image, there are a region where a crystal part is clearly observed and a region where a crystal part is not observed. In the a-like OS film, crystallization by a slight amount of electron beam used for TEM observation occurs and growth of the crystal part is found sometimes. In contrast, crystallization by a slight amount of electron beam used for TEM observation is less observed in the nc-OS film having good quality.

Note that the crystal part size in the a-like OS film and the nc-OS film can be measured using high-resolution TEM images. For example, an $InGaZnO_4$ crystal has a layered structure in which two Ga—Zn—O layers are included between In—O layers. A unit cell of the $InGaZnO_4$ crystal has a structure in which nine layers of three In—O layers and six Ga—Zn—O layers are layered in the c-axis direction. Accordingly, the spacing between these adjacent layers is equivalent to the lattice spacing on the (009) plane (also referred to as a d value). The value is calculated to be 0.29 nm from crystal structure analysis. Thus, each of the lattice fringes in which the spacing therebetween is from 0.28 nm to 0.30 nm corresponds to the a-b plane of the $InGaZnO_4$ crystal, focusing on the lattice fringes in the high-resolution TEM image.

Note that an oxide semiconductor film may be a stacked film including two or more films of an amorphous oxide semiconductor film, an a-like OS film, a microcrystalline oxide semiconductor film, and a CAAC-OS film, for example.

The structure described above in this embodiment can be combined with any of the structures described in the other embodiments as appropriate.

Embodiment 8

An imaging device in one embodiment of the present invention and a semiconductor device including the imaging device can be used for display devices, personal computers, or image reproducing devices provided with recording media (typically, devices that reproduce the content of recording media such as digital versatile discs (DVD) and have displays for displaying the reproduced images). Furthermore, as electronic devices that can include the imaging device in one embodiment of the present invention and the semiconductor device including the imaging device, cellular phones, game machines (including portable game machines), portable information terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and the like can be given. FIGS. 46A to 46F illustrate specific examples of these electronic devices.

Figure 46A:
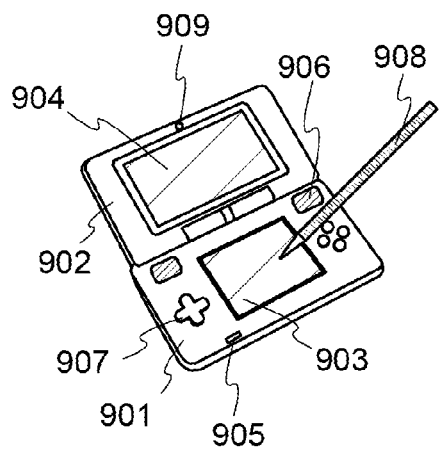
FIGS. 46A to 46F illustrate electronic devices.

FIG. 46A illustrates a portable game machine, which includes housings 901 and 902, display portions 903 and 904, a microphone 905, speakers 906, an operation key 907, a stylus 908, a camera 909, and the like. Although the portable game machine in FIG. 46A has the two display portions 903 and 904, the number of display portions included in the portable game machine is not limited to this. The imaging device in one embodiment of the present invention can be used for the camera 909.

Figure 46B:
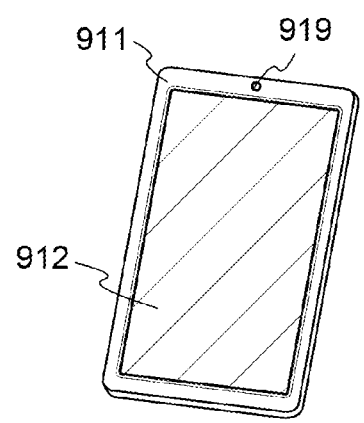

FIG. 46B illustrates a portable data terminal, which includes a housing 911, a display portion 912, a camera 919, and the like. The touch panel function of the display portion 912 enables input and output of information. The imaging device in one embodiment of the present invention can be used for the camera 919.

Figure 46C:
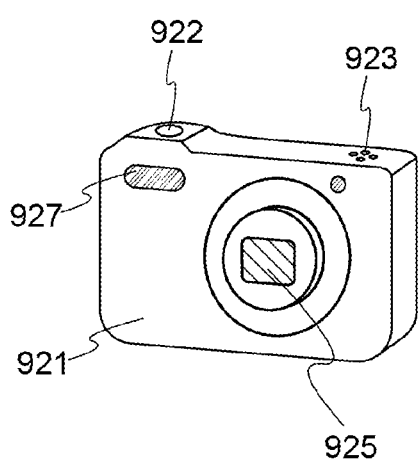

FIG. 46C illustrates a digital camera, which includes a housing 921, a shutter button 922, a microphone 923, a light-emitting portion 927, a lens 925, and the like. The imaging device in one embodiment of the present invention can be provided in a focus position of the lens 925.

Figure 46D:
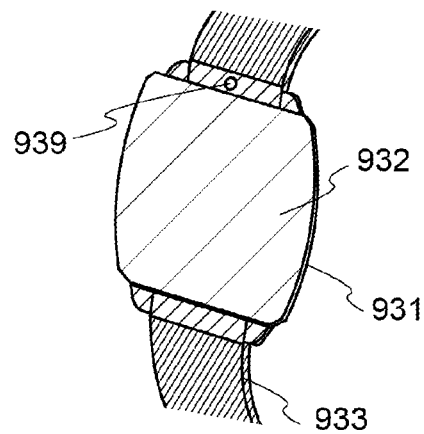

FIG. 46D illustrates a wrist-watch-type information terminal, which includes a housing 931, a display portion 932, a wristband 933, a camera 939, and the like. The display portion 932 may be a touch panel. The imaging device in one embodiment of the present invention can be used for the camera 939.

Figure 46E:
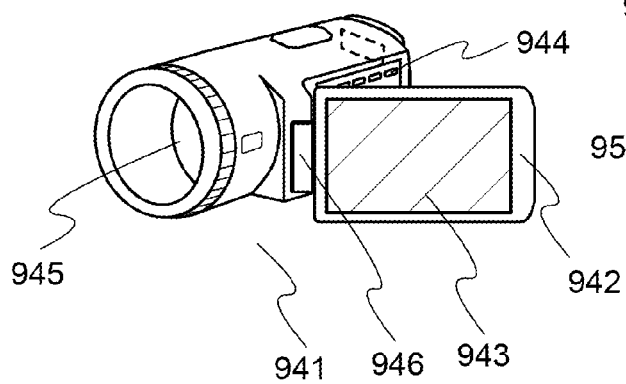

FIG. 46E illustrates a video camera, which includes a first housing 941, a second housing 942, a display portion 943, operation keys 944, a lens 945, a joint 946, and the like. The operation keys 944 and the lens 945 are provided for the first housing 941, and the display portion 943 is provided for the second housing 942. The first housing 941 and the second housing 942 are connected to each other with the joint 946, and an angle between the first housing 941 and the second housing 942 can be changed with the joint 946. An image displayed on the display portion 943 may be switched in accordance with the angle between the first housing 941 and the second housing 942 at the joint 946. The imaging device in one embodiment of the present invention can be provided in a focus position of the lens 945.

Figure 46F:
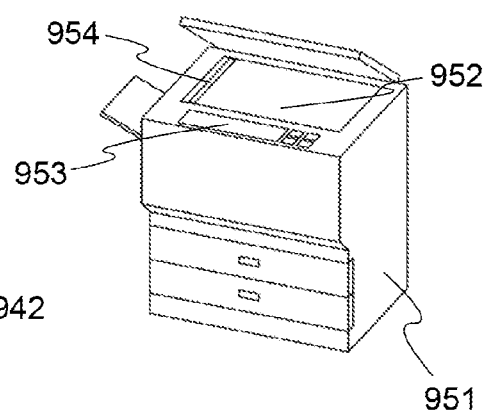

FIG. 46F illustrates a copier, which includes a housing 951 provided with a reading portion 952, an operation portion 953, a sensor 954, and the like. The imaging device in one embodiment of the present invention in which pixels are arranged in a line can be used for the sensor 954, and data in a plane can be read by scanning in a direction perpendicular to the pixel arrangement. The same structure can also be applied to a facsimile or a scanner.

This embodiment can be combined with any of the other embodiments in this specification as appropriate.

This application is based on Japanese Patent Application serial No. 2014-227703 filed with Japan Patent Office on Nov. 10, 2014, the entire contents of which are hereby incorporated by reference.

What is claimed is:

1. An imaging device comprising:
   a first circuit; and
   a second circuit,
   wherein the first circuit includes a photoelectric conversion element, a first transistor, a second transistor, a third transistor, a fourth transistor, a fifth transistor, a sixth transistor, a first capacitor, a second capacitor, and a third capacitor,
   wherein the second circuit includes a seventh transistor,
   wherein one terminal of the photoelectric conversion element is electrically connected to one of a source and a drain of the first transistor,
   wherein the other of the source and the drain of the first transistor is electrically connected to one of a source and a drain of the second transistor, wherein the other of the source and the drain of the first transistor is electrically connected to one terminal of the first capacitor, wherein one of a source and a drain of the third transistor is electrically connected to the other terminal of the first capacitor;

wherein the other terminal of the first capacitor is electrically connected to one terminal of the second capacitor, wherein one of a source and a drain of the fourth transistor is electrically connected to the other terminal of the second capacitor, wherein the other of the source and the drain of the fourth transistor is electrically connected to one of a source and a drain of the fifth transistor, wherein one terminal of the third capacitor is electrically connected to the other terminal of the second capacitor, wherein the other terminal of the third capacitor is electrically connected to the other of the source and the drain of the fifth transistor, wherein a gate of the fifth transistor is electrically connected to the one terminal of the third capacitor, wherein one of a source and a drain of the sixth transistor is electrically connected to the other of the source and the drain of the fifth transistor, wherein the other of the source and the drain of the sixth transistor is electrically connected to one of a source and a drain of the seventh transistor, and wherein the photoelectric conversion element contains selenium in a photoelectric conversion layer.

2. The imaging device according to claim 1, further comprising a third circuit, wherein the third circuit includes an eighth transistor and a resistor, wherein one of a source and a drain of the eighth transistor is electrically connected to the other of the source and the drain of the sixth transistor, and wherein the other of the source and the drain of the eighth transistor is electrically connected to one terminal of the resistor.

3. The imaging device according to claim 1, wherein the second circuit includes a ninth transistor, wherein one of a source and a drain of the ninth transistor is electrically connected to the other of the source and the drain of the seventh transistor, wherein a gate of the ninth transistor is electrically connected to a gate of the seventh transistor, and wherein a gate of the ninth transistor is electrically connected to the other of the source and the drain of the ninth transistor.

4. The imaging device according to claim 1, wherein the other of the source and the drain of the third transistor is electrically connected to the other terminal of the photoelectric conversion element.

5. The imaging device according to claim 1, wherein the pixel circuit includes a fourth capacitor, and wherein one terminal of the fourth capacitor is electrically connected to the one of the source and the drain of the third transistor.

6. The imaging device according to claim 5, wherein the other terminal of the fourth capacitor is electrically connected to the other of the source and the drain of the fourth transistor.

7. The imaging device according to claim 1, wherein one or all of the first to ninth transistors include oxide semiconductors in active layers, and wherein the oxide semiconductor contains In, Zn, and M (M is Al, Ti, Ga, Sn, Y, Zr, La, Ce, Nd, or Hf).

8. An electronic device comprising a display device, an operation key, a shutter button, and the imaging device according to claim 1.

* * * * *